US010132133B2

(12) United States Patent
Springett et al.

(10) Patent No.: US 10,132,133 B2
(45) Date of Patent: Nov. 20, 2018

(54) METHOD OF CLOSING A BLOWOUT PREVENTER SEAL BASED ON SEAL EROSION

(71) Applicant: National Oilwell Varco, L.P., Houston, TX (US)

(72) Inventors: Frank Benjamin Springett, Spring, TX (US); Geoffrey Pickett, Sugar Land, TX (US); Matthew Albert Franchek, Houston, TX (US)

(73) Assignee: NATIONAL OILWELL VARCO, L.P., Houston, TX (US)

( * ) Notice: Subject to any disclaimer, the term of this patent is extended or adjusted under 35 U.S.C. 154(b) by 295 days.

(21) Appl. No.: 14/960,263

(22) Filed: Dec. 4, 2015

(65) Prior Publication Data
US 2016/0160598 A1   Jun. 9, 2016

Related U.S. Application Data

(60) Provisional application No. 62/088,520, filed on Dec. 5, 2014.

(51) Int. Cl.
*E21B 33/06* (2006.01)
*E21B 47/00* (2012.01)
(Continued)

(52) U.S. Cl.
CPC .......... *E21B 33/061* (2013.01); *E21B 33/062* (2013.01); *E21B 33/063* (2013.01);
(Continued)

(58) Field of Classification Search
USPC ..................... 166/84.3, 84.4, 85.4
See application file for complete search history.

(56) References Cited

U.S. PATENT DOCUMENTS 7,367,396 B2   5/2008   Springett et al.
7,814,979 B2  10/2010   Springett et al.
(Continued)

FOREIGN PATENT DOCUMENTS

CN   201562391   8/2010
WO   2008014517   1/2008
WO   2008039801   4/2008

OTHER PUBLICATIONS

J. C. Arnold and I. M. Hutchings, "Erosive Wear of Rubber by Solid Particles at Normal Incidence", Scopus, vol. 161, Iss. 1-2, Apr. 1, 1993, pp. 213-221.
(Continued)

*Primary Examiner* — Sean D Andrish
(74) *Attorney, Agent, or Firm* — Conley Rose, P.C.

(57) ABSTRACT

A method of sealing a wellbore with a blowout preventer (BOP) is disclosed. The method involves providing the BOP with a BOP seal. The BOP has BOP parameters and a fluid flowing through the BOP has fluid parameters. The method also involves simulating erosion of a BOP seal using a BOP model based on the BOP parameters and the fluid parameters, measuring erosion of the blowout preventer seal by performing a lab test of the blowout preventer seal in a tester according to the blowout preventer model, validating the simulating by comparing the simulated erosion with the measured erosion, determining an erosion rate of the blowout preventer seal based on the validated simulating, defining closing parameters based on the determined erosion rate, and operating the blowout preventer rams according to the defined closing parameters.

14 Claims, 51 Drawing Sheets

(51) Int. Cl.
*G06F 17/18* (2006.01)
*G06F 17/50* (2006.01)
*E21B 41/00* (2006.01)

(52) U.S. Cl.
CPC .............. *E21B 41/00* (2013.01); *E21B 47/00* (2013.01); *G06F 17/18* (2013.01); *G06F 17/5009* (2013.01)

(56) References Cited

U.S. PATENT DOCUMENTS

| | | |
|---|---|---|
| 8,424,607 B2 | 4/2013 | Springett et al. |
| 2008/0027693 A1* | 1/2008 | Khandoker ......... B29C 35/0222 703/7 |
| 2010/0263872 A1 | 10/2010 | Bull et al. |
| 2011/0000670 A1 | 1/2011 | Springett et al. |
| 2011/0226475 A1 | 9/2011 | Springett et al. |
| 2013/0221250 A1* | 8/2013 | Judge .................... E21B 33/062 251/1.3 |
| 2015/0330173 A1* | 11/2015 | Trivedi ............... E21B 47/1025 73/152.29 |

OTHER PUBLICATIONS

G. Schnerr & J. Sauer,"Physical and Numerical Modeling of Unsteady Cavitation Dynamics", 4th Int'l Conf on Multiphase Flow, New Orleans, 2001.

International Search Report and Written Opinion for PCT Application No. PCT/US2015/064129 dated Mar. 23, 2016, 11 pages.

\* cited by examiner

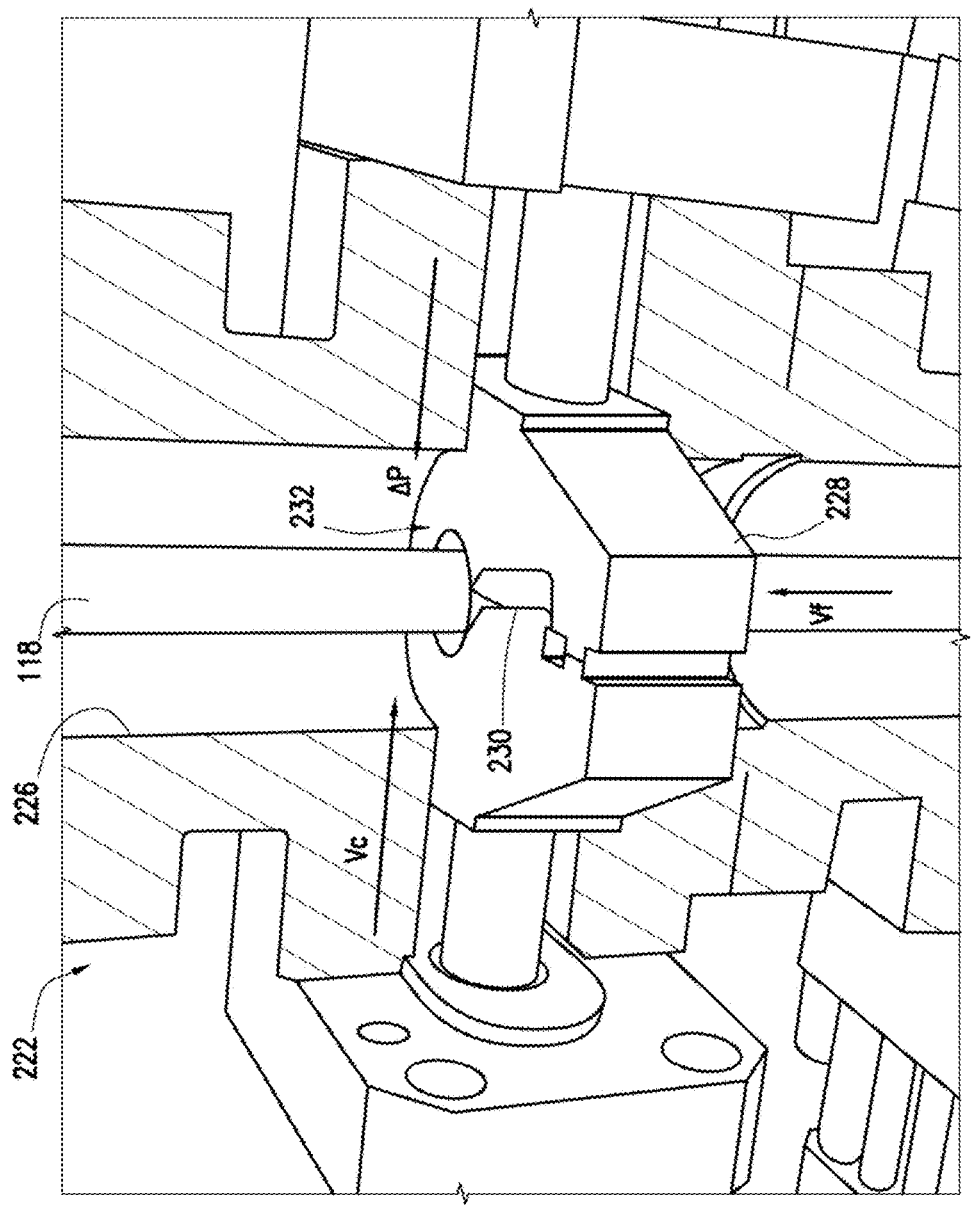

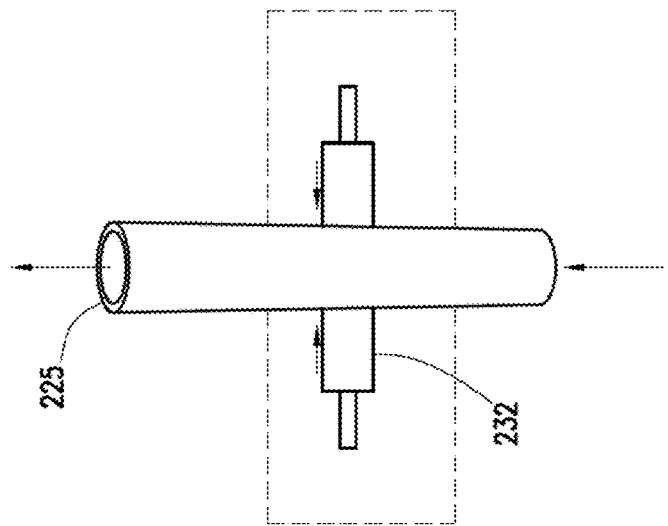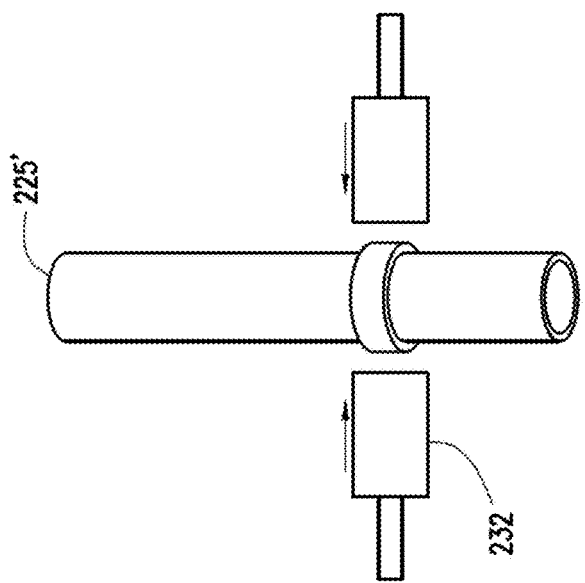

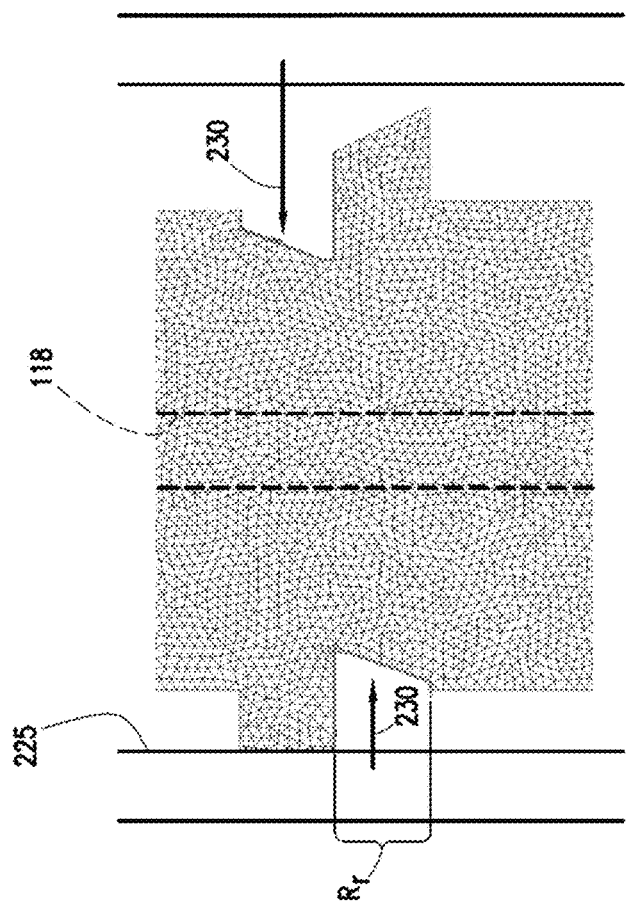
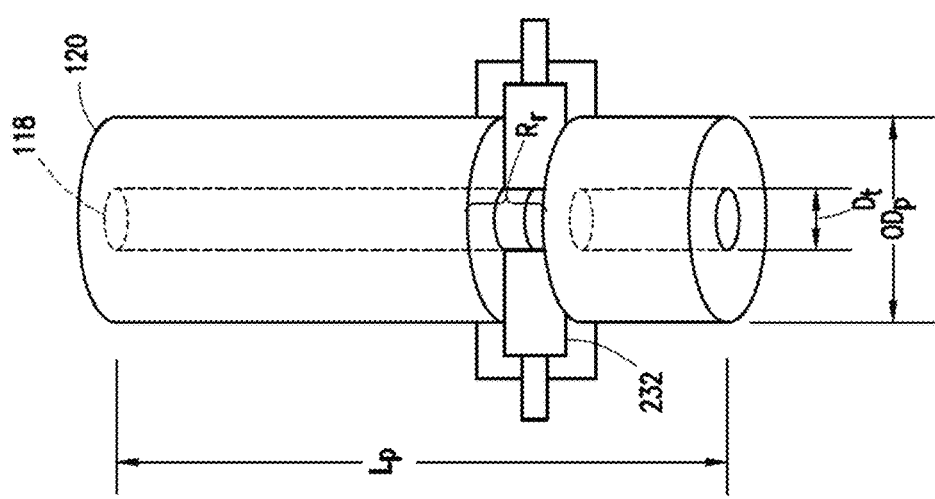
FIG. 15D
FIG. 15C

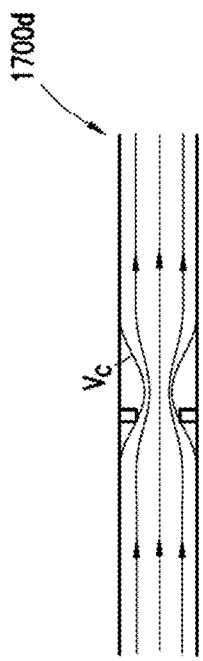
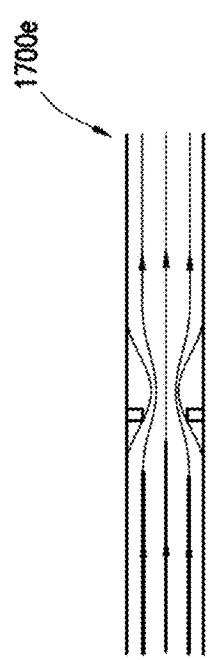
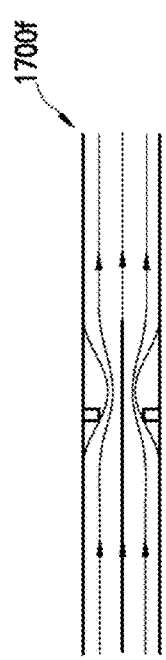
FIG. 17D
FIG. 17E
FIG. 17F
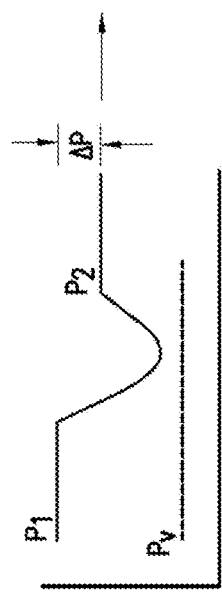
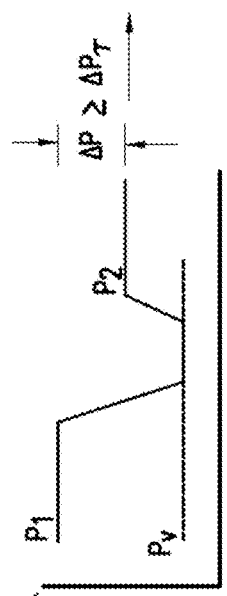
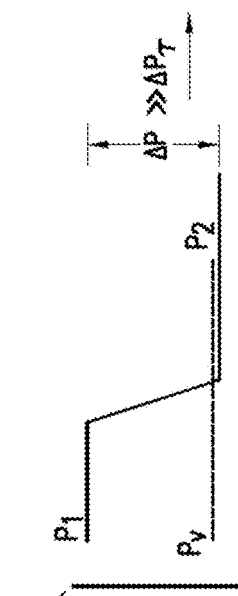
FIG. 17A
FIG. 17B
FIG. 17C

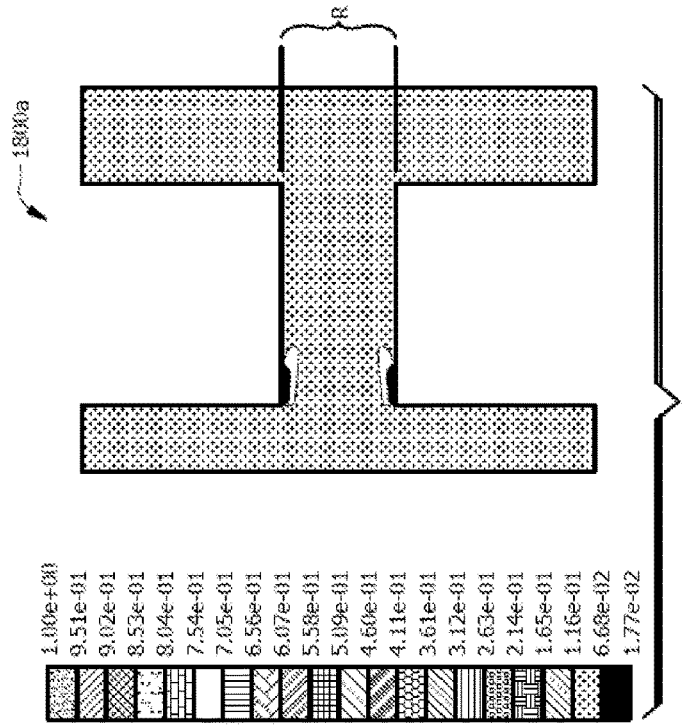
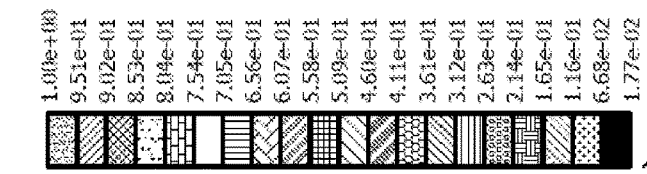
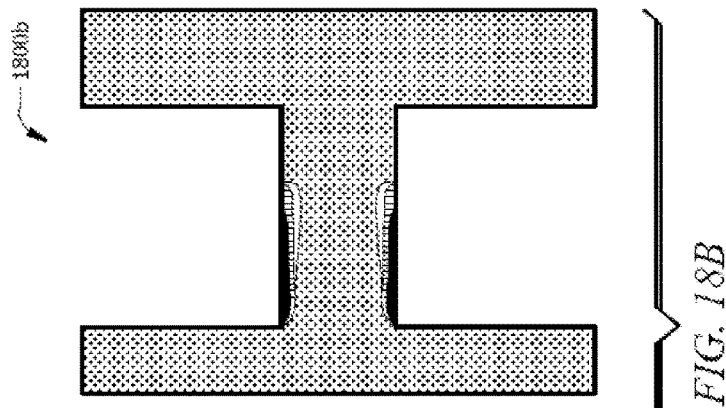
FIG. 18A
FIG. 18B

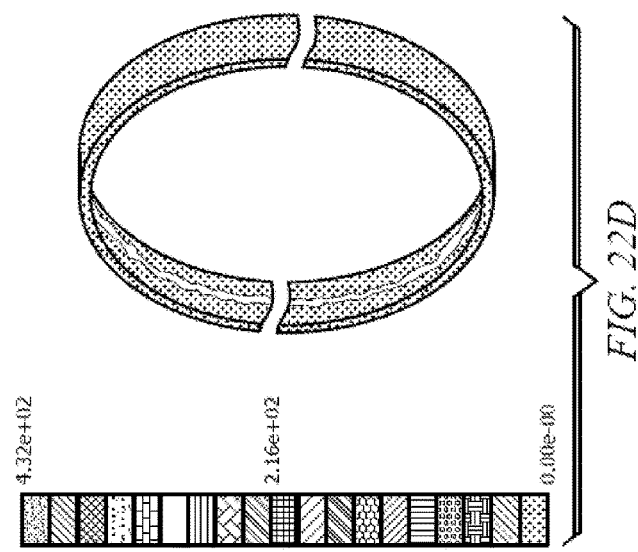
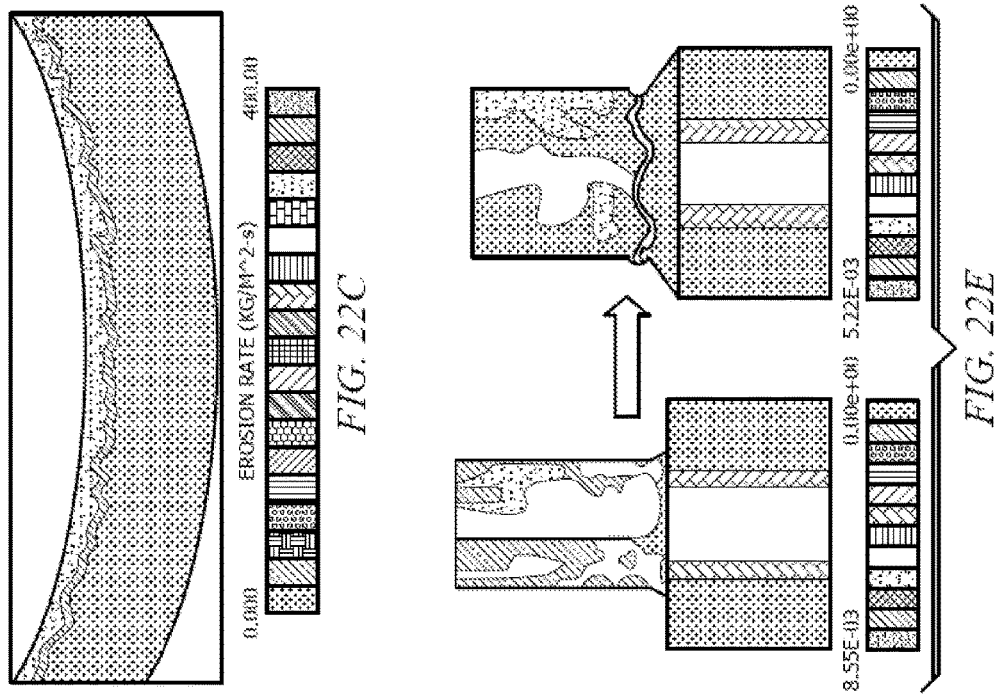
FIG. 22C
FIG. 22D
FIG. 22E

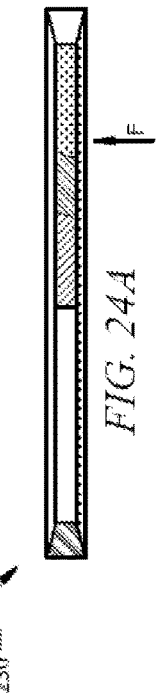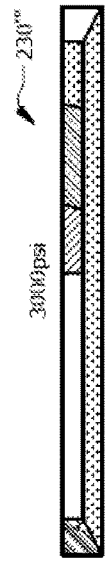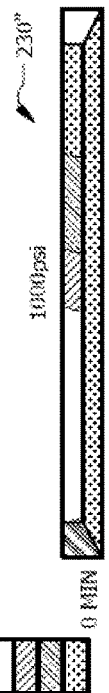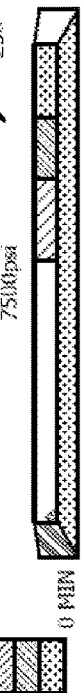
FIG. 24A    FIG. 24B
FIG. 24C    FIG. 24D
FIG. 24E    FIG. 24F

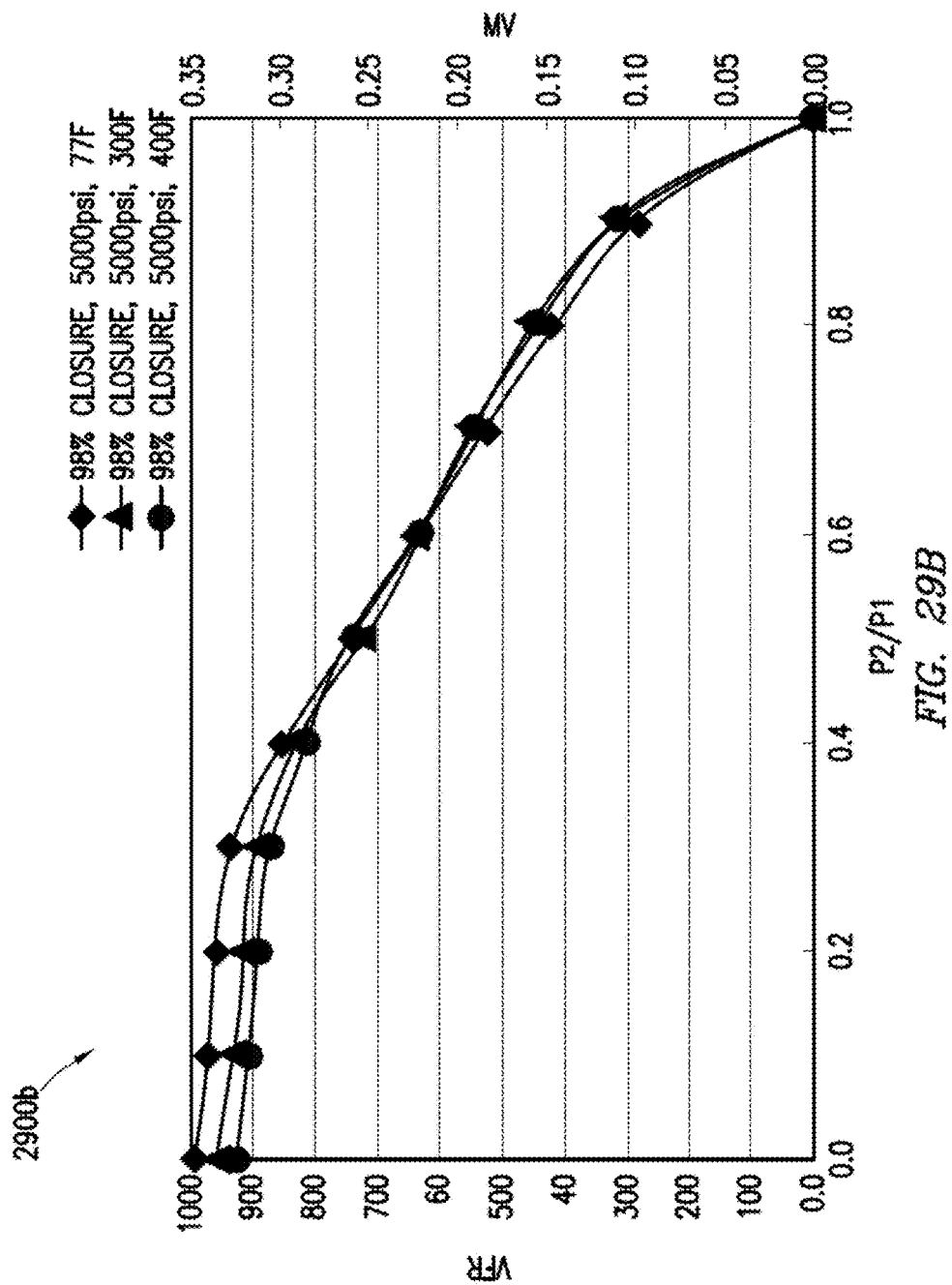

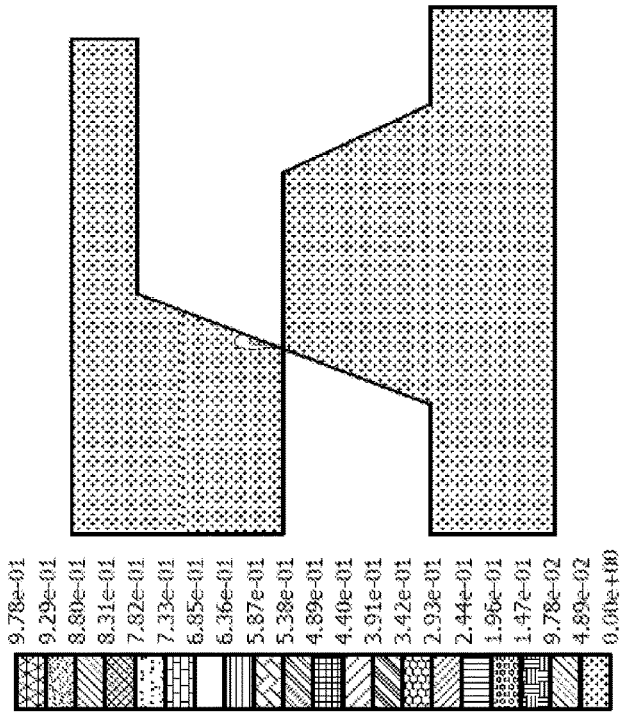
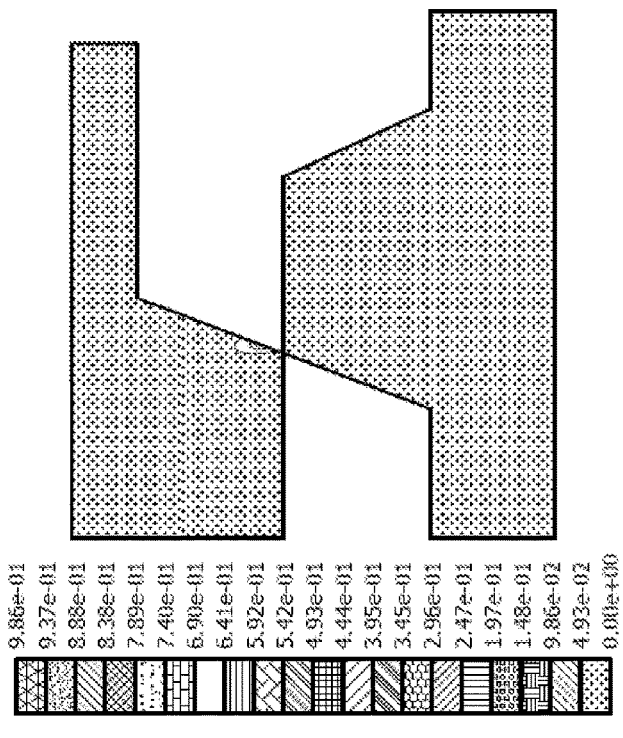
FIG. 32E
FIG. 32F

METHOD OF CLOSING A BLOWOUT PREVENTER SEAL BASED ON SEAL EROSION

CROSS-REFERENCE TO RELATED APPLICATIONS

This application claims the benefit of U.S. Provisional Application No. 62/088,520 filed on Dec. 5, 2014, the entire contents of which is hereby incorporated by reference herein.

BACKGROUND

This present disclosure relates generally to techniques for performing wellsite operations. More specifically, the present disclosure relates to techniques, such as seals and/or blowout preventers, for sealing wellbores and/or related testing.

Oilfield operations may be performed to locate and gather valuable downhole fluids. Oil rigs are positioned at wellsites, and downhole tools, such as drilling tools, are deployed into the ground to reach subsurface reservoirs. Once the downhole tools form a wellbore to reach a desired reservoir, casings may be cemented into place within the wellbore, and the wellbore completed to initiate production of fluids from the reservoir.

Downhole tubular devices, such as pipes, certain downhole tools, casings, drill pipe, liner, coiled tubing, production tubing, wireline, slickline, or other tubular members positioned in the wellbore, and associated components, such as drill collars, tool joints, drill bits, logging tools, packers, and the like, (referred to as 'tubulars' or 'tubular strings'), may be positioned in the wellbore to enable the passage of subsurface fluids to the surface.

To prevent leakage of subsurface fluids from the wellbore, equipment, such as blow out preventers (BOPs), may be positioned about the wellbore to form a seal to prevent leakage as fluid is brought to the surface. BOPs may have closing mechanism, such as rams or spherical fingers, that may be activated to seal and/or sever a tubular in a wellbore. Some examples of BOPs are provided in U.S. Patent/Application Nos. 2011/0226475; 20110000670; U.S. Pat. Nos. 8,424,607; 7,814,979; and 7,367,396, the entire contents of which are hereby incorporated by reference herein.

SUMMARY

In at least one aspect, the disclosure relates to a method of sealing a wellbore with a blowout preventer. The wellbore penetrates a subterranean formation. The method involves providing the blowout preventer with a blowout preventer seal. The blowout preventer has blowout preventer parameters and a fluid flowing through the blowout preventer has fluid parameters. The method also involves simulating erosion of the blowout preventer seal using a blowout preventer model based on the blowout preventer parameters and the fluid parameters, measuring erosion of the blowout preventer seal by performing a lab test of the blowout preventer seal in a tester according to the blowout preventer model, validating the simulating by comparing the simulated erosion with the measured erosion, determining an erosion rate of the blowout preventer seal based on the validated simulating, defining closing parameters based on the determined erosion rate, and operating the blowout preventer rams according to the defined closing parameters.

The method may also involve repeating the simulating, measuring, and validating until the simulated erosion is within a maximum range of the measured erosion. The blowout preventer parameters may include seal material, flow area, type of rams, ram shape, passage dimensions, vena contracta dimensions, and combinations thereof. The fluid parameters may include composition, density, flow rate and pressure. The simulating may involve performing three dimensional computational fluid dynamics simulations. The measuring may involve positioning the blowout preventer seal in the tester and passing the fluid through the tester and over the blowout preventer seal according to the fluid parameters. The method may also involve adjusting the blowout preventer model, and/or validating the erosion rate of the blowout preventer seal by passing the fluid over the blowout preventer seal in an in situ blowout preventer according to the blowout preventer model. The closing may involve closing the blowout preventer at a first rate and then at a second rate, and/or closing the blowout preventer up to 90% at a first rate and then closing the blowout preventer a remaining 10% at a second rate.

In another aspect, the method may involve providing the blowout preventer with a blowout preventer seal. The blowout preventer has a passage to receive a tubular of the wellbore therethrough and rams comprising seals engageable about the tubular to seal the passage, and blowout preventer parameters comprising blowout preventer dimensions. The method also involves passing fluid through the passage. The fluid having fluid parameters comprising flow rate. The method also involves simulating erosion of the blowout preventer seal using a blowout preventer model based on the blowout preventer parameters and the fluid parameters, measuring erosion of the blowout preventer seal by performing a lab test of the blowout preventer seal in a test chamber according to the blowout preventer model, validating the simulating by comparing the simulated erosion with the measured erosion, and determining an erosion rate of the blowout preventer seal based on the validated simulating.

The determining a closing time may be based on the erosion rate, and the closing time is less than an erosion time of the blowout preventer seal.

Finally, in another aspect, the disclosure relates to a method of sealing a wellbore with a blowout preventer. The wellbore penetrates a subterranean formation. The method involves providing a blowout preventer with a blowout preventer seal. The blowout preventer has a passage to receive a tubular of the wellbore therethrough and rams comprising seals engageable about the tubular to seal the passage, and blowout preventer parameters comprising blowout preventer dimensions. The method also involves passing fluid through the passage (the fluid having fluid parameters comprising flow rate), simulating erosion of a blowout preventer seal using a blowout preventer model based on the blowout preventer parameters and the fluid parameters, measuring erosion of the blowout preventer seal by performing a lab test of the blowout preventer seal in a tester according to the blowout preventer model, validating the simulating by comparing the simulated erosion with the tested erosion, determining an erosion rate of the blowout preventer seal based on the validated simulating, defining a closing time based on the determined erosion rate, and closing the blowout preventer within the closing time, the closing comprising closing a portion of the passage of the blowout preventer.

BRIEF DESCRIPTION OF THE DRAWINGS

A more particular description of the disclosure, briefly summarized above, may be had by reference to the embodiments thereof that are illustrated in the appended drawings. It is to be noted, however, that the appended drawings illustrate examples and are, therefore, not to be considered limiting of its scope. The figures are not necessarily to scale and certain features, and certain views of the figures may be shown exaggerated in scale or in schematic in the interest of clarity and conciseness.

FIG. 3 is another schematic view, partially in cross-section of the BOP ram with the BOP seals in a sealed position about a tubular.

FIGS. 15A-15D are various views of a passage of the BOP with the BOP rams in various positions.

FIGS. 17A-17F are schematic diagrams and associated graphs depicting various fluid pressure profiles of fluid passing through a passage having a vena contracts.

FIGS. 18A-18D are contour plots depicting flow choking about the vena contracta.

FIGS. 22A-22E are schematic diagrams depicting various views of erosion of the BOP seal.

FIGS. 24A-24F are various views of the BOP seal subject to various levels of pressure.

FIGS. 29A-29C are graphs depicting volumetric flow rate versus pressure ratio at various temperatures.

FIGS. 32A-32F are contour plots depicting more additional 3D simulations of vapor fraction inside a BOP seal.

DETAILED DESCRIPTION

The description that follows includes exemplary apparatus, methods, techniques, and/or instruction sequences that embody techniques of the present subject matter. However, it is understood that the described embodiments may be practiced without these specific details.

Sealing Based on Validated Closing Time

Blowout preventers (BOPs) may be positioned about a wellbore and/or a wellbore tubular to form a seal thereabout. The BOP has a housing operatively connectable to the wellbore and with a passage therethrough to receive the wellsite tubular. The BOP has closing mechanisms (e.g., rams or fingers) with one or more BOP seals extendable at a predefined closing time to seal the passage and prevent leakage. Fluid passes through the passage at a flow velocity which increases about the BOP seal, and may erode the BOP seal over time. Erosion of the BOP seal may affect its performance and/or closing time.

Various tests may be performed to determine BOP performance and/or various operational parameters which may affect sealing, such as BOP parameters (e.g., equipment configuration, ram type, dimensions, pipe diameter, pipe length, seal parameters (e.g., material, hardness, etc.), etc.), fluid parameters (e.g., fluid composition, fluid density, fluid flow rates, pressures, flow velocities, Reynolds number, etc.), sealing parameters (e.g., ram velocity, closing time, closing velocities, speed of ram activation, ram closure rate and/or percentage, method of sealing/shearing, etc.), and/or erosion (or wear) parameters (e.g., erosion rate of the BOP seal, material erosion resistance factor (MERF), etc.). Such tests may involve, for example, simulations, preliminary (e.g., small-scale or laboratory) testing, and/or in-situ (e.g., large-scale or wellsite) testing of the BOP, BOP rams, and/or BOP seal(s).

One or more of these parameters, such as erosion, MERF, and/or closing time, may be estimated from the simulations and/or preliminary testing of the BOP seal, and verified with the in-situ testing. These estimated and/or verified parameters may be used to monitor BOP performance to assure compliance with American Petroleum Institute (API) Standards, such as API Standard RP 53 Recommended Practice for Blowout Equipment, available at www.api.org, the entire contents of which is hereby incorporated by reference herein. Based on an understanding of such parameters, operation of the BOP (e.g., closing time) may be defined to reduce potential damage to BOP seals and/or to provide proper sealing of the BOP.

Figure 1:
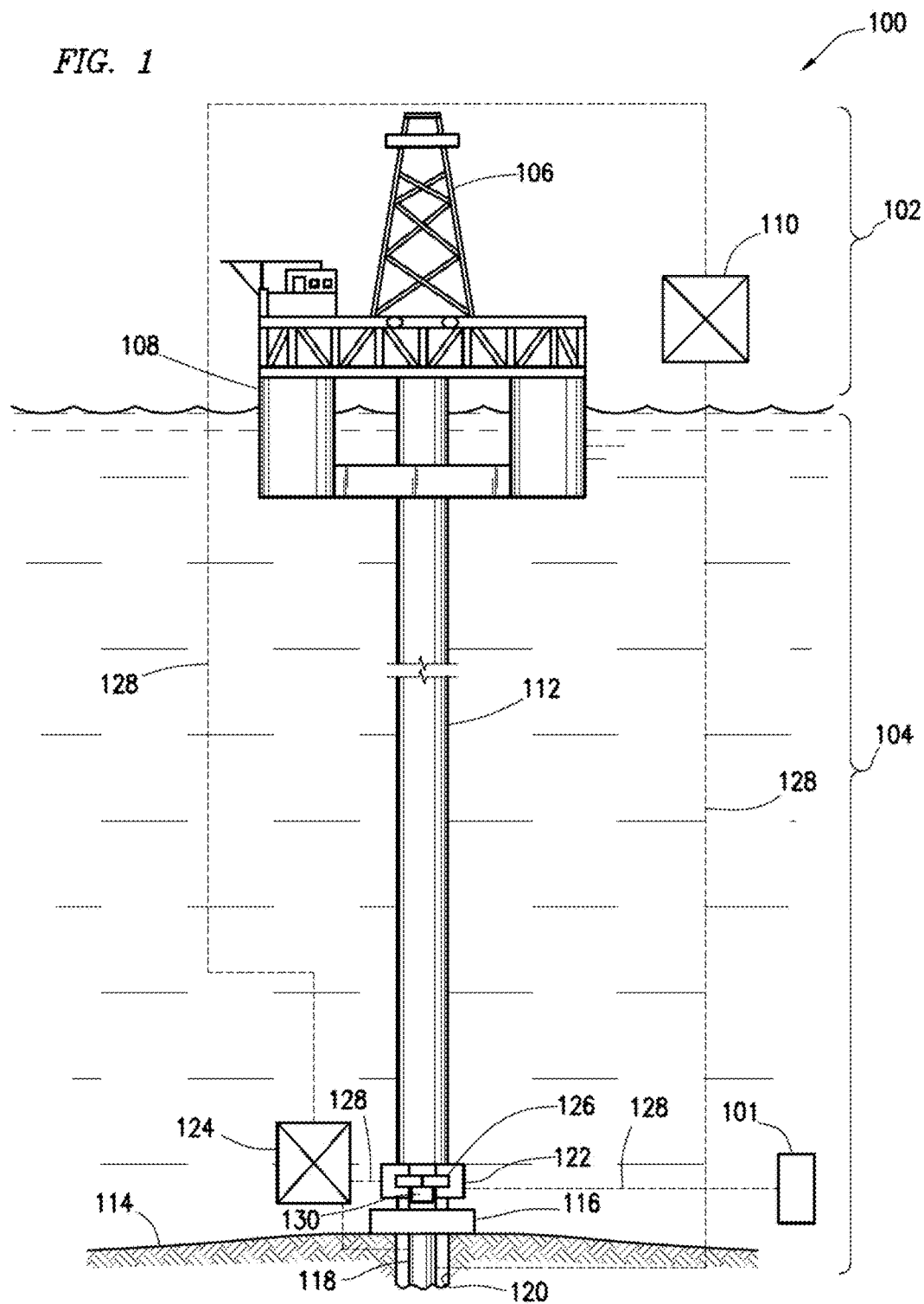
FIG. 1 depicts a schematic view of an offshore wellsite having a blowout preventer (BOP) including BOP seals and a BOP monitor.

FIG. 1 depicts an offshore wellsite 100 with a BOP monitoring system 101. While an offshore wellsite is depicted, the wellsite may be land based. The wellsite 100 has a surface system 102 and a subsea system 104. The surface system 102 may include a rig 106, a platform 108 (or vessel), and a surface unit 110. The surface unit 110 may include one or more units, tools, controllers, processors, databases, etc., located at the platform 108, on a separate vessel, and/or near to or remote from the wellsite 100.

The subsea system 104 includes a conduit (e.g., riser and/or tubing) 112 extending from the platform 108 to a sea floor 114. The subsea system 104 further includes a wellhead 116 with a tubular 118 extending into a wellbore 120, a BOP 122 and a subsea unit 124. The BOP 122 has a passage 125 to receive the tubular 118 therethrough, and a ram assembly 126 with BOP seals 130 for sealing the passage 125.

The surface system 102 and subsea system 104 may be provided with one or more control units, such as the surface unit 110 and/or the subsea unit 124, located at various locations to operate the surface system 102 and/or the subsea systems 104. Communication links 128 may be provided for communication between the units and various parts of the wellsite 100.

Figure 2:
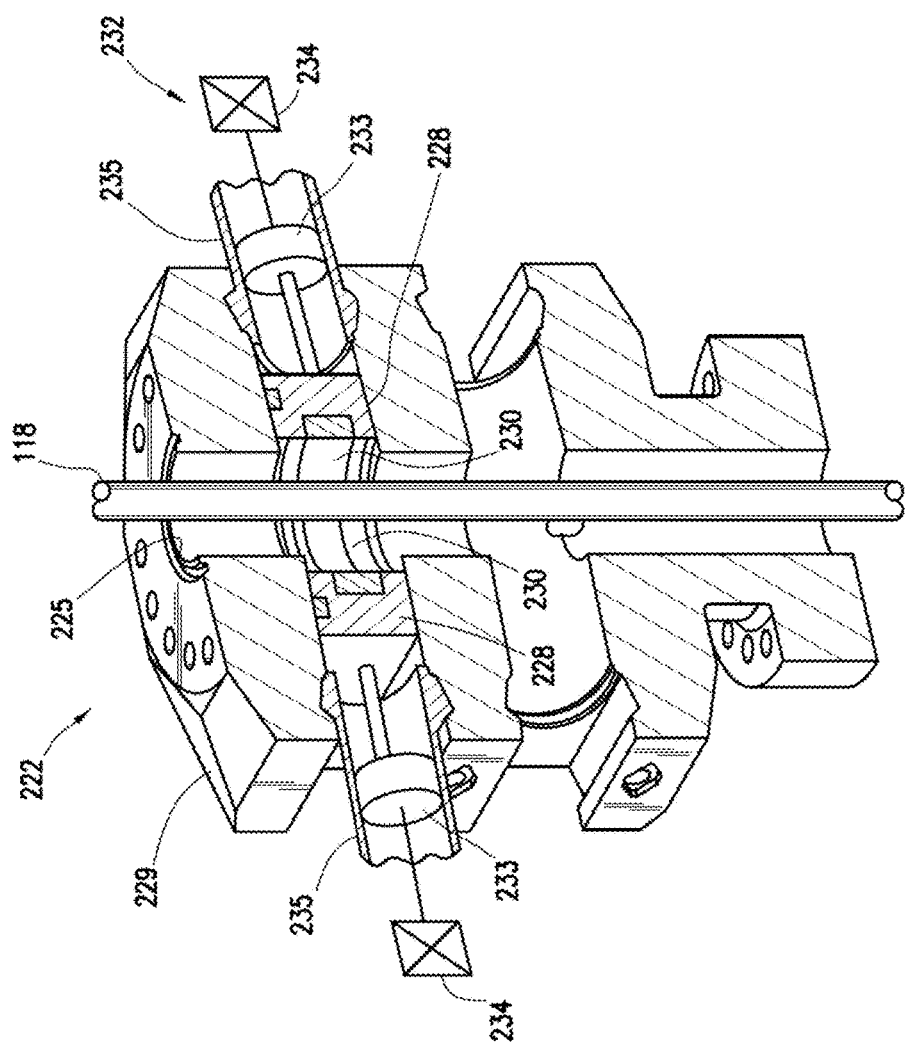
FIG. 2 is a schematic view, partially in cross-section of a BOP ram with the BOP seals in an unsealed position about a tubular.

FIG. 2 depicts an example BOP 222 usable as the BOP 122 of FIG. 1. The BOP 222 includes a housing 229 with rams 232. The tubular 118 extends through passage 225 in the housing 229. The rams 232 include actuators 234 and ram blocks 228 with the BOP seals 230 therein for forming a seal in the housing 229. The rams 232 are slidably positionable in the housing 229 of the BOP 222.

The ram blocks 228 of rams 232 are selectively movable by the actuators 234 for sealing about the tubular 118. The actuators 234 may include a piston 233 and cylinder 235 for selectively extending and retracting the ram blocks 228. The actuators 234 may be selectively activated, for example by the surface unit 110 and/or the downhole unit 124 (FIG. 1).

Referring to FIGS. 2 and 3, the BOP seals 230 may be carried by the ram blocks 228 as the rams 232 move relative to the tubular 118. Each of the BOP seals 230 may be made of, for example, a rubber and/or elastomeric material that is engageable with another BOP seal 230 and/or the tubular 118 to seal the BOP 222 and prevent fluid flow through the passage 225.

The rams 232 may be retracted to permit fluid flow through the passage 225 as shown in FIG. 2, or extended such that the BOP seals 230 form a seal about the passage 225 as shown in FIG. 3. The BOP seals 230 have a sealing surface exposed to the passage 225 and fluid flowing therethrough until sealed. The BOP seals 230 may seal with or without contact with the tubular 118. In some cases, the rams 232 may have severing mechanisms, such as blades that sever the tubular 118.

FIGS. 2 and 3 show an example of a ram type BOP 222 that may be used. Examples of ram BOPs are provided in US Patent/Application No. 20110000670; U.S. Pat. Nos. 7,814, 979; and 7,367,396, previously incorporated by reference herein. Other types of BOPs or other sealing mechanisms for carrying seals for sealing the wellbore, such as spherical BOPs, may also be used. Examples of spherical BOPs are provided in U.S. Patent/Application Nos. 2011/0226475, previously incorporated by reference herein.

The BOP 222 may be moved between a sealed or unsealed position about the passage 225. As shown, the ram blocks 228 (or other closing mechanisms carrying seals) may remain in the retracted (or open or unsealed) position of FIG. 2 until activated (or engaged) to move to the extended (or closed or sealed) position of FIG. 3. As shown in FIG. 3, the BOP 222 is subject to various operating conditions as indicated by the depicted sealing parameters, including fluid velocity Vf, differential pressure $\Delta P$, and closing velocity Vc. The fluid velocity Vf is the rate of fluid flowing from the wellbore passing through the passage 225. The differential pressure $\Delta P$ may be created above and below the ram blocks 228 (e.g., when closed). The closing velocity Vc is the speed of travel of the rams 232 as they move to a closed (or extended or seal) position.

The sealing parameters may affect operation of the BOP 222. For example, the fluid flowing past the BOP seals 230 in the ram blocks 228 may erode a surface of the BOP seals 230 over time. To compensate for changes in the BOP seals 230, such as erosion, adjustments may be made to the operation of the BOP 222. For example, the closing velocity Vc of the rams 232 may change and/or longer time may be needed to advance the rams 232 to assure a proper seal about the passage 225 as the BOP seals 230 erode. A corresponding 'closing time' of the rams 232 may be affected by such changes. For example, current API Standard RP 53 (previously incorporated by reference herein) requires that certain rams move to the closed position within 30 seconds.

Figure 4B:
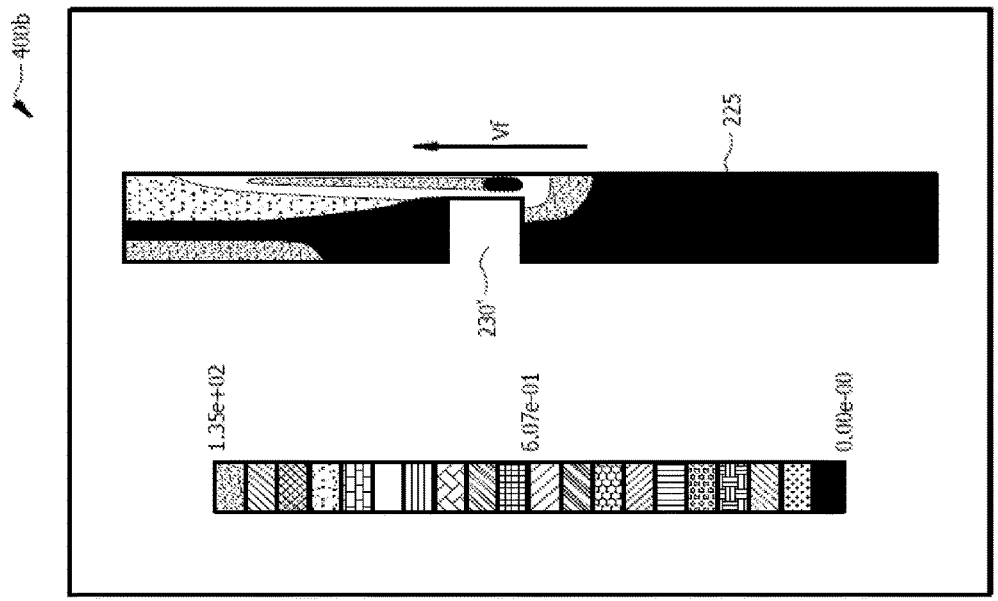
FIG. 4B is a schematic view of a portion of the BOP depicting flow velocities about the BOP seal during closing.
Figure 4A:
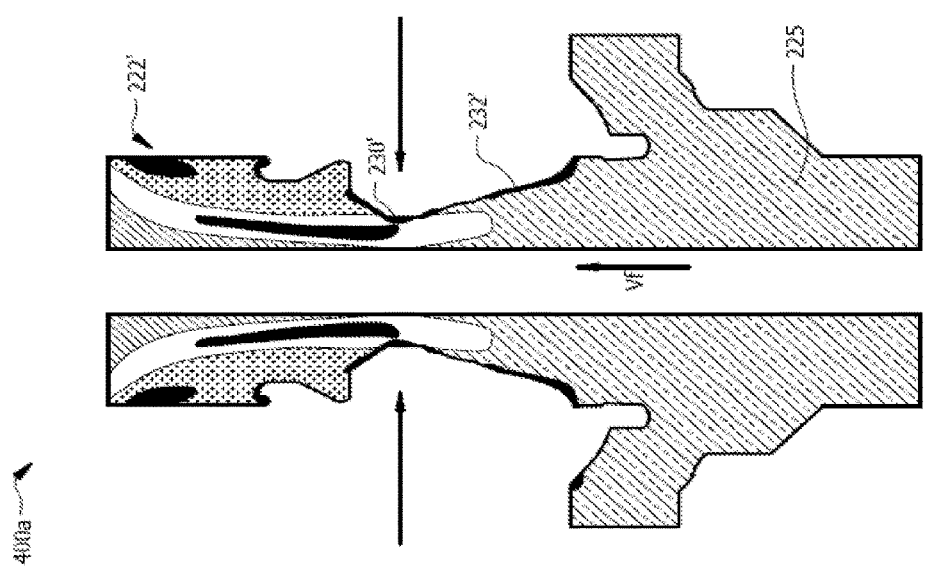
FIG. 4A is a vertical cross-sectional view of a spherical BOP depicting flow velocities about the BOP during closing.

FIGS. 4A and 4B are schematic diagrams depicting simulations of the magnitude of flow velocities Vf of fluid in the passage 225 of a spherical (or annular) BOP 222'. FIG. 4A is a schematic diagram 400a depicting a vertical cross-sectional view of a portion of a spherical BOP having the fluid velocity Vf through the passage 225. FIG. 4B is a schematic diagram (contour plot) 400b depicting of a portion of the BOP 222' and the fluid velocity Vf of fluid through the passage 225 about the BOP seal 230'.

The simulations as shown depict the effect of flow about seals of the BOP during operation. FIG. 4A shows fluid velocity in the spherical BOP 222' as the closing mechanisms 232' close. Similar effects may be shown with other BOPS, such as the ram BOP of FIGS. 2 and 3. FIG. 4B shows the fluid velocity about the BOP seal during testing in a seal tester, such as the seal tester of FIG. 5 which is described further herein.

These figures indicate the flow rate about the BOP 222. FIG. 4A illustrates fluid velocity Vf about the BOP seals 230' as the BOP seals 230' close about the passage 225 as indicated by the arrows. As the closing mechanism 232' closes, the flow area in the passage 225 about the BOP seals 230' decreases and the fluid velocity Vf increases. A similar increase in fluid velocity Vf is seen in FIG. 4B where the seal 230' is extended, and the fluid velocity is increased about the seal 230'.

These figures demonstrate an increase in fluid velocity in reduced flow areas along the passage 225. These figures also demonstrate an increase in fluid velocity at the BOP seals 230' that occurs during sealing of the BOP 222'. Fluid passing along the BOP seals 230' may erode the BOP seals 230' over time. Increases in fluid velocity Vf may increase the rate of erosion of the BOP seals 230'.

The simulations shown in FIGS. 4A and 4B may be performed using a variety of fluid flow simulators, such as ANSYS™ Fluent commercially available at www.ansys.com. Such flow simulators may be capable of determining operating parameters, such as maximum flow velocity and Reynolds number for a given BOP, using, for example, finite element analysis.

The simulations may be performed to predict operating conditions given certain known parameters, such as BOP dimensions, and input flow velocities. Additional data may be collected from various sources, such as collected test data, client data, manufacturing specifications, research, and/or other information. Data may also be collected over time to develop historical records. One or more simulations, such as those shown in FIGS. 4A and 4B may be performed. The simulations may generate various outputs, such as maximum flow velocity and Reynolds number, based on the seal, BOP, operating, and/or other parameters (e.g., sealing parameters) and/or inputs.

Figure 5:
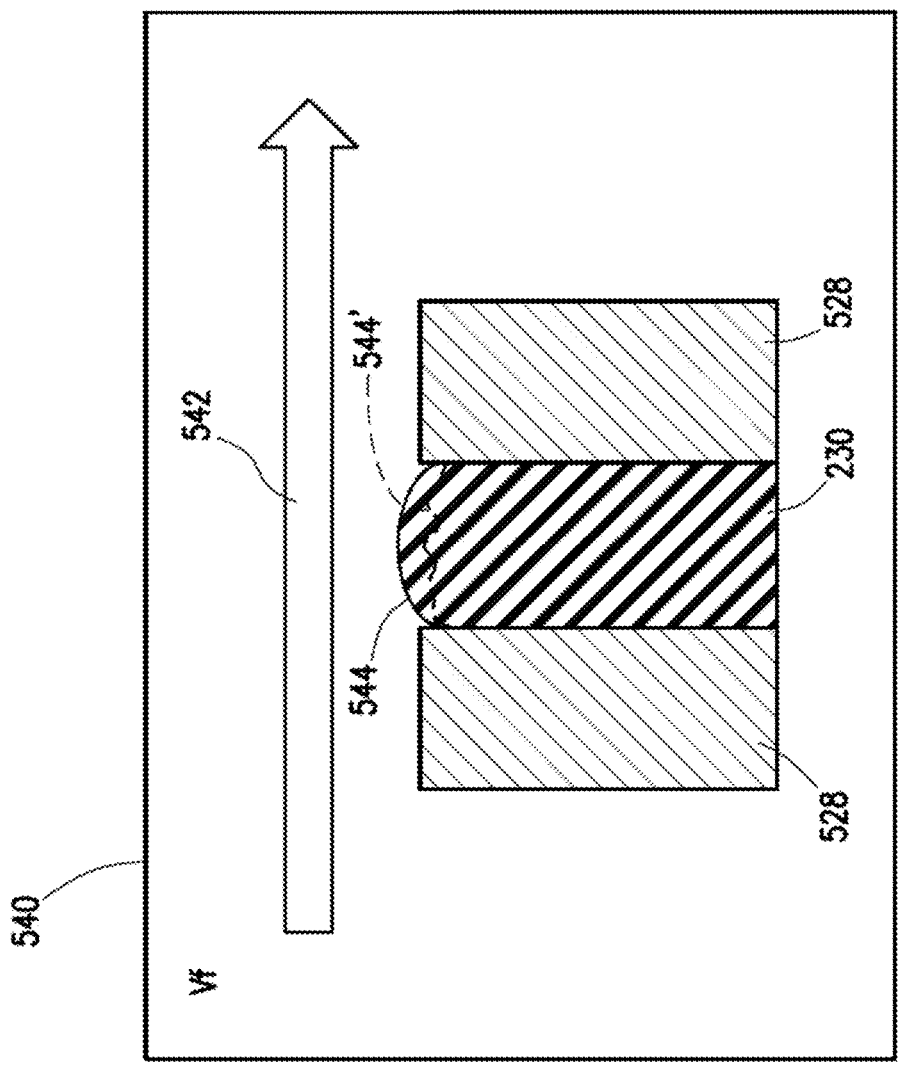
FIG. 5 is a schematic diagram depicting a seal tester with the BOP seal therein.

FIG. 5 is a schematic diagram depicting an example preliminary test that may be performed to evaluate a BOP seal 230. In this example, the preliminary test is an erosion test performed using a seal tester 540. The seal tester 540 may be used, for example, to perform preliminary (e.g., small-scale or estimated) testing of the BOP seal 230 to determine preliminary (or estimated) seal and/or erosion parameters, such as erosion. The simulation of FIG. 4B may be configured to correspond to the seal tester 540 to define operating parameters for performing the testing.

As shown in FIG. 5, the seal tester 540 includes a test block 528 for supporting the BOP seal 230 therein during testing. The test block 528 may have a similar structure to the ram block 228 (or other closing mechanisms or portions thereof) to replicate operating conditions of the BOP seal 230 in an actual BOP. The test block 528 may be the actual ram block 228 (or closing mechanism) and/or a test block designed to support the BOP seal 230 during testing.

The BOP seal 230 is positioned in the seal tester 540 and with a sealing surface 544 thereof exposed to fluid 542. The fluid 542 is passed over the sealing surface 544 of the BOP seal 230 at a given flow velocity Vf. As indicated by dashed line 544', the BOP seal 230 may erode over time as the fluid 542 flows thereby. Erosion of the BOP seal 230 may be monitored and measured for a given test period. The erosion may be measured using, for example, water displacement, scanning, weight, geometry, and/or length measurements.

The seal tester 540 may be operated with various fluid conditions (e.g., flow velocities, density, composition, etc.), various seal configurations (e.g., various materials, seal dimensions, seal shapes, etc.), and/or various tester configurations (e.g., test block and/or test rig shape and/or dimension). The operating conditions of the testing may be based on the fluid parameters, such as maximum flow velocity and Reynolds number, determined by the simulations. One or more BOP seals 230 may be tested with the tester over a given test cycle. The operating conditions and/or the BOP seal 230 may be altered and/or replaced for retesting at various potential parameters. The results may be repeated, adjusted, and/or compared to evaluate performance and/or optimize operating conditions based on the testing.

Seal testing and/or analysis may be performed using, for example, the simulations of FIGS. 4A and 4B, the preliminary test of FIG. 5, and/or other testing. Various testing may be performed to determine erosion and/or other parameters relating to the BOP 222. In another example, in-situ testing (which may be similar to the preliminary testing) may be performed using an actual BOP (e.g., 222 of FIGS. 1 and 2) in a tester, at a test bench, and/or at an actual wellsite. Such in-situ testing may be used to determine various parameters, such as erosion, actual closing time, etc.

The in-situ testing may be, for example, full-scale testing used to supplement or replace the preliminary testing, or to validate the results generated from the simulated and preliminary testing. The in-situ testing may be performed with the BOP seal 230 mounted in the BOP 222 at the actual wellsite and/or with a BOP mounted in a test module. The BOP test module may be similar to the seal tester 540, except that part or all of the BOP 222 may be within the seal tester 540 and exposed to the fluid flow.

The simulated, preliminary, and/or in-situ testing may be used to generate data and/or various parameters, such as maximum flow velocity, Reynolds number, erosion over time, wear at various flow velocities, elasticity over time, etc. Additional empirical data may also be collected concerning the wellsite (e.g., depth, wellbore fluid composition, hole size, etc.), BOP (closing velocity, dimensions, type, etc.), closing mechanism (shape, dimensions, seal support, etc.), and/or other factors that may affect sealing. Data may also be collected from other sources, such as historical data, data in other wellsites, and/or data from other simulations and/or preliminary test, and considered in the evaluation. Data from one or more sources and/or tests may be collected and analyzed, for example, by comparison and/or other interpretation. Such simulations may be compared with preliminary and/or in-situ data to validate results.

Collected data may be used to determine erosion parameters, such as an erosion factor (MERF), of the BOP seals. MERF is a factor based on fluid type, fluid velocity, Reynolds number, elastomer in the BOP in contact with fluid. The MERF describes the BOP seal's ability to resist erosion at a given velocity at a given Reynolds number. The MERF may be generated from the erosion ε generated by the erosion equation below based on the maximum flow velocity and Reynolds number determined in the simulation, and the erosion determined by the preliminary testing:

$$\varepsilon = \frac{2\left(\frac{8}{3\pi}\right)^{(\beta-1)/2} B\sin\theta(1+\cos\theta)^\beta}{\text{Constant Term}} \qquad \text{Eqn (1)}$$

$$\underbrace{\rho_p^{(\beta-1)/2} u^{\beta+1} R^{\beta-1}}_{\text{Particle}} \underbrace{u^\beta \rho_i \left(\frac{E}{1-v^2}\right)^{(\beta-1)/2}}_{\text{Rubber}} \underbrace{Q(\alpha)}_{\text{Angle}}$$

where $\rho_p$ is the particle density, $\rho_r$ is the rubber density, R is the radius, v is Poisson's ratio, β is a constant in the equation relating crack growth rate per stress cycle to tearing energy, α is impact angle, θ is the angle to the horizontal at which cracks grow (e.g., about 15°) for natural rubber and styrene-butadiene rubber eroded by silica particles (sand), u is impact velocity, μ is coefficient of friction, and E is Young's modulus. Q(α) is an Arnold-Hutchings model relating to a function of the angle of impact of the particles based as described in Arnold, Hutchings, Erosive Wear of Rubber by Solid Particles at Normal Incidence, Scopus Vol. 161, Iss. 1-2, 1 Apr. 1993, pp. 213-21, the entire contents of which is hereby incorporated by reference herein. Equation (1) provides a mathematical model for erosion ε. This model may be used in the simulator (e.g., inserted into ANSYS™) to generate theoretical erosion based on simulation.

Simulation may be used to provide the theoretical erosion, which may be used to generate the MERF. The simulations (e.g., FIGS. 4A and 4B) may be used to generate simulated sealing parameters, such as maximum flow velocity and Reynolds number, and the preliminary testing (e.g., FIG. 5) may be used to generate preliminary erosion parameters, such as erosion of the BOP seal. These operational parameters may be used to generate erosion parameters, such as the MERF, which may be used to determine an estimated closing time of the BOP.

The MERF may then also be used to determine a maximum estimated closing time. The maximum estimated closing time may be estimated based on the estimated erosion factor and validated using in-situ testing. The in-situ testing may be used to perform actual tests that may validate various estimated operating parameters, such as the determined erosion, MERF, and/or closing time. For example, the closing time measured in operation of the BOP at the wellsite may be compared with the estimated closing time determined based on the erosion parameters generated from the preliminary testing and/or simulations.

Various parameters may be determined using the analysis set forth in FIGS. 6-9. FIGS. 6-9 demonstrated the relationship between various factors, such as the well (e.g., equipment, fluid production, wellbore, etc.), the BOP (e.g., dimensions, flow, etc.), and/or the BOP seals (e.g., material, shape, dimensions, etc.), that may affect erosion.

Figure 6:
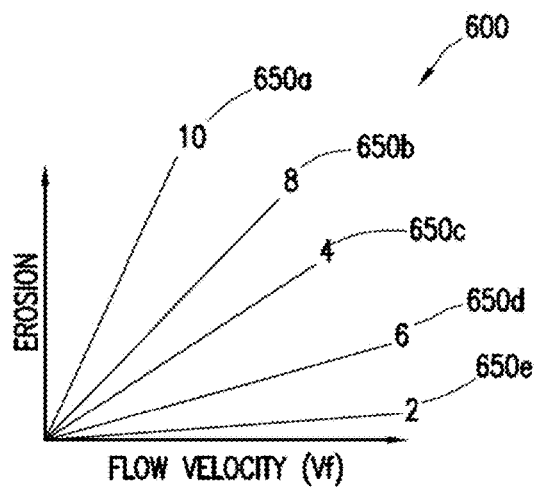
FIGS. 6-9 are graphs depicting various aspects of seal erosion.

FIG. 6 is a graph 600 depicting erosion (y-axis) verses flow velocity Vf (x-axis) for different BOP seals having various MERF values 650 a-e. As indicated by graph 600, the hardness of the BOP seal, indicated by a given MERF, may affect erosion and/or flow rate. For example, a MERF of 10 provides a harder seal and a MERF of 2 provides a softer seal that responds more to the flow characteristics. A similar graph may be provided by replacing the flow velocity Vf with other flow parameters, such as viscosity. Thus, a BOP seal at a given MERF may be selected to achieve a desired erosion relative to flow velocity under given operating conditions.

Figure 7:
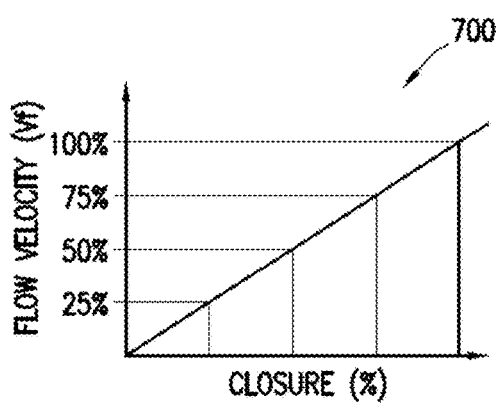

FIG. 7 is a graph 700 depicting flow velocity Vf (x-axis) versus % closure (y-axis). This graph shows a direct (e.g., linear) relationship between the % closure and the flow velocity. Thus, as % closure is changed, flow velocity (or other fluid characteristics, such as viscosity) also changes. The flow velocity, therefore, can be affected by the % closure. The graph 700 corresponds with the closing of the BOP and the corresponding increase in flow velocity as shown, for example, using the simulations of FIG. 4A.

Figure 8:
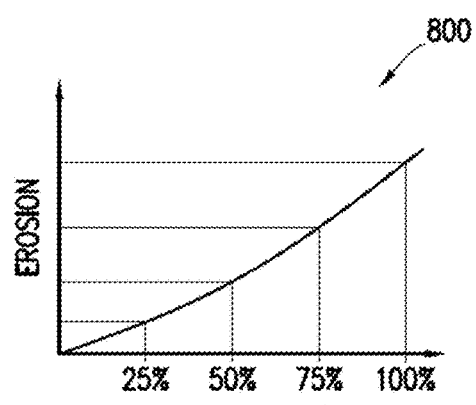

FIG. 8 is a graph 800 depicting erosion (y-axis) versus % closure (x-axis). As indicated by this graph 800, as the % closure increases, the amount of erosion increases (i.e. the BOP seal erodes faster). At different points of closure, erosion for a given BOP seal having a given MERF may be determined. The graph 800 corresponds to the erosion demonstrated by the simulation of FIG. 4B.

Given the flow velocity determined for a BOP seal with a given MERF as shown in FIG. 6, an erosion may be determined. For a given % closure, the flow velocity of FIG. 7 may be determined. From the % closure of FIG. 8, a specific erosion for a given BOP seal may be determined based on the erosion determined in FIG. 6.

Figure 9:
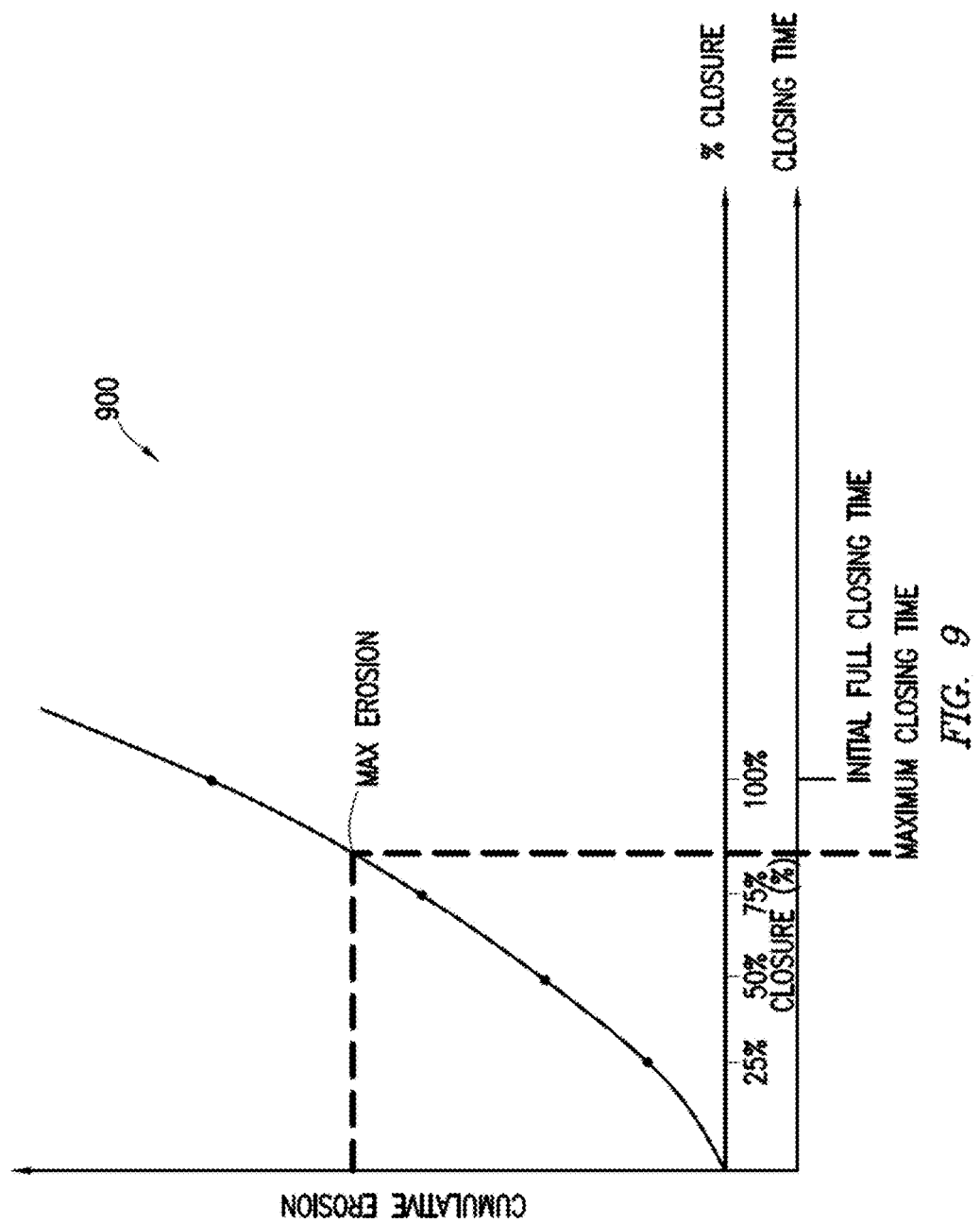

FIG. 9 is a graph 900 depicting cumulative erosion (y-axis) versus % closure (x1-axis) and closing time (x2-axis). Like FIG. 8, as the 0% closure increases, the amount of erosion increases (i.e. the BOP seal erodes faster). For the same % closure of FIG. 8, the cumulating erosion over time may be depicted.

As demonstrated by this graph, the BOP may seal up to a given amount of erosion. The maximum erosion may determine a maximum amount of erosion that may be accumulated on the BOP seal to provide a corresponding maximum (or desired) closing time. The maximum closing time may be the time required by API standards or other desired time (such as a shorter closing time). In order to seal within the maximum closing time, the cumulative erosion remains below the maximum erosion to assure operation at the required closing time.

Figure 10:
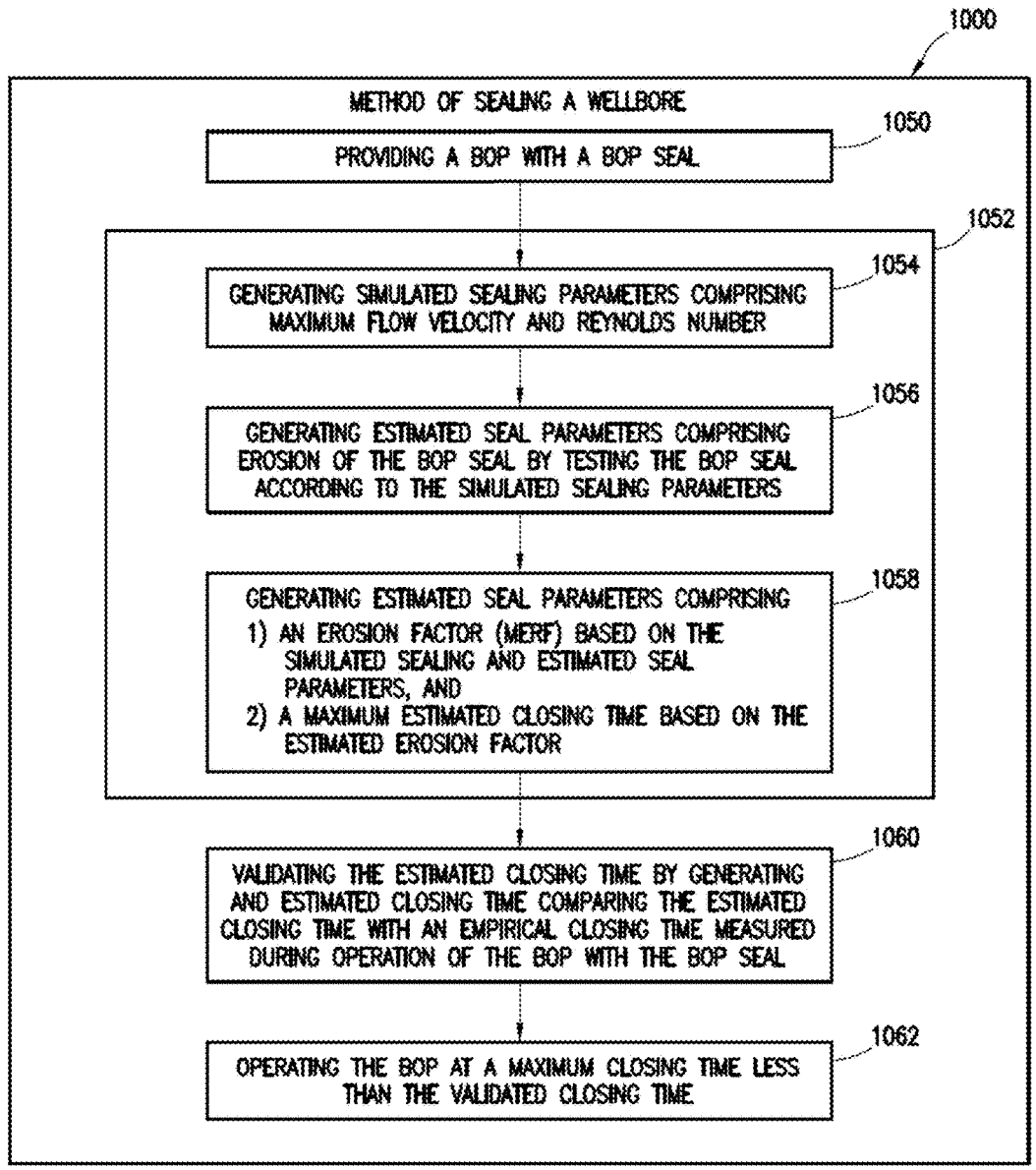
FIG. 10 is a flow chart depicting a method of sealing a wellbore.

FIG. 10 depicts a method 1000 of sealing a wellsite. The method 1000 involves 1050—providing a BOP (e.g., BOP 222 with BOP seal 230 of FIG. 2). The method 1000 continues 1052—testing a BOP seal. The testing 1052 involves 1054—generating simulated sealing parameters comprising maximum flow velocity and Reynolds number, 1056—generating estimated sealing parameters comprising erosion of the BOP seal by testing the BOP seal according to the simulated sealing parameters. The testing may be preliminary (e.g., small-scale) testing performed, for example, using the BOP seal 230 in the seal tester 540 as shown in FIG. 5. The testing 1052 also involves 1058—generating estimated operating parameters comprising: 1) an erosion factor (MERF) based on the simulated and estimated sealing parameters, and 2) a maximum estimated closing time based on the estimated erosion factor.

The method 1000 may also involve 1060—validating the estimated closing time by comparing the estimated closing time with an empirical closing time measured during operation of the BOP with the BOP seal. The validating may be done, for example, by monitoring the operation of the BOP 122 at the wellsite 100 using the BOP monitor 101 as shown in FIG. 1 or on a test bench. The method may also involve 1062—operating the BOP at a maximum closing time less than (or equal to) the validated closing time.

The methods may be performed in any order, or repeated as desired. Various combinations of the methods may also be provided.

Sealing Based on a Quasi-Dynamic Validated Closing Time

As indicated above, operation of the BOP may be affected by interaction between the various operational parameters, such as BOP parameters and the fluid parameters, resulting in combined effects, such as cavitation, choking, and/or flashing. Cavitation as used herein refers to empty spaces or voids within the BOP that are created as a liquid passing through the passage is subjected to rapid changes of pressure. Choking (or choked flow) as used herein refers to fluid dynamics that occur as a flowing fluid passes through a vena contracta (or restriction), such as where the BOP rams in the passage. Flashing as used herein refers to the creation of bubbles in the flow as a result of passing through the vena contracta.

The effects of the combined parameters may result in additional and/or faster erosion of the BOP seals. Based on an understanding of the operational and/or combined parameters, the sealing parameters may be defined to reduce potential damage to BOP seals and/or to provide proper sealing of the BOP. Such sealing may be provided even in the presence of high pressures (e.g., greater than about 5 kpsi).

Figure 11:
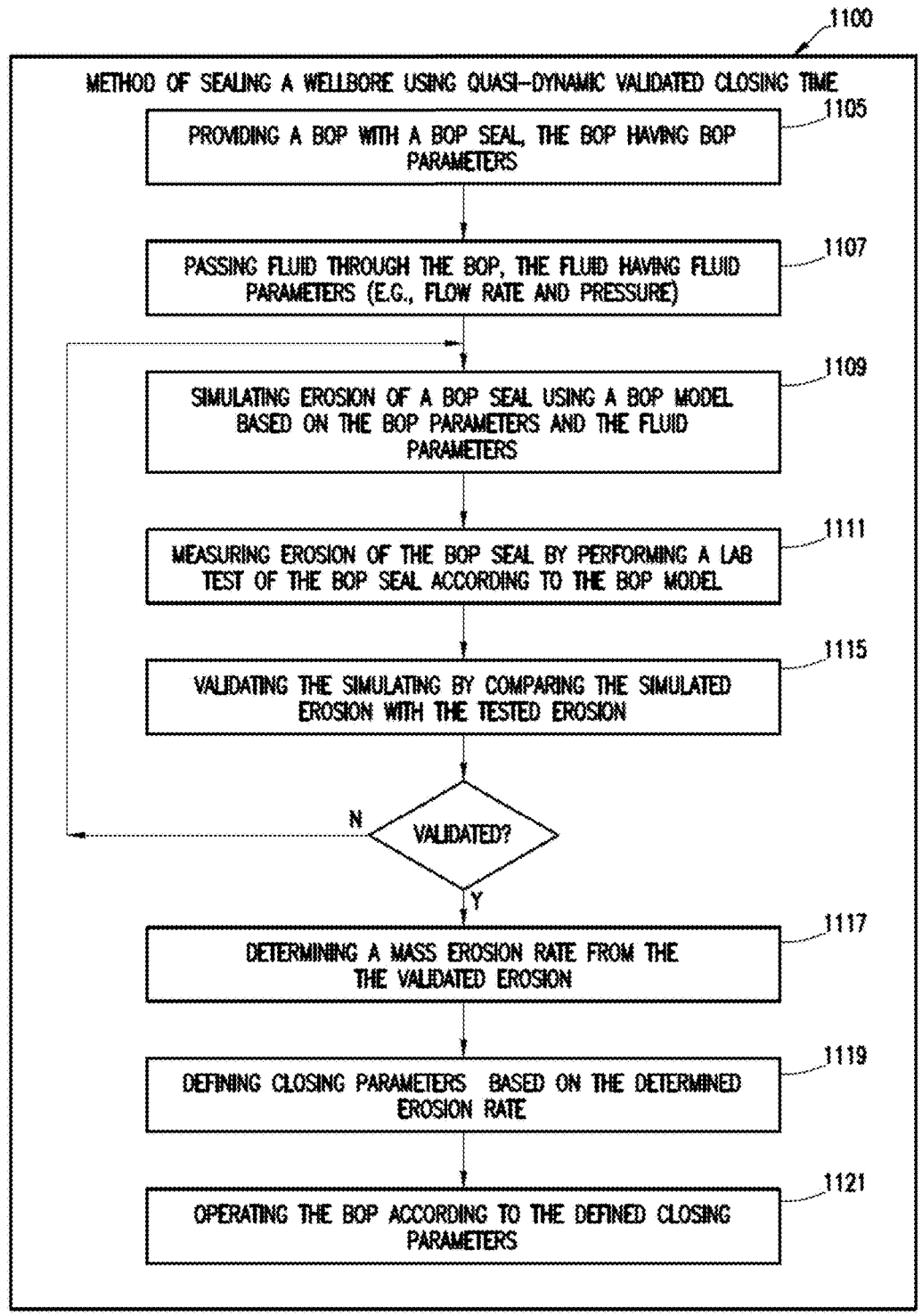
FIG. 11 is another flow chart depicting another method of sealing a wellbore.

FIG. 11 is a flow chart depicting a method 1100 of sealing a wellbore using a quasi-dynamic closing time. The method 1100 involves 1105—providing a BOP with a BOP seal, the BOP having BOP parameters, 1107—passing fluid through the BOP, the fluid having fluid parameters (e.g., flow rate and pressure), 1109—simulating erosion of a BOP seal using a BOP model based on the BOP parameters and the fluid parameters, 1111—measuring erosion of the BOP seal by performing a lab test of the BOP seal according to the BOP model.

The method 1100 further involves 1115—validating the simulating (1109) by comparing the simulated erosion with the tested erosion. If not validated, repeating the simulating 1109, testing 1111, and validating 1115 until the simulated erosion is within a given range of the tested erosion. If validated, the method continues with 1117—determining a mass erosion rate from the validated erosion, 1119—defining closing parameters based on the determined erosion rate, and 1121—operating the BOP according to the defined closing parameters. Portions of the method 1100 is described in further detail in the sections below:

1. BOP Parameters

The providing 1105 may involve providing the BOP 122, 222 as shown in FIGS. 1-3. The BOP may have a configuration defined by the various requirements, such as the BOP parameters, environmental conditions (e.g., environmental considerations, temperatures, pressures, etc.), the sealing parameters, and/or other parameters. Such defined operational parameters may be used in performing various operations (e.g., modeling, simulations, and/or experimental tests) as described further herein.

Figure 12:
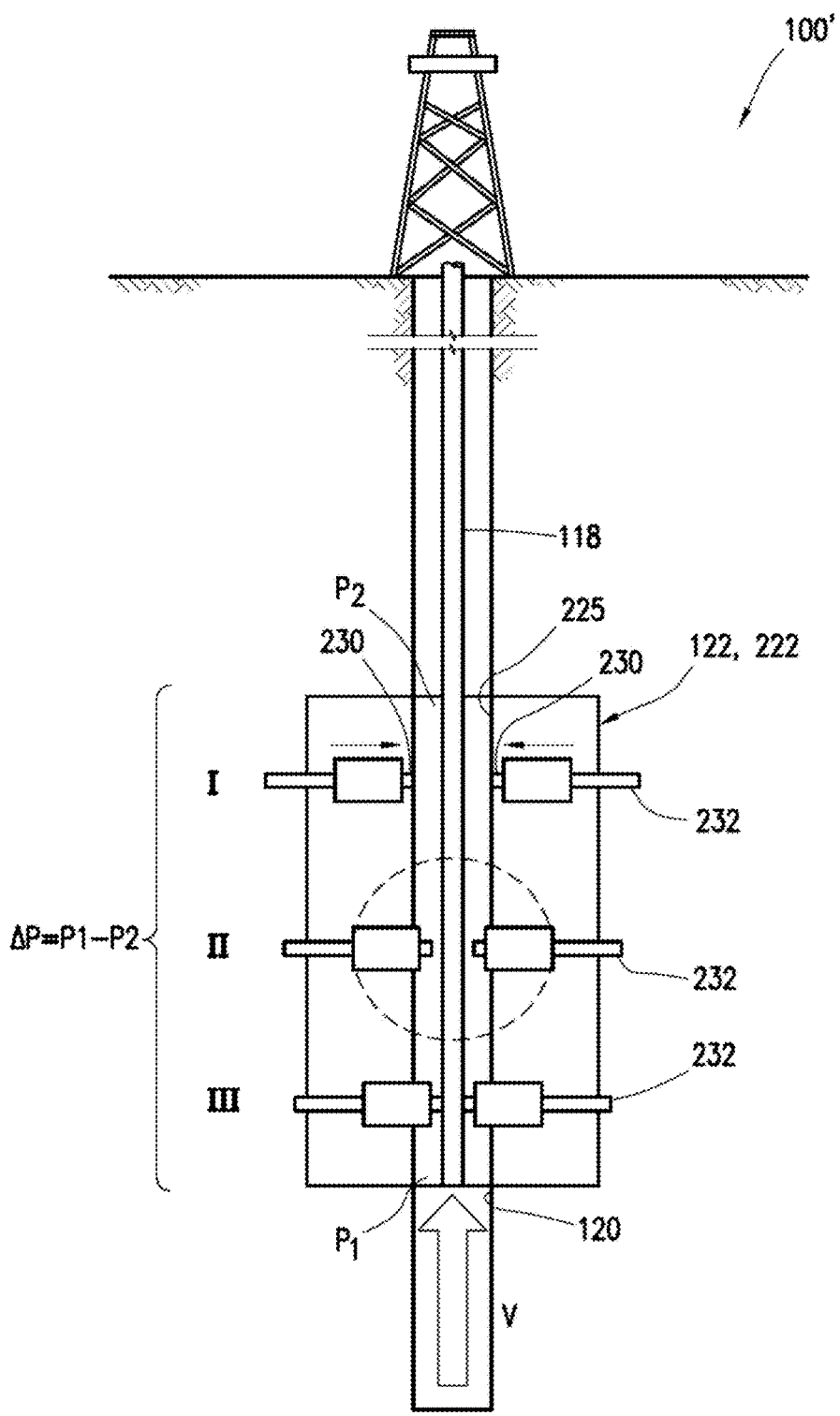
FIG. 12 is another schematic view of the offshore wellsite depicting the BOP with the BOP rams having BOP seals in various positions about the tubular.

FIG. 12 shows another view of the wellsite 100' and the BOP 122, 222 depicting the rams 232 in various positions. As shown by this depiction, rams 232 are extendable for engagement with the tubular 118. Upon activation, the rams 232 are advanced such that the BOP seals 230 on the rams 232 engage the tubular 118 and/or an adjacent ram 232 to seal the passage 225 in the BOP 222, thereby also sealing the wellbore 120. The rams 232 may advance from a retracted position as shown in stage I to an intermediate position in stage II, and to a sealed position as shown in stage m.

Figure 13A:
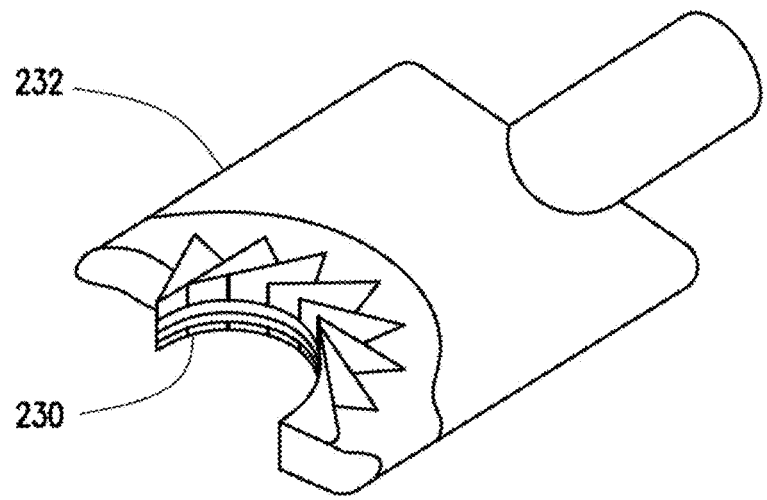
FIG. 13A is a perspective view of the BOP ram showing the BOP seal.
Figure 13B:
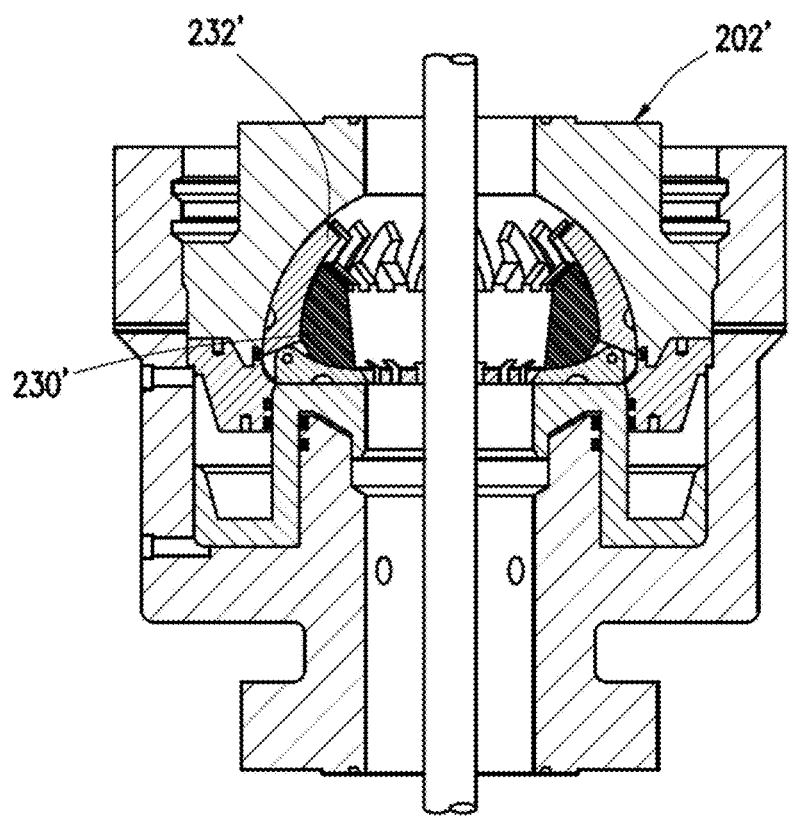
FIG. 13B is a cross-sectional view of an annular BOP with an annular BOP seal.

FIGS. 13A and 13B depict example closing mechanisms that may be used to seal the passage 225 in the BOP (FIG. 12). As shown in FIG. 13A, the rams 232 may be ram blocks 231 with seals 230. As shown in FIG. 13B, the BOP 222' may be an annular BOP with fingers 232' and a BOP seals 230' used therewith. The movement of the rams 232,232' may define a variable BOP geometry with a variable flow area defined therein that changes as the rams/fingers 232/232' move between an unsealed retracted and a sealed position about tubular 118.

Figure 14A:
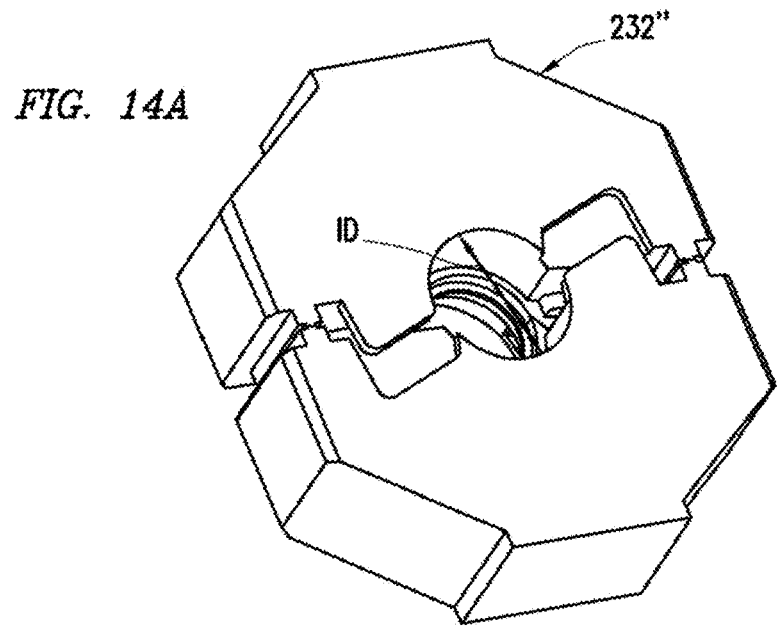
FIGS. 14A-14F are various views of the BOP rams in various positions.
Figure 14B:
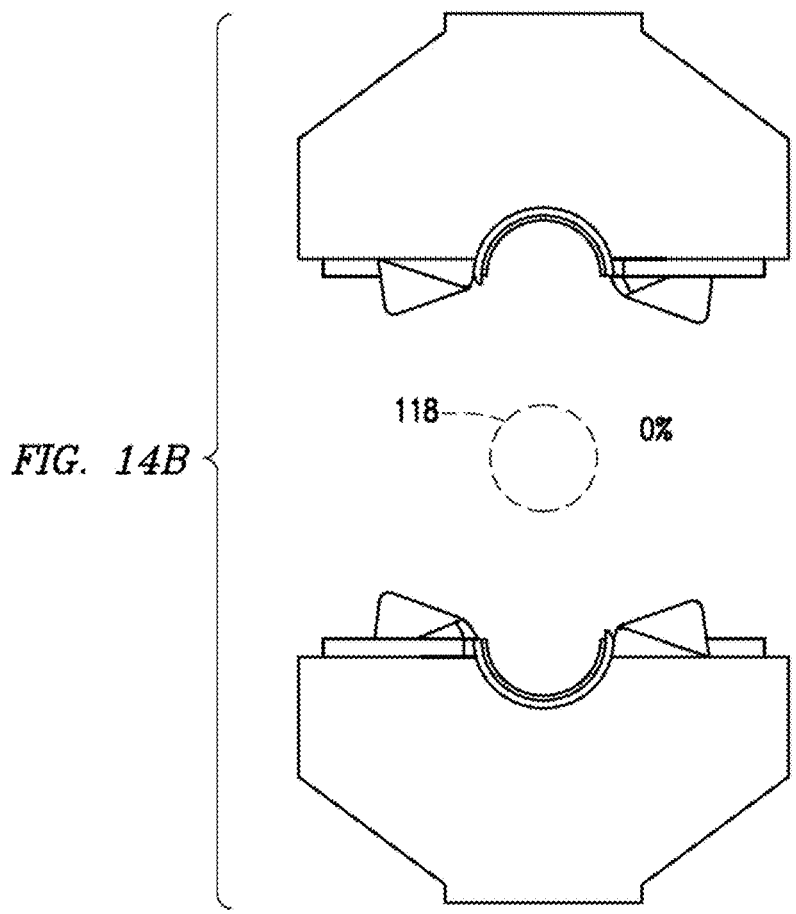
Figure 14C:
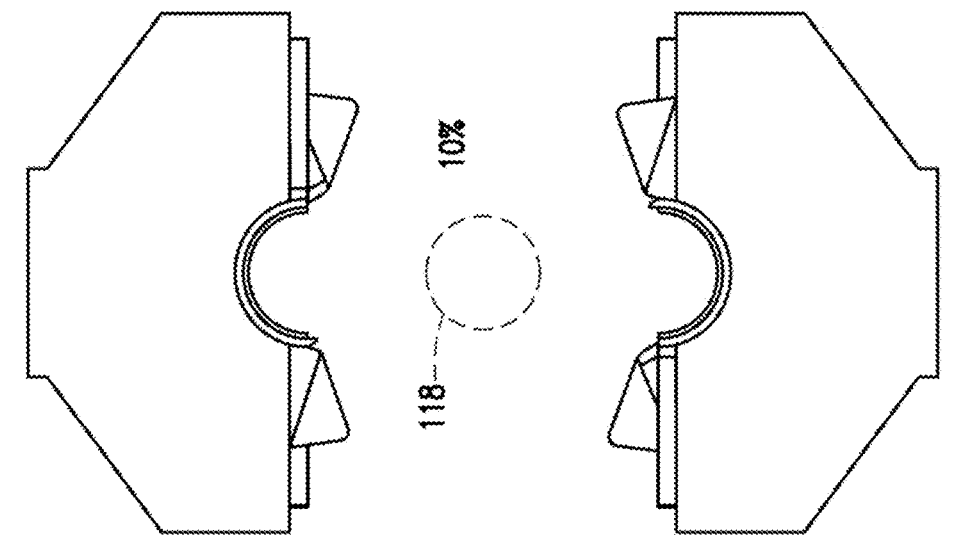
Figure 14D:
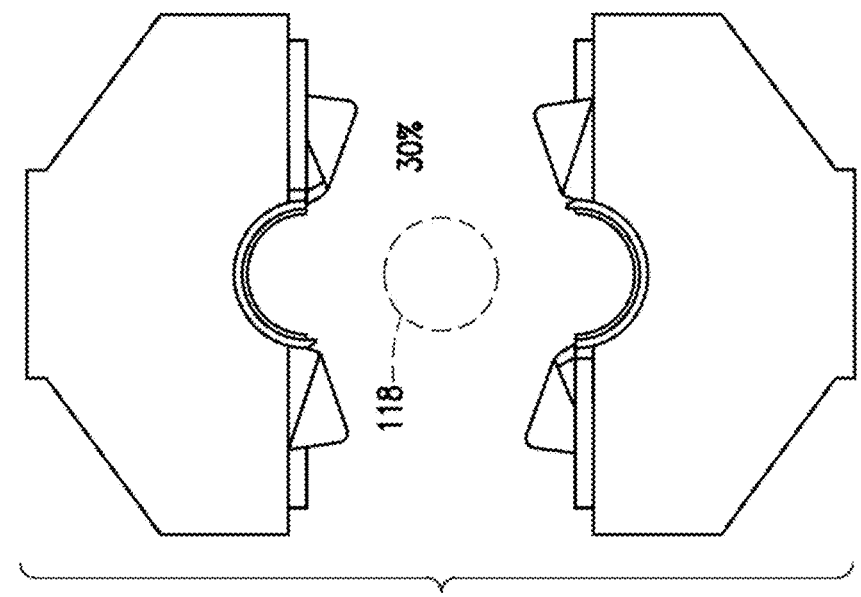
Figure 14F:
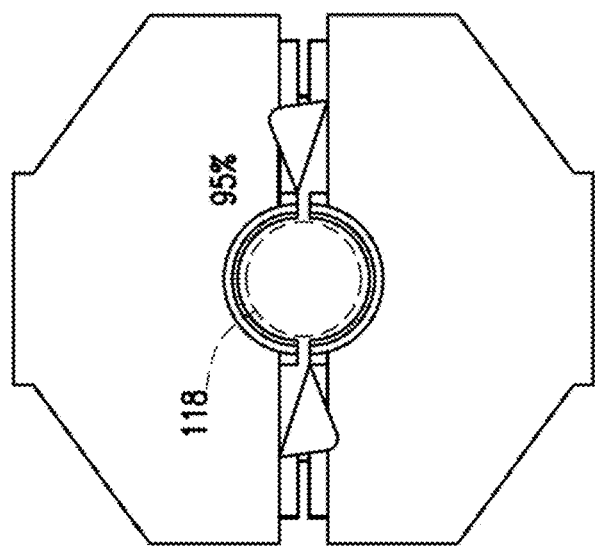
Figure 14E:
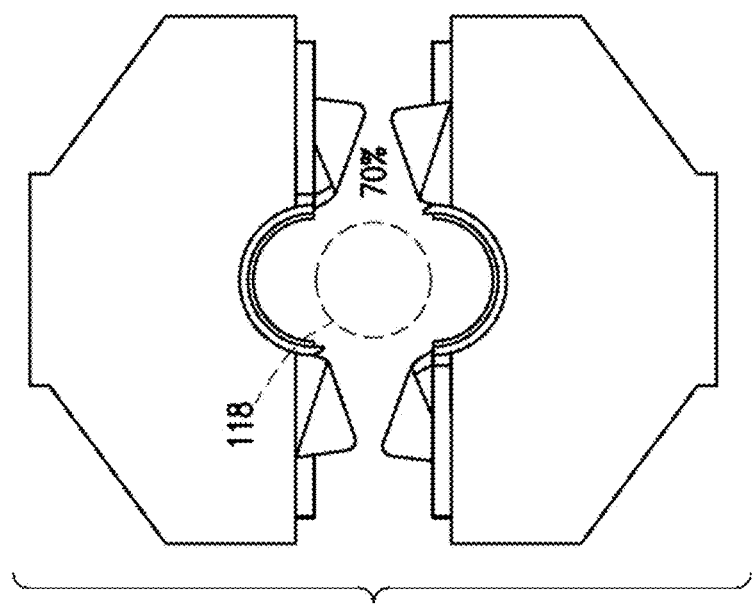

FIGS. 14A-14F show another example BOP ram 232" in various positions. FIG. 14A shows a perspective view of the BOP rams 232". FIGS. 14B-14F show the BOP rams 232" in various positions, including 0% (no rubber exposed), 10% (part of rubber exposed), 30% (all of rubber exposed), 70%, and 95% closure position, respectively. The rams 232" are movable between the unsealed position as in FIG. 14B and the sealed position of FIG. 14F. The rams 232" may define an inner diameter ID to receive the tubing 118 therein. The rams 232" may also vary the flow area defined in the flow passage 225 by extending into a portion of the passage 225 as the rams move to the extended position.

FIGS. 15A-15D are schematic diagrams depicting mesh structure of the passage 225 of the BOP 222. As shown by these figures, the shape of the flow area defined through the passage 225 varies. FIG. 15A shows the passage 225 with the rams 232 in the retracted position. FIG. 15B shows the rams 232 in an intermediate position. FIG. 15C shows the passage 225 with the rams 232 in the extended position. FIG. 15D is a cross-sectional view of the structure of the passage 225 of FIG. 15C. As indicated by these figures, the geometry of the passage varies with a position of the rams 232.

The passage 225 may have various dimensions defined by various features, such as a diameter Dt of the tubing (e.g., about 5.5 inches (13.97 cm)) positioned in the passage, an outer diameter ODp of the passage (e.g., about 18.75 inches (47.62 cm)), a length Lp of the passage (e.g., about 60 inches (152.4 cm)), and a variable ram region Rr defined about the movable rams 232. The structure of the passage may be based on known measurements and/or defined as a mesh using simulations as described further herein.

The configuration of the BOP 222, 222' and its components may be used to define geometry of the specific application. This geometry may affect the flow of fluid through the BOP 222,222'. For example, dimensions of the passage 225 may vary as the rams 232/fingers 232' move between a retracted and a sealed position. The BOP parameters, may affect flow through the passage 225 and may result erosion to the seals 230, 230'. The selected BOP parameters may be simulated and/or tested to determine performance of the BOP, such as erosion of the BOP seals.

2. Fluid Parameters

The passing fluid 1107 may involve obtaining fluid parameters of the fluid passing through the BOP. The fluid may be, for example, a mud (e.g., 995 kg/m3, 0.012 Pa-s) with a pressure differential across the rams of about 1500 psi/10,000 psi, a density of about 8.6-13 ppg or even higher depending on pressure coming from the well, a specific gravity of about 12 cp, a temperature of about 300 F, etc. The fluid may have particles with various configurations, such as a material composition (e.g., barite, cement, water, lead, limestone, salt, etc.), a particle diameter of about 100 μm, a particle density of about 4300 kg/m3, a particle volume fraction of about 5%, etc.

Figure 16:
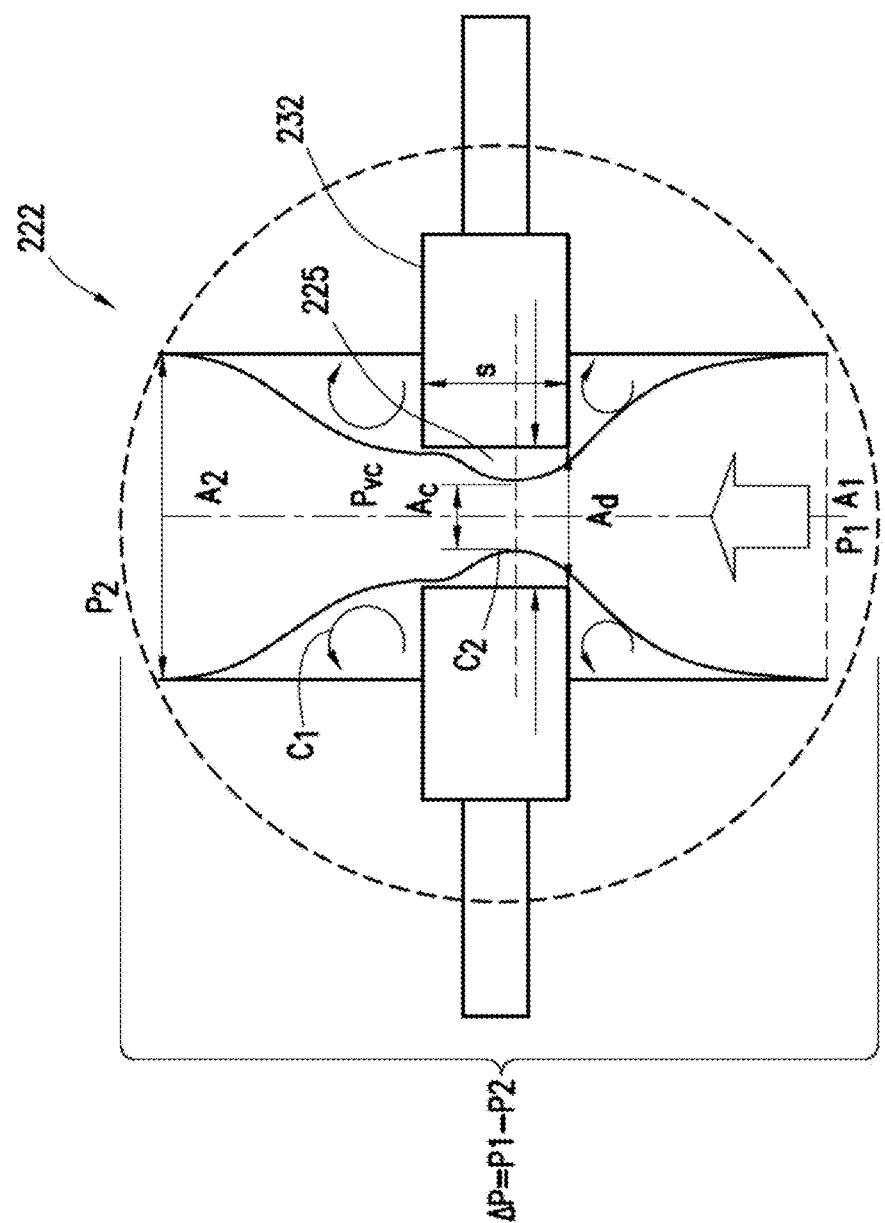
FIG. 16 is a schematic diagram depicting flow through the passage with the BOP rams extending therein.

The fluid passing through the BOP 222 may be subject to various conditions that affect its fluid dynamics. FIGS. 16 and 17A-17F show example effects of fluid dynamics, such as choking and cavitation in the BOP. FIG. 16 is a schematic diagram of a portion 16 of the BOP 222 of FIG. 12 depicting flow through passage 225. FIGS. 17A-F include graphs 17A-C and corresponding schematic diagrams 17D-F. FIGS. 17A-C are graphs of pressure versus flow rate of fluid flowing through a passage (e.g., passage 225) with a vena contracta (Vc) therein. FIGS. 17D-F are diagraphs depicting flow through the vena contracta and resulting effects at the various pressures.

As shown in FIG. 16, the fluid passing through the BOP 222 flows across a vena contracta Vc having a thickness S, a diameter d, and an area Ad. A variable area Ac (Ac') is defined within the area Ad as the area of the restricted flow stream through the vena contracta. The BOP may be subject to a pressure P1 at entry into the passage 225, a pressure Pvc at the vena contracta, and a different pressure at P2 leaving the BOP, resulting in a pressure differential of ΔP=P1−P2. The flow of fluid may vary from an initial flow area A1 at entry, to an area Ad of the orifice of the BOP, to an area of the restricted flow stream Ac exiting the vena contracta, to an area A2 in the passage 225 beyond the BOP.

FIGS. 16 and 17 A-F show various scenarios that may occur on the BOP. The fluid passing through the BOP may be subject to high pressure, cavitation C1, choking C2, and/or flashing. When passing through the vena contracta Vc, the fluid may develop into three different scenarios as shown in FIGS. 17A-C. These figures are graphs 1700a-c and corresponding flow diagrams 1700d-f depicting a pressure profile in a restriction region without choking, with choking C2, and with flashing F, respectively.

In the first scenario of FIG. 17A, the static pressure decreases to a minimum at the location of maximum velocity, but still higher than the vaporization pressure Vp of the fluid. The flow fits into the non-choked flow zone and the fluid maintains liquid phase through the flow stream. As shown by this scenario, cavitation may occur in empty spaces or voids within the BOP that are created as a liquid passing through the BOP is subjected to rapid changes of pressure as indicated by the arrows.

If the static pressure P1 at the vena contracta Vc drops below the vaporization pressure Pv, fluid bubbles form and occupy larger room of the flow than fluid. Additional lowering of the downstream pressure may cause more volume to be occupied in the vena contracta Vc and, as a result, the flow-rate may not increase. This in turn, represents the second scenario of FIG. 17B, which is known as choked flow with ΔP greater than ΔP_r. Choking may occur as a flowing fluid passes through the vena contracta Vc, such as the BOP rams 232 extending into passage 225. Such choking results in an increase in fluid velocity at the vena contracta Vc.

If the downstream pressure of the device continues to decrease to less than the vapor pressure of the fluid, instead of collapsing, the bubbles become larger and the fluid transition from a liquid with bubbles into a vapor with liquid droplets as shown in FIG. 17C. This process is called flashing which has a damage mechanism that is different from the cavitation, but similar to sand erosion effect. The liquid droplets in the downstream can reach such a high velocity that materials (e.g., elastomer or steel) could be blasted away.

As demonstrated by FIGS. 16 and 17A-17F, during operation, flow through the BOP may have an impact on BOP operation resulting in effects, such as cavitation and/or choking. For example, as the BOP rams converge, the rams may define the vena contracta Vc in the passage 225 between the BOP rams 232 as indicated by the arrows. Such a restriction defined by the vena contracta may result in cavitation along portions of the BOP as the fluid passes through the passage, and/or choking thereby generating an increase in flow velocity through the passage. For example, pockets along the BOP, such as locations adjacent portions of the vena contracta may define voids resulting in cavitation as indicated by C1. The increased flow velocity may increase pressure and cause erosion of the BOP seals. To prevent erosion and/or to assure a proper seal, the closing time of the rams may be adjusted.

The effect of the fluid dynamics and/or other fluid effects, such as the cavitation, choking, and flashing, may be determined using, for example, a theoretical and/or a numerical, approach. The selected combined parameters may be evaluated (e.g., by models, simulations, and/or experimental test) to determine fluid performance in a selected BOP and/or erosion of the BOP seals under such conditions.

Theoretical models may be formulated to predict the vapor formation conditions that lead to cavitation. The results may be used as a cornerstone to identify the erosion parameters, such as MERF. Using the theoretical approach, when the fluid stream passes through an orifice (e.g., passage 225) as indicated in FIG. 16, the restricted flow stream of area $A_c$ forms inside or outside the vena contracta defined by the rams 232, depending on the thickness S of the passage. For the case of a thick passage, defined as the dimensionless passage thickness to diameter ratio s/d is greater than 0.5, flow reaches the inner surface of the passage downstream of the vena contracta and touches again with the development of boundary layers. The double expansions may cause loss of mechanical energy and the pressure drop can be written as a function of now area ratio:

$$\sigma = (d/D)^3 \quad (1)$$

where d is the diameter of the flow vena contracta a D is the diameter of the main passage and the contraction coefficient:

$$\sigma_c = A_c/A\sigma \quad (2)$$

where A is the flow area (A1 in FIG. 16) and $A_c$ is the area of the area of the vena contracta. The pressure drop $\Delta P_{sp}$ may then be written as $$\Delta P_{sp} = \frac{\rho V^2}{2}\left[\left(\frac{1}{\sigma \sigma_e}\right)^2 - 1 - \frac{2}{\sigma^2}\left(\frac{1}{\sigma_e}\right) - 2\left(\frac{1}{\sigma} - 1\right)\right] \quad (3)$$

where ρ fluid density and V is the mean velocity.

The local pressure drop $\Delta P_{sp}$ is also a function of a passage discharge coefficient:

$$\Delta P_{sp} = \frac{\rho V^2}{2}\left[\left(\frac{1}{\sigma}\right)^2 - 1\right]\frac{1}{C_d^2} \quad (4)$$

here Cd is the coefficient of discharge. By combining Equations (1) and (2) the contraction coefficient can be expressed as:

$$\sigma_c = \frac{1}{1 + \sqrt{[(1-\sigma^2)/C_d^2] - 1 + 2\sigma - \sigma^2}} \quad (5)$$

The contraction coefficient can be expressed as a function of the flow area ratio as:

$$\sigma_c = \frac{1}{[0.639(1-\sigma)^{0.5} + 1]} \quad (6)$$

from which the passage discharge coefficient can be calculated for a thick passage as a theoretical model. The maximum flow-rate through the passage may be expressed as:

$$Q_{max} = C_d A (2\Delta P_{max}/\rho)^{0.5} \quad (7)$$

Δmax is the maximum allowable sizing pressure drop and can be calculated as:

$$\Delta P_{max} = F_L^2(P_1 - F_F P_V) \quad (8)$$

where Pv is vapor pressure of the fluid, $F_L$ is the rated liquid pressure recovery factor and $F_F$ is the liquid critical pressure ratio factor. Both of these factors dimensionless and may be expressed as:

$$F_L = \sqrt{\frac{P_1 - P_2}{P_1 - P_{vc}}} \quad (9)$$

$$F_F = 0.96 - 0.28\sqrt{\frac{P_v}{P_c}} \quad (10)$$

where Pc is the absolute thermodynamic critical pressure.

For non-choked flow as $\Delta P < \Delta P_{max}$, the flow rate through the passage can be expressed as a function of ΔP as:

$$Q = C_d A (2\Delta P/\rho)^{0.5} \quad (11)$$

Based on the above equations, the maximum differential pressure for cavitation and choked flow condition can be determined by calculating Ac using Equation (4) to determine the following:

$$\frac{A_c}{A_d} = \left[0.639\left(1 - \left(\frac{d}{D}\right)^2\right)^{0.5}\right]^{-1} \quad (12)$$

and then calculating the flow velocity within the vena contracta, Uvc, using the following continuity equation:

$$A_1 u_1 = A_d u_d = A_c u_{vc} \quad (13)$$

where u1 is the flow rate at A1, ud is the flow rate at Ad, and uvc is the flow rate at Ac (FIG. 16). This continuity equation can then be used to calculate Pvc using the following Bernoulli equation:

$$P_1 + \frac{1}{2}\rho u_1^2 = P_{vc} + \frac{1}{2}\rho u_{vc}^2 \quad (14)$$

and generating the liquid critical pressure ratio factor $F_F$ and the rated liquid pressure recovery factor $F_L$ using equations (9) and (10) as follows:

$$F_F = 0.96 - 0.28\sqrt{\frac{P_V}{P_C}} \quad (15)$$

$$F_L = \sqrt{\frac{P_1 - P_2}{P_1 - P_{VC}}} \quad (16)$$

The maximum pressure differential in the presence of cavitation and choking may then be determined from Equation (8) as follows:

$$\Delta P \max = F_L^2 (P_1 - F_F P_V) \quad (17).$$

Under the numerical approach, the flow with cavitation may be simulated using numerical software, such as ANSYS FLUENT 15.0. This may use a control volume-based technique to convert governing equations. Simulations may be performed using computational fluid dynamics ("CFD") simulations to determine the effects of fluid on the BOP. Such simulations may involve performing fluid simulations using, for example, various governing equations integrated at control volumes with the discretized equations conserving each quantity on a control volume basis.

The governing equations may include various equations relating to BOP and/or fluid parameters, such as a steady state, single phase liquid flow, cavitation, thermodynamics, kinetics, liquid-vapor, conservation of mass, momentum, condensation, evaporation, turbulence, wall boundary, velocity coupling, and/or other equations. In an example, the simulation may involve solving the following Navier Stokes equation:

$$\frac{\partial u}{\partial t} + (u \cdot \nabla)u - v\nabla^2 u = -\nabla w + g. \quad (18)$$

where du/dt is the derivative of the flow velocity with respect to time, u is the flow velocity, v is the kinematic viscosity, w is the thermodynamic work per unit mass, and g is body accelerations such as gravity acting on the fluid. Mesh and/or grids, such as the meshes depicted in FIGS. 15A-D may be generated by the simulation.

CFD may be employed to gain an understanding of the choked flow by solving the fill-scale cavitation problem. The critical pressure ratio may be a key parameter in determining the cavitation and choking conditions. To corroborate the analytical and numerical results, the field tests may be conducted on an experimental setup using high-pressure components and instrumentation with various upstream and downstream pressures (e.g., up to about 5,000 psi or more).

The CFD simulations may be performed to take into consideration the effects of fluid dynamics, such as cavitation and/or choking. FIGS. 18A-18D are phase contour plots 1800a-d depicting simulations of flow through the vena contracta of FIG. 16 having a pressure differential ΔP=P1−P2 applied thereto.

Figure 18D:
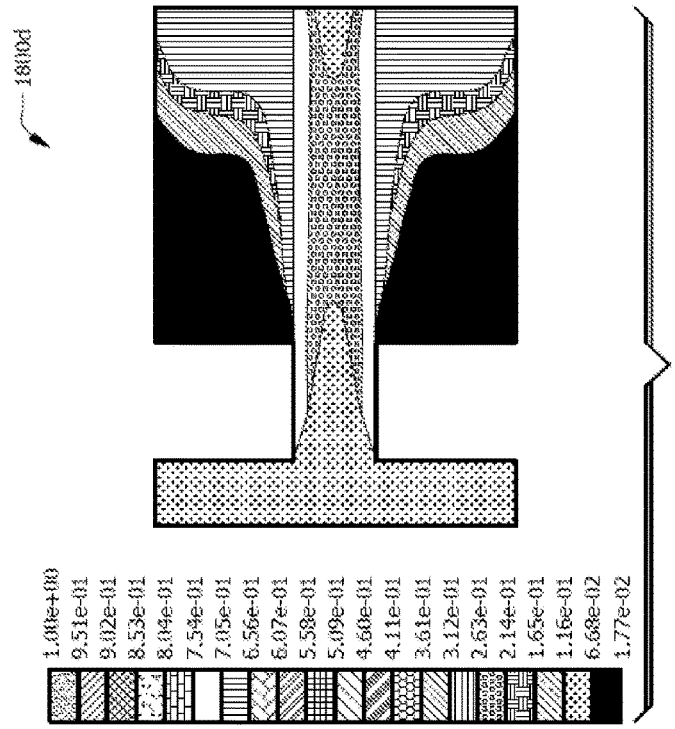
Figure 18C:
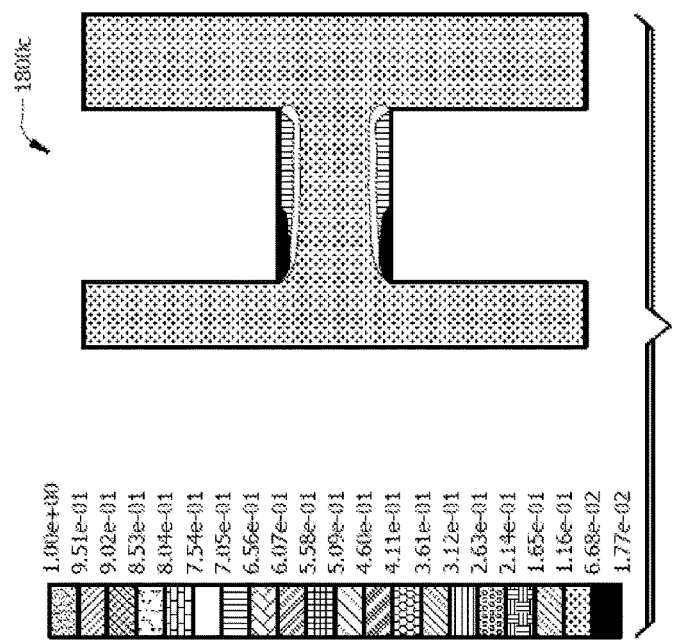

FIGS. 18A-18D show CFD simulations of choked flow at a pressure ratio of 0.4, 0.25, 0.125, and 0.004, respectively. As shown by these simulations, vapor may form at different pressure ratios across the vena contracta under cavitation conditions as indicated by the dark shaded regions. As shown in FIG. 18A, bubbles may form at an entrance of the vena contracta. As shown in FIG. 18B, a vapor region may extend along more than half of an area adjacent the vena contracta. As shown in FIG. 18C, the entire area adjacent the vena contracta may be covered by vapor. As shown in FIG. 18D, the vapor may extend along the vena contracta and a portion of the BOP in an amount that is extensive enough to generate noise and vibration.

A comprehensive study of cavitation phenomenon may be conducted over a wide range of operating conditions in terms of upstream pressure and downstream/upstream pressure ratio and using theoretical and/or CFD approaches. The theoretical cavitation model may be validated for the cavitation flow passing through a passage and provide a rapid, yet accurate prediction on the cavitation status and flow condition. The CFD simulation may result in more precise results, thereby tailoring the testing to a narrow window in order to dramatically reduce time and cost.

The CFD may also be used to determine the erosion rate in 3D for a variable BOP at different closure percentages. During drilling operations, variable diameter pipes are used for a variety of reasons. Drill pipe diameters range from 2⅜" to 7⅝". As such your ram seals have historically been tailored to fit those dimensions. Variable bore rams (VBR's) are ram blocks that are specifically designed to mechanically and hydraulically seal around widely varying pipe dimensions. It may be shown that 3D CFD erosion analysis on the VBR exhibits flow rate of 13,364 gpm with integrated erosion rate of 334 gram/sec for 98% closure percentage. This flow-rate may be about 28% more than compared to a similar flow when subject to cavitation and choking effect.

Furthermore, steady state and transient 3D CFD simulations may be performed on the BOP using dynamic mesh to mimic the closing process of the BOP ram. Implementation of the cavitation model in the simulation may reduce the volumetric flow-rate about 20%/o compared to a similar case with non-cavitation model. CFD investigations may also be performed on the BOP at various temperature flow and volumetric flow rates at ambient temperature for comparison.

Various approaches may be used to determine fluid effects on the BOP. These approaches may be used to characterize fluid, even at higher pressures which may involve cavitation and choking conditions. Such techniques may be performed to take into consideration fluid effects, such as vapor, on high-pressure applications at pressures of up to 5,000 psi or more. The theoretical approach may be formulated to predict the vapor formation conditions that lead to cavitation. The CFD approach may be employed to take into consideration the effects of choked flow by solving a fill scale cavitation problem. The selected approaches may then be compared with experimental data using a tester (see, e.g., FIG. 5 or 33) to corroborate the results.

Figure 19A:
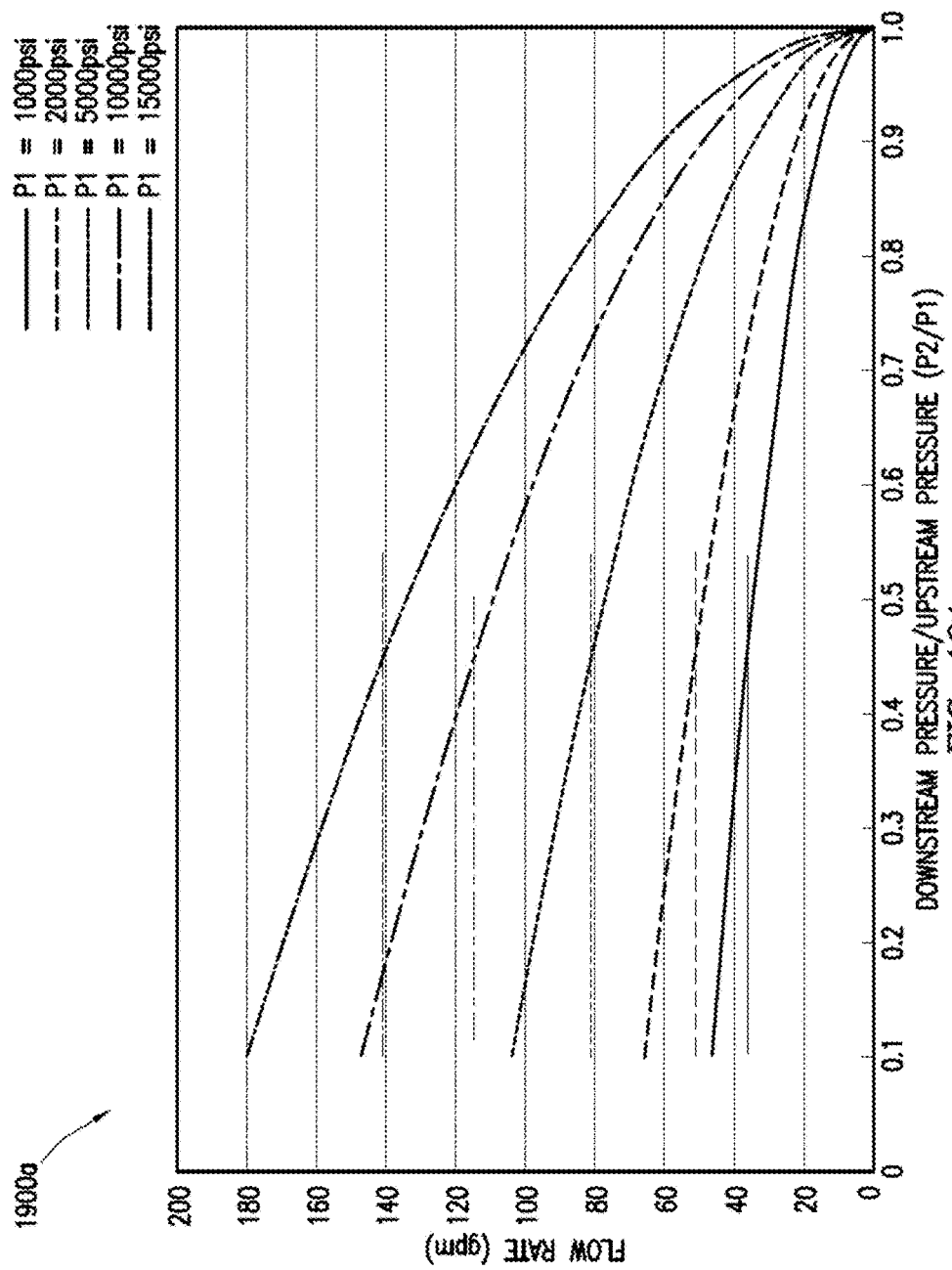
FIGS. 19A-19C are graphs depicting flow rate versus pressure ratio for various pressures within the BOP.
Figure 19B:
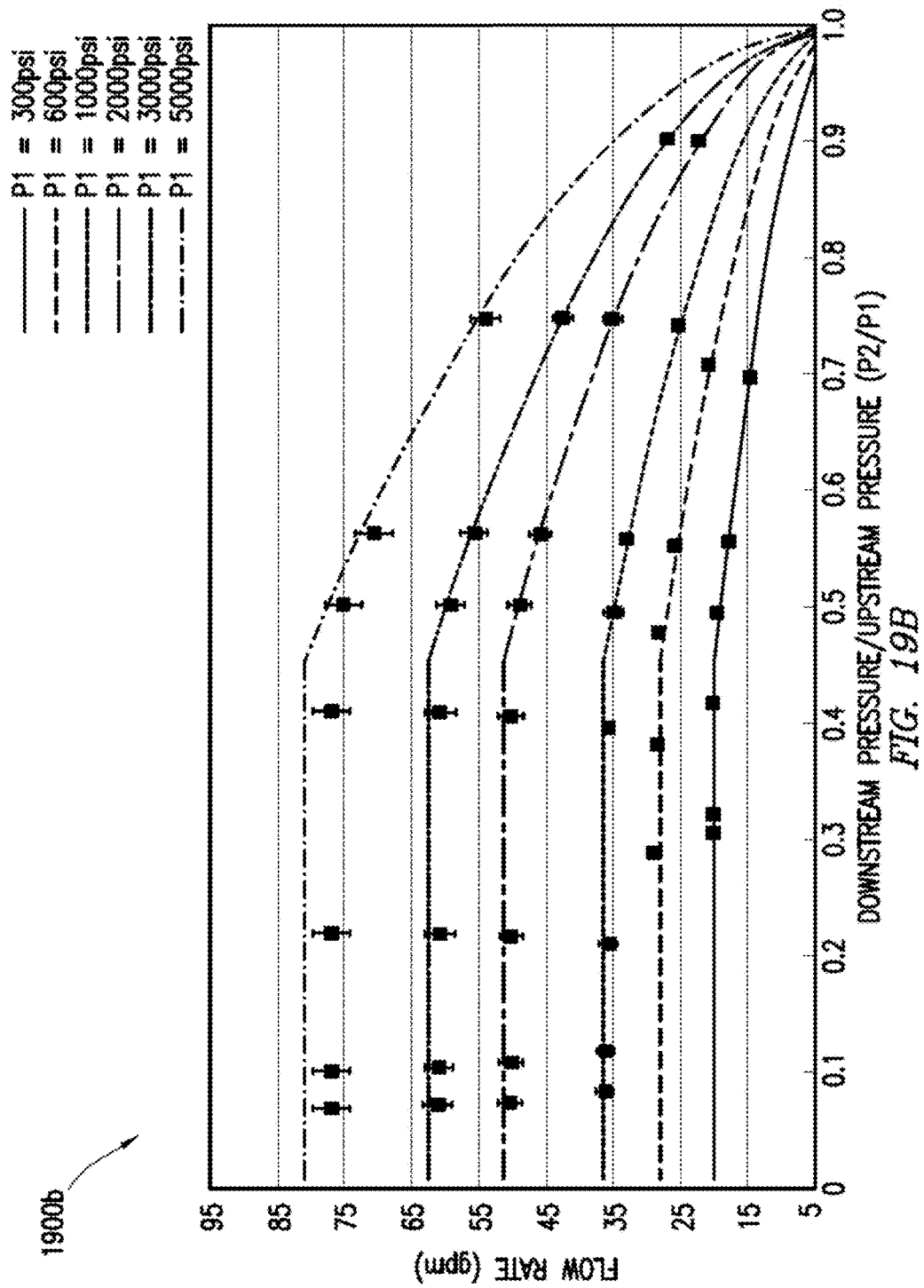
Figure 19C:
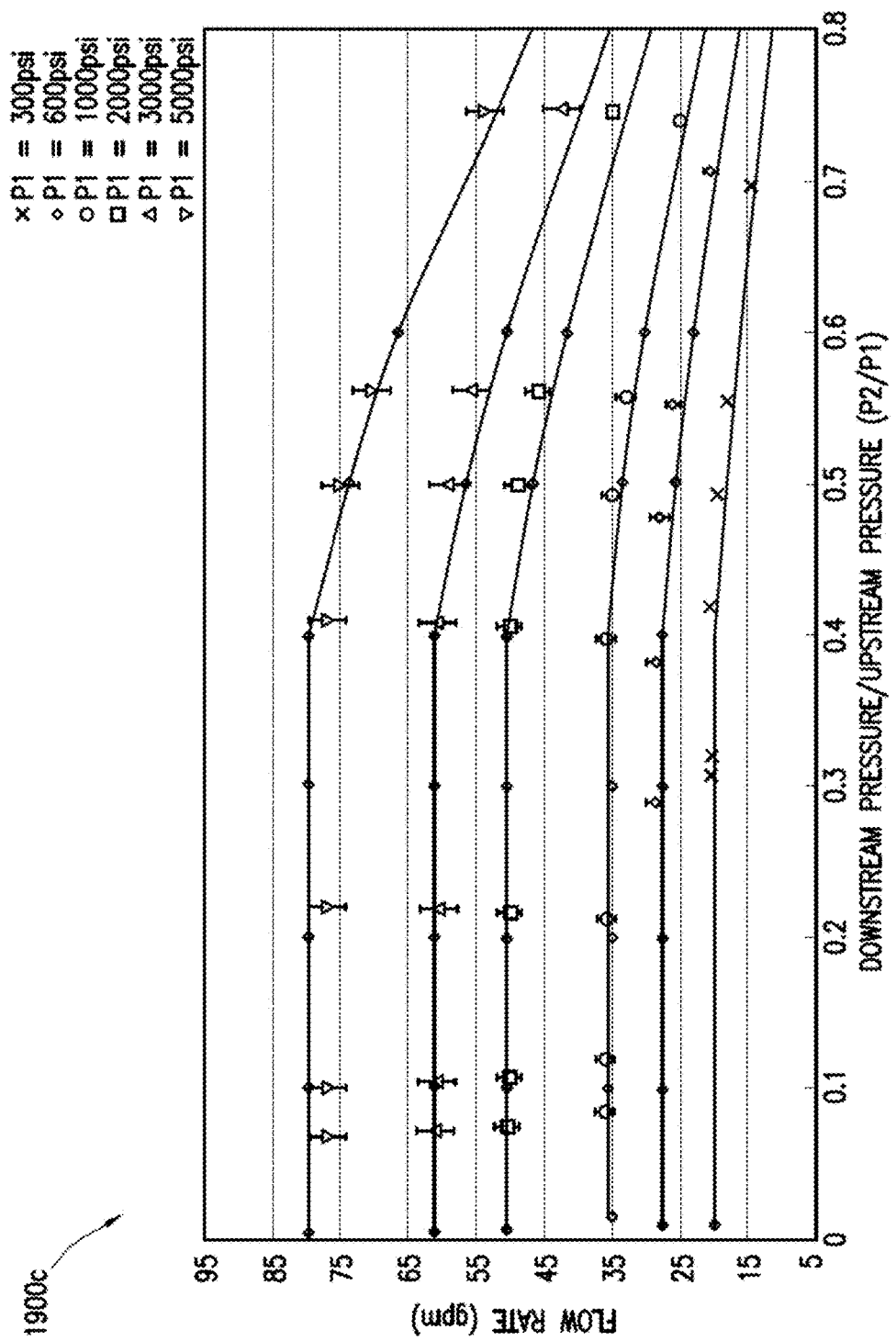

FIGS. 19A-C show comparisons of various the theoretical and CFD approaches with experimental data. FIGS. 19A-C are line graphs 1900a-c depicting flow rate (FR) (y-axis) versus downstream/upstream pressure ratio (P2/P1) across the vena contracta (x-axis) at various upstream pressures P1. As shown by these figures, flow parameters with cavitation and choking phenomena displayed by theoretical and CFD approaches may exhibit agreement with the experimental approach up to a critical pressure ratio of about 0.45. At an increased pressure ratio beyond the critical pressure ratio, differential pressure may have little or no contribution to the volumetric flow-rate increase.

3. Erosion

Figure 20A:
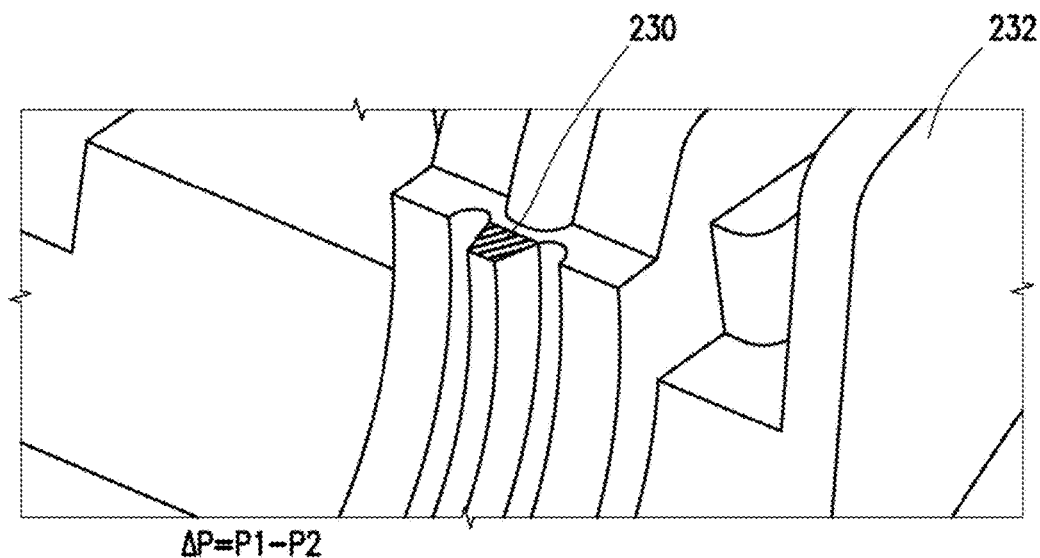
FIGS. 20A-20B are schematic diagrams depicting the BOP seal without and with pressure applied thereto.
Figure 20B:
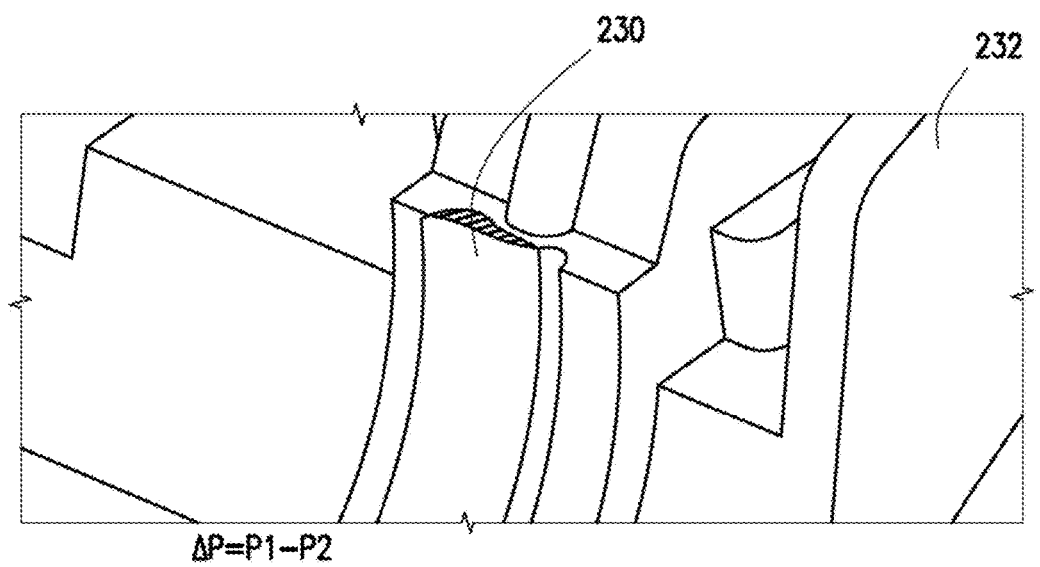

The simulating 1109 may be performed to determine erosion resulting from the effects of the BOP parameters and the fluid parameters. FIGS. 20A-20B show various views of a BOP seal 230 subject to erosion. In the example shown by these figures, the BOP seal is a ram seal of a BOP ram, such as the BOP seal 230 of the ram 232 of FIGS. 2, 3, 12, 13A. The ram 232 may be used in a variable bore ram movable about the passage 225 of the BOP as shown, for example, in FIGS. 14A-14F.

The BOP seal 230 may be made of a non-rigid material, such as an elastomer (rubber) material, that deforms when subject to pressure. The selected BOP seal may have various properties, such as Young's modulus, Poisson's ratio, elastic modulus, density, shear modulus, and/or other mechanical properties. As demonstrated by FIG. 20B, the BOP seal 230 may be subject to pressures in the BOP. The differential pressure ΔP=P1-P2 may be applied to the BOP seal as shown in FIG. 20B. The pressure may increase to a higher pressure of ΔP=P1-P2'. The increased pressure may be a high pressure of about 5 kpsi or greater.

Figure 21A:
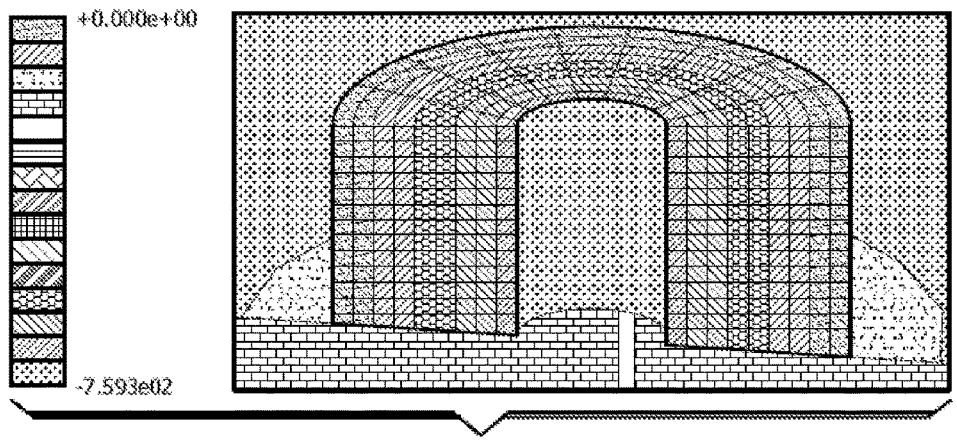
FIGS. 21A-21C are 3D plots depicting the BOP seal with various levels of pressure applied thereto.
Figure 21B:
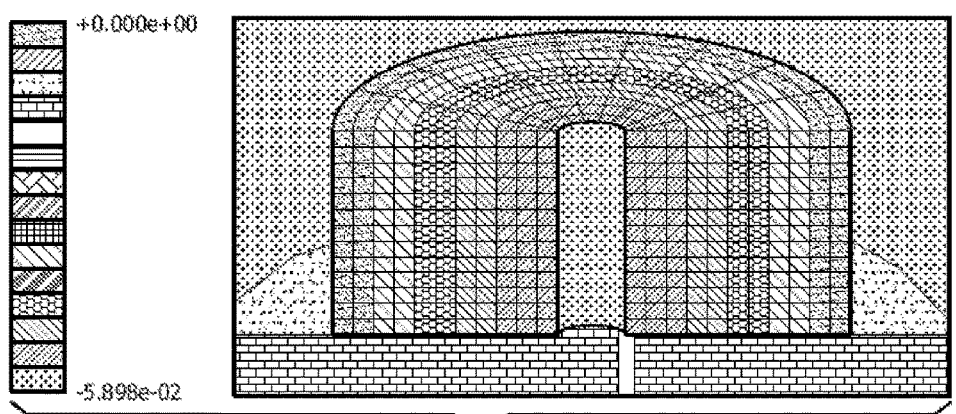
Figure 21C:
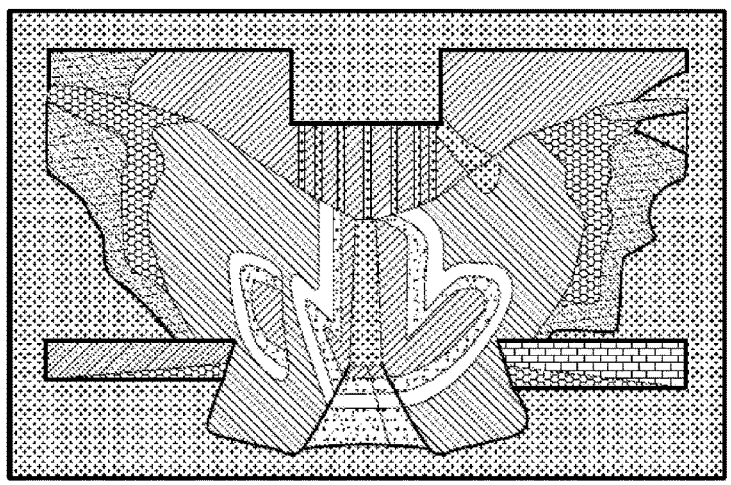

FIGS. 21A-21C show the deformation of the rubber BOP seal 230 when subjected to various upstream pressures of 0, 300, and 3650 psi, respectively. As shown by these figures, an inner diameter of the rubber BOP seal may deform such that it interferes with the flow through passage 225. Such movement of the BOP seal into the passage 225 may change the flow parameters and thereby the erosion rate of the rubber.

Figure 22A:
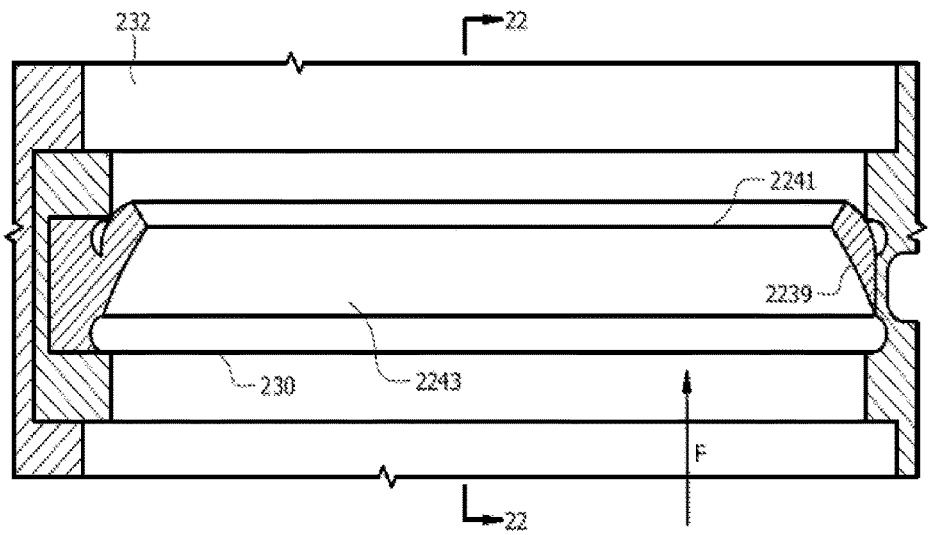
Figure 22B:
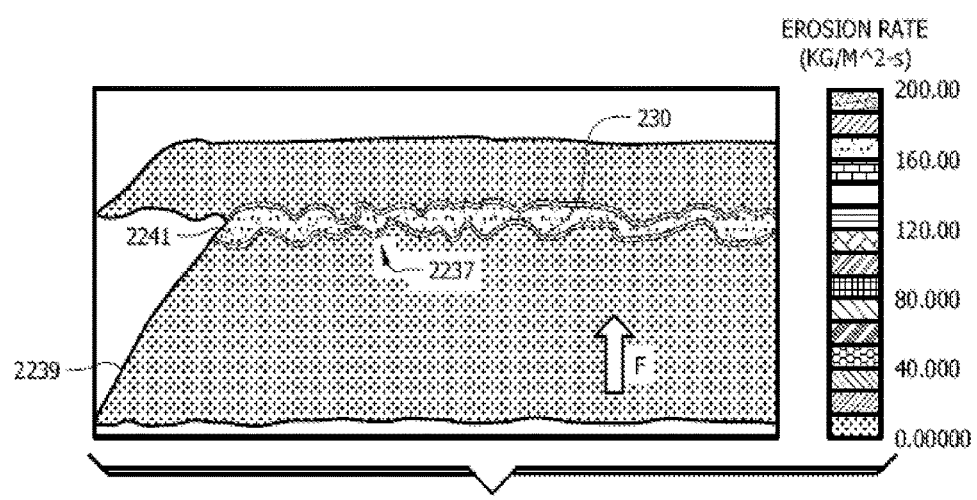

As demonstrated by FIGS. 22A-22E, surfaces of the BOP seal 230 may be subject to erosion due to flow of fluid. FIG. 22A shows a side view of a portion of the ram 232 with the BOP seal 230 subject to fluid flow. FIG. 22B is a cross-sectional view of the BOP seal 230 taken along line 22-22. FIGS. 22C-D are a contour plots showing erosion of the BOP seal and a portion thereof, respectively. FIG. 22E is a side view of a portion of the seal before and after erosion.

As shown by these views, erosion 2237 may eat away portions of the BOP seal 230. The BOP seal 230 is shown as having an angled geometry with an indented front surface 2243 defining a pocket 2239 with an indentation 2241 therein. The erosion 2237 forms along the indentation 2241. FIGS. 22C-D show the rubber deformation with the material specification of FIG. 1 at a pressure of 3650 psi. This is the maximum pressure, which converges with the material specification.

Figure 23A:
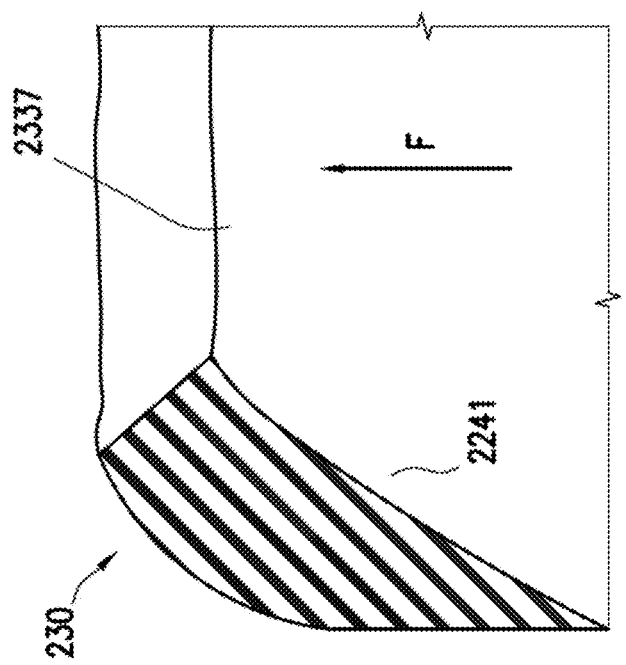
FIGS. 23A-23B are perspective views of a cross-sectional portion of the BOP seal before and after erosion.
Figure 23B:
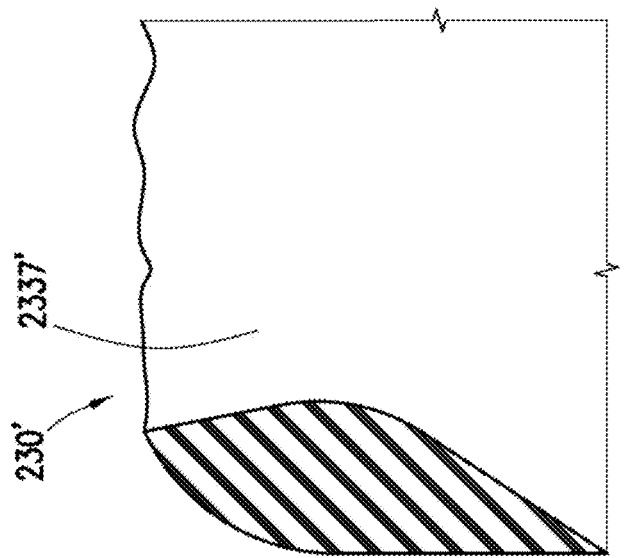

FIGS. 23A-23B shows a detailed view of a portion of the BOP seal 230 before and after erosion. FIG. 23B shows the BOP seal 230 with erosion over a time step (time n to time n+1). As shown by FIG. 23B, a portion of the BOP seal 230 along the area of erosion 2337 at the indentation 2241 has been removed, leaving area 2337'. FIGS. 24A-F show erosion of the BOP seal 230 at pressures 0, 500, 1000, 3000, 7500, and 15000, respectively. As demonstrated by these images, increased pressure can cause erosion of the BOP seal over time and/or at higher pressures.

Various numerical (e.g., finite element analysis) models, such as Mooney-Rivlin, Neo-Hookian, 2nd-Order Polynomial, and Marlow, may be used in evaluating the deformation of the rubber BOP seal 230. Table 1 shows example configurations of a BOP seal for each of these models.

TABLE 1

Rubber FEA and erosion analysis

| | Inner Diameter of Rubber (in) | Deformed Diameter of Rubber (in) | Flow Rate (gpm) | Max. Erosion rate (in/hr) |
|---|---|---|---|---|
| Mooney-Rivlin | ¼ | 0.144 | 9.32 | 0.04 |
| | ⅜ | 0.225 | 23.0 | 0.021 |
| Neo-Hookin | ¼ | 0.144 | 9.32 | 0.04 |
| | ⅜ | 0.226 | 23.1 | 0.02 |
| 2$^{nd}$ Order Polynomial | ¼ | 0.143 | 9.30 | 0.04 |
| | ⅜ | 0.224 | 22.9 | 0.021 |
| Marlow (Planar) | ¼ | 0.139 | 8.71 | 0.04 |
| | ⅜ | 0.219 | 22.5 | 0.022 |
| Simulated | ¼ | 0.110 | 4.97 | 0.041 |
| | ⅜ | 0.225 | 22.7 | 0.021 |

Table 2 shows that although the flow rate for the ⅜" diameter may be considerably larger than that of the rubber with ¼", the erosion rate for the rubber with ⅜" may be less than (e.g., half) of the erosion rate for the rubber with ¼". This may be due to the higher flow velocity through the deformed constriction of the ¼" rubber. These results may be used in CFD simulations to determine the flow rate and the erosion rate as is described further herein.

Based on the known BOP parameters (e.g., geometry) nd the known fluid parameters (e.g., flow rate and pressure), the erosion of the BOP seal may be simulated. Simulations may involve using various erosion models, such as the following models:

$$E_{VP} = \begin{cases} \frac{mV^2}{P\psi k}\left(\sin(2\alpha) - \frac{6}{k}\sin^2\alpha\right) & \text{for } \tan\alpha \leq \frac{k}{6} \\ \frac{mV^2}{P\psi k}\left(\frac{k\cos^2\alpha}{6}\right) & \text{for } \tan\alpha \geq \frac{k}{6} \end{cases} \quad (19)$$

where V is the velocity impacting a surface at angle α, k is the ratio of vertical to horizontal force components, Ψ is the ratio of depth of contact depth the cut, P is the flow stress of the eroded material and m is the mass of the particles;

Bitter Model:

$$E_{VT} = E_{VD} + E_{VC} \quad (20)$$

$$E_{VD} = \frac{1}{2}\frac{M(V\sin\alpha - V_{el})^2}{\varepsilon_b}$$

$$E_{VC} = \begin{cases} \frac{2MC'(V\sin\alpha - V_{el})^2}{(V\sin\alpha)^{\frac{1}{2}}}\left(V\cos\alpha - \frac{C'(V\sin\alpha - V_{el})^2}{(V\sin\alpha)^{\frac{1}{2}}}x\right) & \text{for } \alpha \geq \alpha_{p0} \\ \frac{\frac{1}{2}M\left(V^2\cos^2\alpha - K_1(V\sin\alpha - V_{el})^{\frac{3}{2}}\right)}{x} & \text{for } \alpha \leq \alpha_{p0} \end{cases}$$

where Evt is the total erosion, Evd is the material lost to plastic deformation, Eve is the material lost to cutting, V is the velocity impacting the surface at angle α, Vel is the threshold velocity, εb is the deformation wear factor, x is a material dependent wear factor obtained experimentally, and C', K1 are constants;

Oka Model:

$$E(\alpha) = g(\alpha)E_{90}, \quad (21)$$

$$g(\alpha) = (\sin\theta)^{n_1}(1 + Hv(1 - \sin\theta))^{n_2}$$

$$E_{90} = K(Hv)^{k_1}\left(\frac{V_p}{V'}\right)^{k_2}\left(\frac{D_p}{D'}\right)^{k_3}$$

where E90 is the erosion damage at the normal angle, $g(\alpha)$ is the ratio of erosion damage at angle $\alpha$, $\theta$ is the particle impact angles. Hv is the Vickor's hardness, Vp in the particle velocity, V' is a reference velocity, Dp is the particle diameter, D' is a reference diameter, and n1, n2, n3, k1, k2, k3 are constants;

Tulsa Model:

$$ER = CB^{-0.59}F_s v_p^n f(\alpha) \quad (22)$$

where C is an empirical constant (e.g. about 1559); n is an empirical constant (e.g., about 1.73); B is the Brinell hardness of the wall material; Fs is the particle shape coefficient, ~0.2 for spherical particles; $v_p$ the particle impact velocity; and $f(\alpha)$ is the particle impact angle function.

Simulations may also be performed using CFD. Examples of CFD erosion simulations may involve 2D and/or 3D simulations. CFD erosion simulations may be performed using numerical software, such as ANSYS FLUENT 15.0. Such simulations may incorporate numerical approaches using, for example, a model relating to abrasive wear by a sharp blade, such as the model of Southern & Thomas for sliding abrasion. Such model may consider models for growth of surface cracks and particle impact expressed as follows:

$$\varepsilon = 2\left(\frac{8}{3\pi}\right)^{(\beta-1)/2} B\sin/\theta(1+\cos\theta)^\beta \rho_p^{(\beta-1)/2} u^{\beta+1} R^{\beta-1} \mu^\beta \rho_r \left(\frac{E}{1-v^2}\right)^{(\beta-1)/2} \quad (23)$$

where $\theta$ is the angle to the horizontal at which cracks grow (typically 15° for natural rubber and styrene-butadiene rubber eroded by silica particles); B and $\beta$ are constants in the equation relating crack growth rate per stress cycle to tearing energy; $\rho p$ is the particle density and $\rho r$ is the rubber density; u is the impact velocity and R is the particle radius; $\mu$ is the coefficient of friction and E is the Young's modulus, $v$ the Poisson ratio and $\alpha$ is the impact angle.

The model may be adjusted for the effects of erosive particle shape using the following equation:

$$R_{erosion} = \sum_{p=1}^{N_{particle}} \frac{\dot{m}_p C(d_p) f(\alpha) u^{b(u)}}{A_{face}} \quad (24)$$

where C(dp) is a function particle diameter, $\alpha$ is the impact angle the particle path with the wall face, $\alpha$ is a function of impact angle, u is the relative particle velocity, b(u) is a function of relative particle velocity, and Aface is the area of the cell face at the wall. These models of Equations 23 and 24 can be converted interchangeably.

Figure 25B:
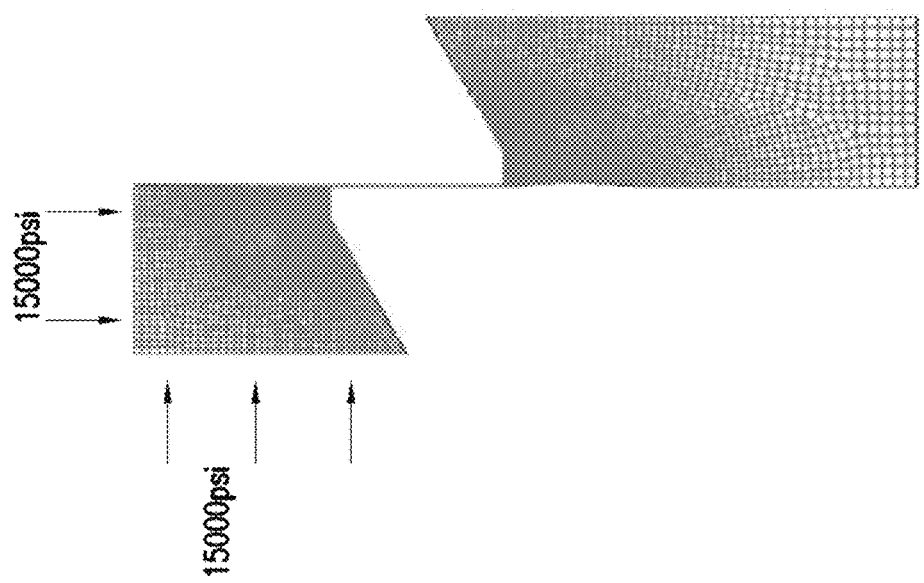
FIGS. 25A-25D are various views of effects of the BOP rams during closing.
Figure 25A:
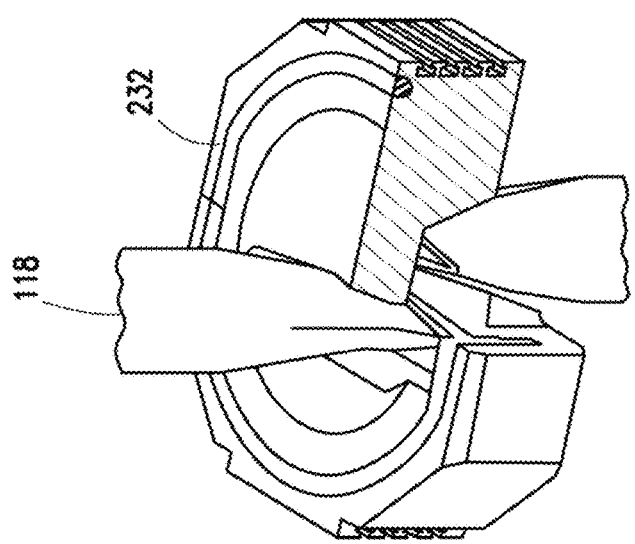
Figure 25C:
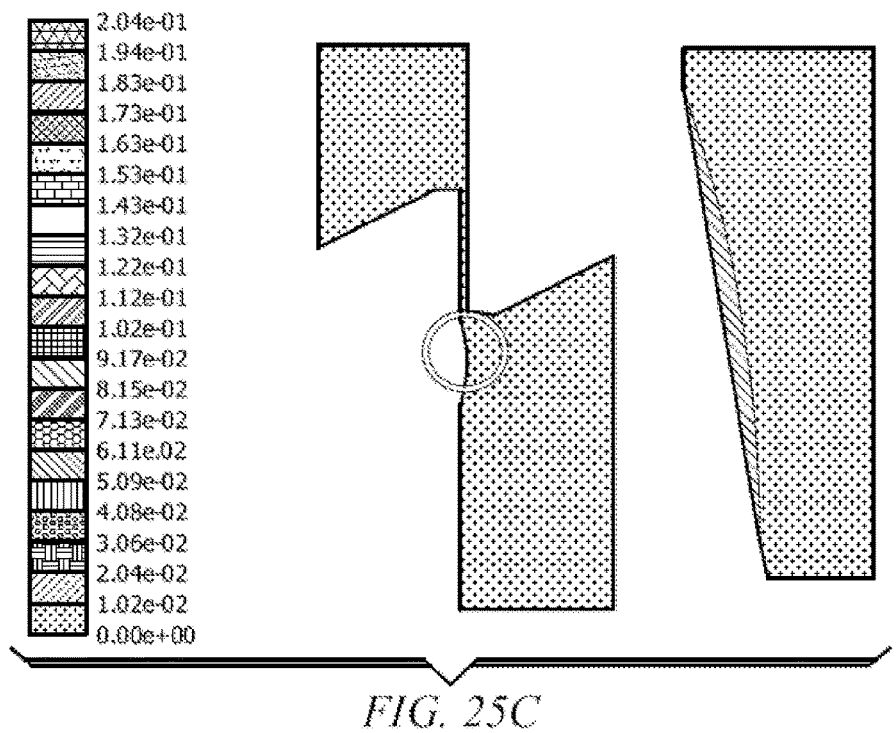
Figure 25D:
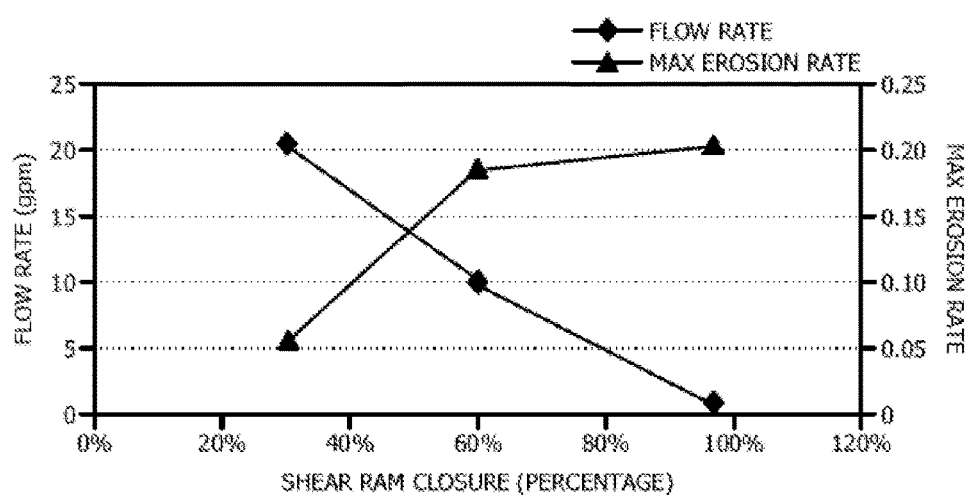

An example 2D simulation is depicted by FIGS. 25A-D. FIGS. 25A-D are various views of a ram 232 sealing about a tubular 118. FIG. 25A is a schematic view showing the sealing of the rams 232 about a tubular 118. FIG. 25B is a 2D representation of the sealing of FIG. 25A. FIG. 25C is a contour plot of the 2D simulation. FIG. 25D is a graph plotting flow rate and mass erosion rate (y-axis) versus ram closure (x-axis).

Erosion simulations may also be provided in 3D and based on various models, such as single phase turbulence, and/or cavitation models. In an example, the effects of turbulent fluctuations of velocities and scalar quantities may described by a turbulence model with a high Reynolds number (e.g., over 1 million), such as a k-ε model shown below, may be, used:

$$\frac{\partial}{\partial t}(\rho_m k) + \nabla \cdot (\rho_m \vec{v_m} k) = \quad (25)$$

$$\nabla \cdot \left(\left(\mu_m + \frac{\mu_{t,m}}{\sigma_k}\right)\nabla k\right) + G_{k,m} - \rho_m \varepsilon + \Pi_{k_{m'}}$$

$$\frac{\partial}{\partial t}(\rho_m \varepsilon) + \nabla \cdot (\rho_m \vec{v_m} \varepsilon) = \quad (26)$$

$$\nabla \cdot \left(\left(\mu_m + \frac{\mu_{t,m}}{\sigma_\varepsilon}\right)\nabla \varepsilon\right) + \frac{\varepsilon}{k}(C_{1\varepsilon}G_{k,m} - C_{2\varepsilon}\rho_m \varepsilon) + \Pi_{\varepsilon_{m'}}$$

where k is kinetic energy, ε is dissipation, u is fluid velocity, μ is viscosity, ρ is density, G is the rate of deformation and C and σ are constants. The k-e model may be used, for example, when phases separate for stratified (or nearly satisfied) multiphase flows, and when the density ratio between phases is close to 1. In such cases, using mixture properties and mixture velocities may be sufficient to capture features of the turbulent flow. Simulations may be used to address conditions, such as cavitation. Examples of cavitation models that may be used are provided in G. Schnerr and J. Sauer, *Physical and Numerical Modeling of Unsteady Cavitation Dynamics*, 4th Int'l Conf. on Multiphase Flow, New Orleans, USA, 2001, the entire contents of which is hereby incorporated by reference herein.

FIGS. 26A-32F depict various example CFD simulations of erosion of the BOP seal as described below:

Example 1—Base CFD Simulation

Figure 26A:
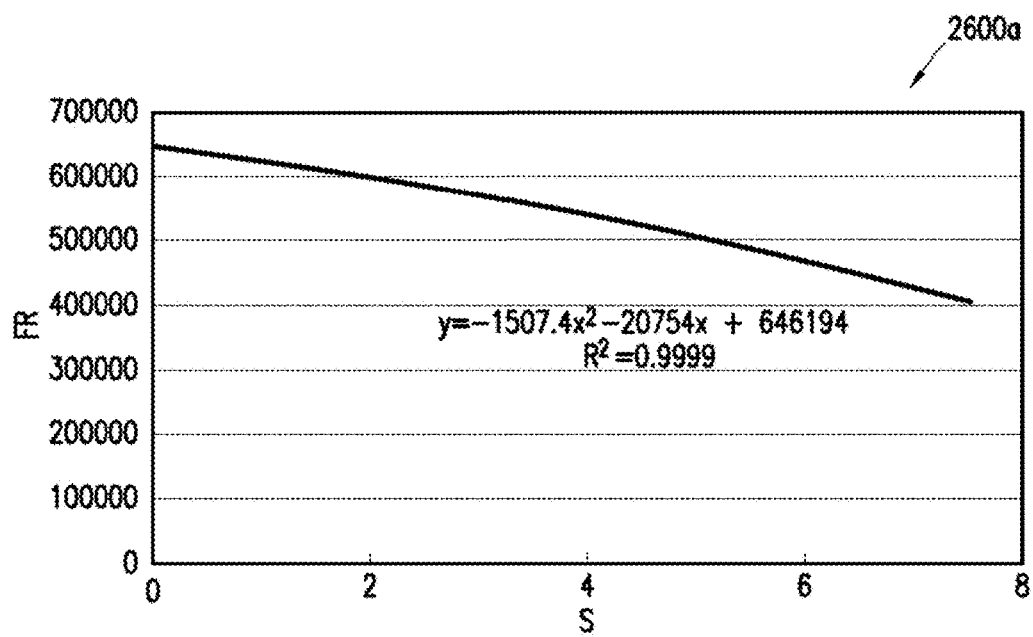
FIGS. 26A-26F are graphs depicting flow rate at various inlet pressures.
Figure 26B:
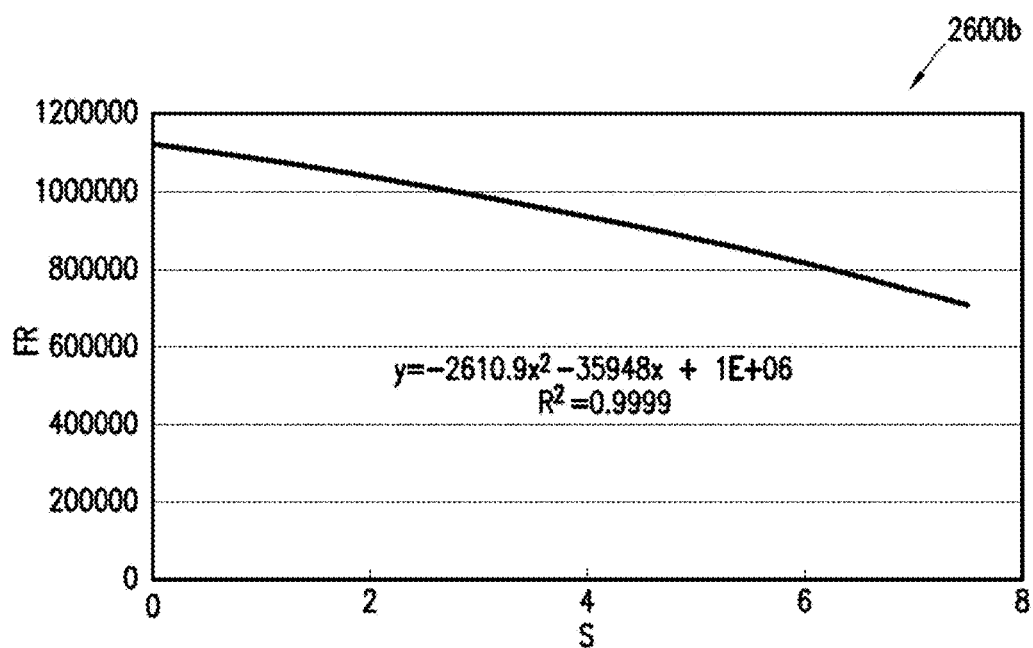
Figure 26C:
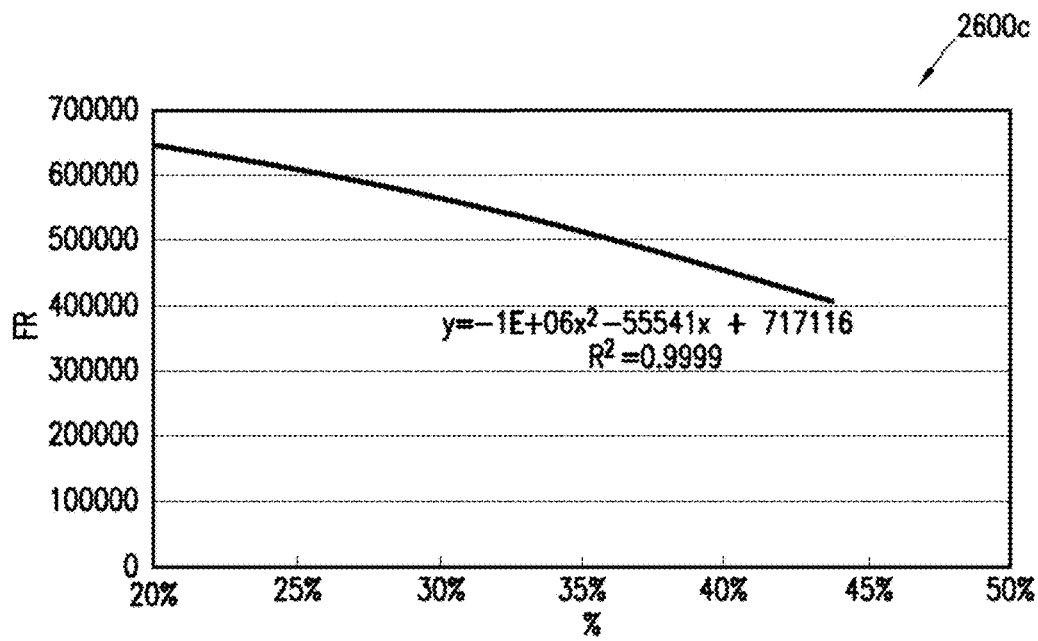
Figure 26D:
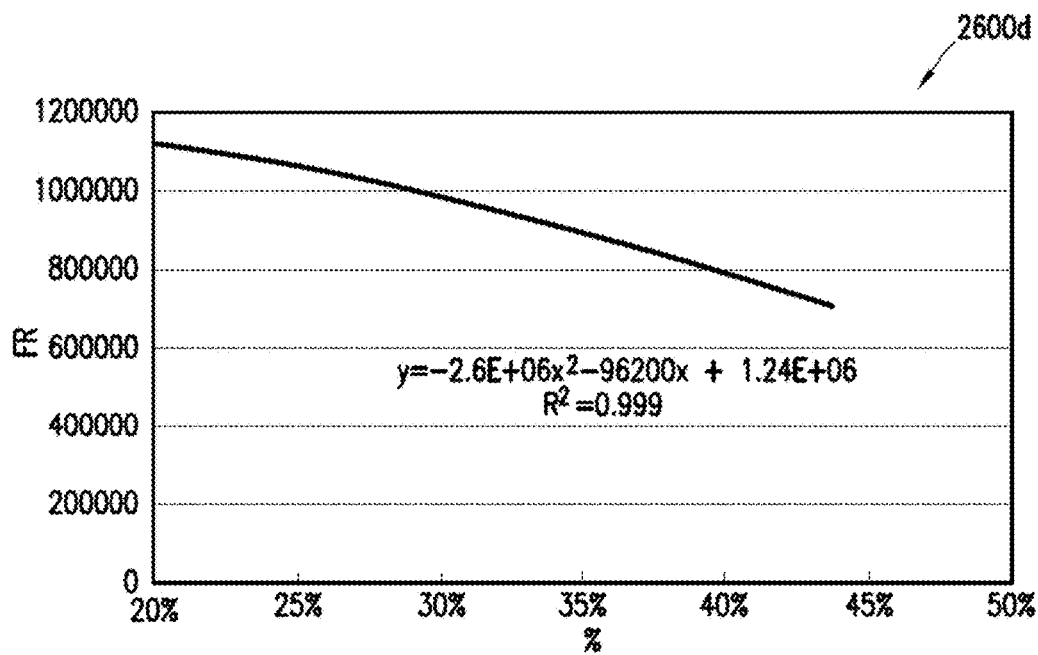
Figure 26E:
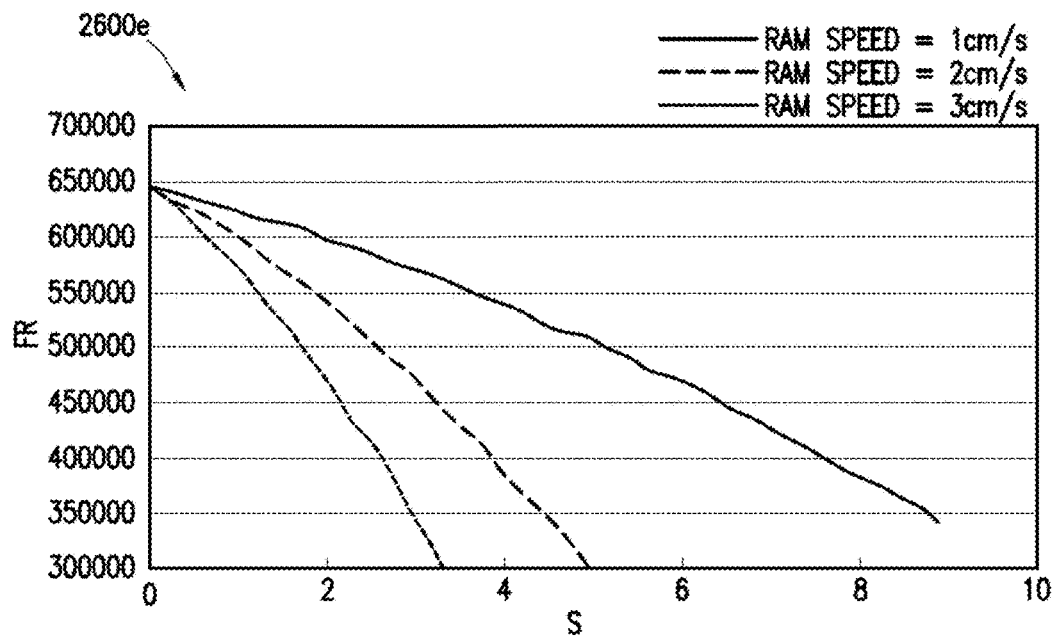
Figure 26F:
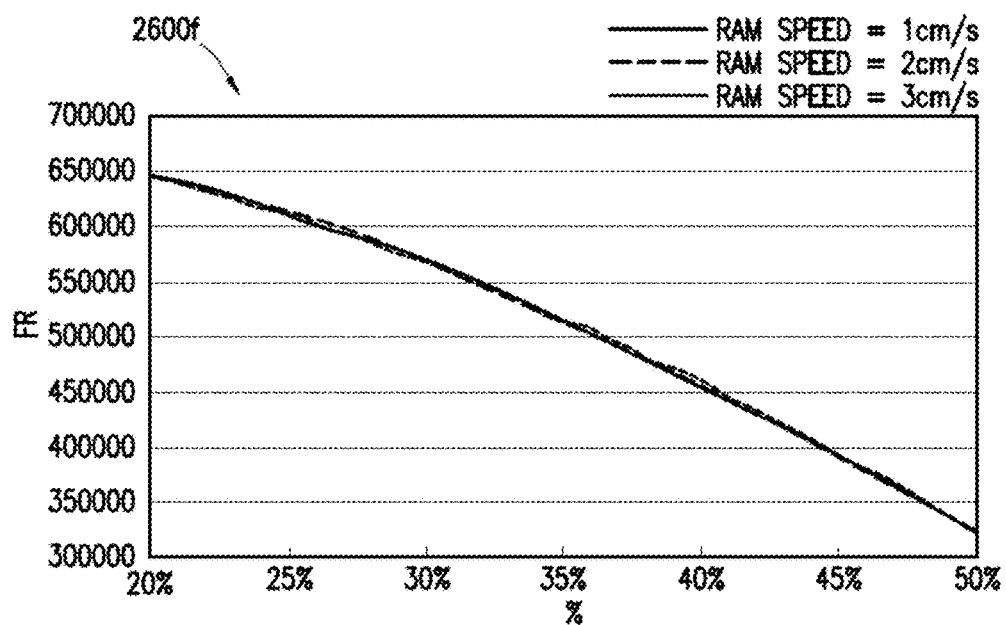

Two parts of simulations are presented: I) Ram Movement with Dynamic Mesh without Cavitation, and II) Rams Movement with Dynamic Mesh at Different Speeds without Cavitation. FIGS. 26A-F are graphs 2600a-f showing various results from the simulations. FIGS. 26A and 26B show flow rate (FR) (GPM) (y-axis)) versus flow time (s) (x-axis) at 5 kpsi and 15 kpsi, respectively. FIGS. 26C and 26D show flow rate versus closure percentage (%) at 5 kpsi and 15 kpsi, respectively. FIGS. 26E-26F flow rate versus flow time at and closure percentages at 5 kpsi and 15 kpsi, respectively.

In part I, the ram movement is simulated with a certain moving speed (0.01 m/s for each ram) with dynamic mesh settings. No cavitation model is introduced to the CFD solver in order to compare the results to the cavitation effect. Two BOP pipe inlet pressures are used as 5,000 psi and 15,000 psi (gauge pressure). The downstream pressure of the BOP is set to be 0 psi (ambient gauge pressure). The volumetric flow rate is measured in this simulation. In this transient simulation, the moving ram is starting at a closure percentage of 20% (at the time of 0 sec, the BOP closure is 20%). The simulation is carried out for about 8 sec, while the ram reaches about 45% closure percentage. Water liquid is in the computation domain since no cavitation is applied.

As shown by FIGS. 26A-B, the volumetric flow rate decreases as the physical time (or ram closure percentage) increases. A second order polynomial is also built to calculate approximate flow rate with a different ram closure rate, when the inlet pressure is 5,000 psi. As shown by FIGS. 26C-D, based on this polynomial, for the wide open case (e.g., about 0% ram closure percentage), the volumetric flow rate may be about 0.72 million gpm. For upstream pressure of 15,000 psi, another second order polynomial has been built to calculate approximate flow rate with a different ram closure percentage. Based on this polynomial, for wide open case (0% ram closure percentage), the volumetric flow rate would be about 1.24 million gpm.

In order to correlate the $2^{nd}$ order polynomials, which are obtained based on the transient simulation at 0% of the closure percentage, an additional CFD simulation is performed to calculate a round smooth pipe internal flow (see FIG. 15B). Also, the round smooth pipe simulation is verified by the analytical calculation in the turbulence flow pressure drop with Blasius correction on the friction factor f as:

$$f = 0.316 \text{Re}^{\frac{1}{4}} \quad (27)$$

where Re is the Reynold's number of the flow. The pressure drop ΔP (in state pressure) through this pipe internal flow may be calculated as:

$$\Delta P = f \frac{L}{D} \cdot \frac{\rho V^2}{2} \quad (28)$$

with assumptions made in the calculation of the analytical volumetric flow rate V, such as pipe dimensions (e.g., diameter D of about 18.75 inch, length L of about 9.3 ft, inlet pressure of about 5000 psi/15,000 psi, outlet (static) pressure of about 0 psi (ambient)).

The difference between the analytical calculation and the CFD results is less than 2%. This agreement indicates confidence in CFD results in simulating the ram flow with dynamic mesh at a low closure percentage. The mesh may be further refined, for example, for a high closure percentage (over 80%) and/or where the rams overlap and the overlapping gap has a very small dimension (e.g., about 0.005 inch).

For Part II, different movement speeds are used for the rams. FIG. 26E shows the volumetric flow rate at growing flow time, and FIG. 26F shows the volumetric flow rate at ram closure percentages. Since the ram moving speed is much lower than the local flow velocity (200–300 m/s at throat or narrowest part), for different ram speed at the same ram closure percentage the volumetric flow rates are considered to be almost the same (FIG. 26F).

Part II also shows that the transient simulation of the ram with dynamic mesh settings may be replaced with discrete simulations along with steady state assumptions at a certain ram closure level. Since the horizontal velocity component by the ram movement (about 0.01 m/s) is considered insignificant compared to the vertical velocity magnitude, and is ignored. In a steady state simulation, the horizontal velocity component at the ram wall is assumed to be zero.

Example 2—Cavitation Simulation with Dynamic Mesh

In this example, the cavitation model is included in the CFD simulation to consider the phase change and multiphase mass transfer of the 3D flow simulation. The basic ram moving speed (e.g., 0.01 m/s) is applied with the dynamic mesh settings. The cavitation simulation results may be compared with the simulation results of Example 1 (without cavitation).

Figure 27A:
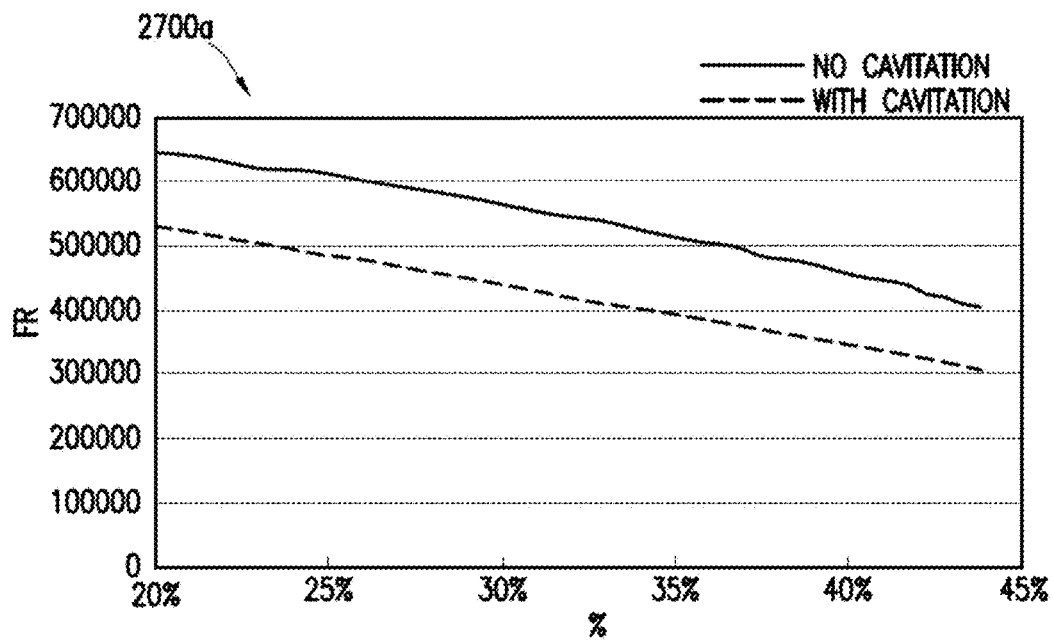
FIGS. 27A-27B are graphs depicting flow rate versus closure percentage with and without cavitation.
Figure 27B:
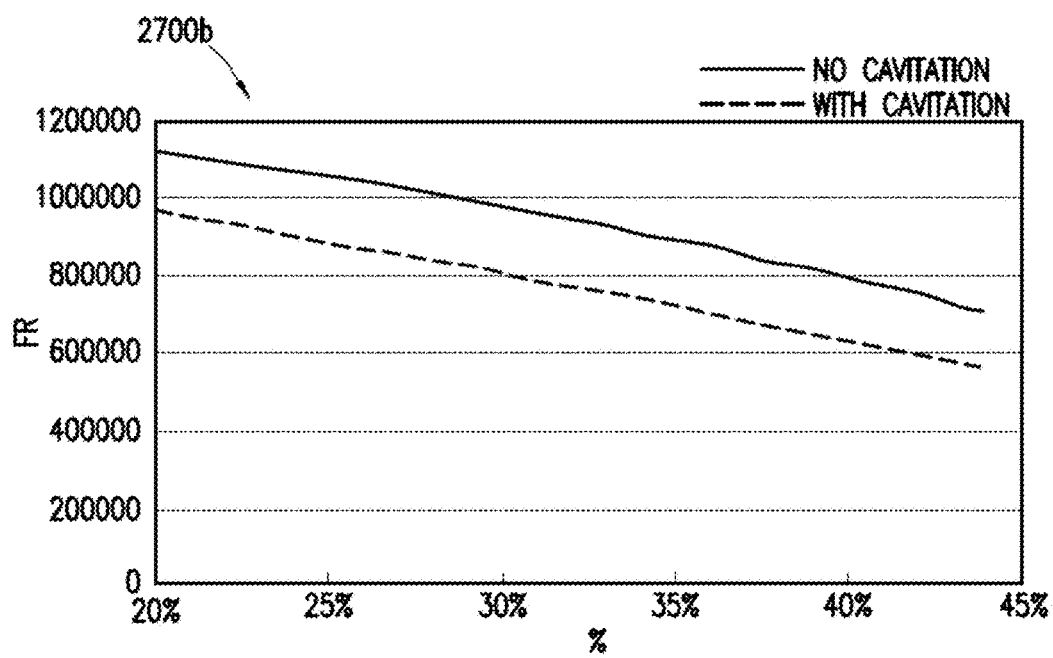

FIGS. 27A-B are graphs 2700*a-b* depicting flow rate (FR) (y-axis) versus closure percentage (%) at pipe inlet pressures of 5,000 psi and 15,000 psi (gauge pressure), respectively, and at the downstream pressure of the BOP is set to be 0 psi (ambient gauge pressure).

In this transient simulation, the moving ram is starting at a closure percentage of 20% (at the time of 0 sec, the BOP closure is 20%). The simulation is carried out for about 8 sec, while the ram reaches about 45% closure percentage. For both inlet pressure cases, the volumetric flow rate decreases as the physical time (or ram closure percentage) increases, indicating that the flow channel cross-sectional area decreases at the ram and, hence, the flow restriction increases accordingly.

FIGS. 27A-B show that with the cavitation and phase changing (liquid to vapor), the volumetric flow rate decreases compared to Example 1. The reason could be due to the choking effect in the vapor phase at the "orifice-like" section of the ram system. According to Table 2 below, in the closure process between 20%-45%, about a 20% drop is observed in the volumetric flow-rate after including cavitation for both 5,000 psi and 15,000 psi upstream pressures as shown by Table 2 below:

TABLE 2

Volumetric flow-rates comparison between non-cavitation and cavitation simulations

| | Inlet Pressure 5,000 psi | | Inlet Pressure 15,000 psi | |
| --- | --- | --- | --- | --- |
| | Volumetric Flow rate @ 20% Closure GPM | Volumetric Flow rate @ 45% Closure GPM | Volumetric Flow rate @ 20% Closure GPM | Volumetric Flow rate @ 45% Closure GPM |
| Ex. 1 - NO Cavitation | 644,000 | 402,000 | 1,116,000 | 706,000 |
| Ex. 2 - Cavitation | 526,000 | 308,000 | 960,000 | 562,000 |
| Difference | 18.3% | 23.4% | 14.0% | 20.4% |

Example 3—Flow Choking Effect with Cavitation

In this example, the flow choking is added to the cavitation model in the CFD simulation. When a flowing fluid at a given pressure and temperature passes through a vena contracta (e.g., the ram section with certain closure as in FIG. 16) into a lower pressure environment downstream, the fluid velocity increases. Fluid conditions may be altered based on conservation of mass principle and the Venturi effect causes. Choked flow may be a limiting condition where the mass flow rate may not increase with further decrease in the downstream pressure environment while upstream pressure is fixed.

In this example, an initial state of the fluid material is in a liquid phase (water). A different type of choked flow condition may occur when the Venturi effect acting on the liquid flow through the vena contracta causes a decrease in the liquid pressure beyond the vena contracta (ram) to below that of the water-liquid's vaporization pressure at the prevailing liquid temperature. At that point, the liquid may partially flash into bubbles of vapor and the subsequent collapse of these bubbles may cause cavitation. The vapor bubble formation in the vena contracta may prevent the flow-rate increase by increasing the differential pressure.

The flow choking effect in the BOP flow with different ram closures is considered in the simulation. The simulations are performed using the steady state assumption considering the relative low moving speed of the ram. Certain closure percentages of the ram are investigated with different downstream/upstream static pressure ratios (P2/P1) while the volumetric flow rates are recorded as shown in FIGS. 28A-E.

In this part of simulation, the BOP inlet total pressure P1tot is set to be fixed at 5,000 psi, and then the BOP outlet boundary (downstream) static pressure P2 is varied from 0 psi to 4,500 psi to obtain flow-rate at different pressure ratio. It is noted that the inlet total pressure P1tot is not equal to the inlet static pressure P1 in most of the conditions, since the total pressure would be the sum of the static pressure and the dynamic pressure at the same location where the latter is related to the local flow velocity.

Figure 28A:
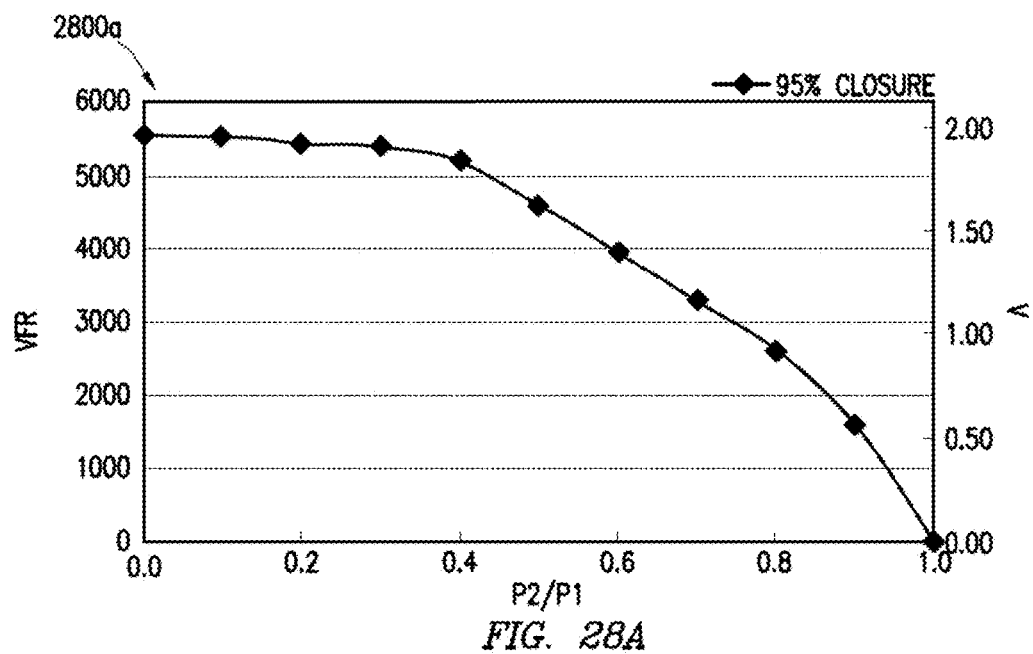
FIGS. 28A-28F are graphs depicting volumetric flow rate versus pressure ration for various closure percentages.
Figure 28B:
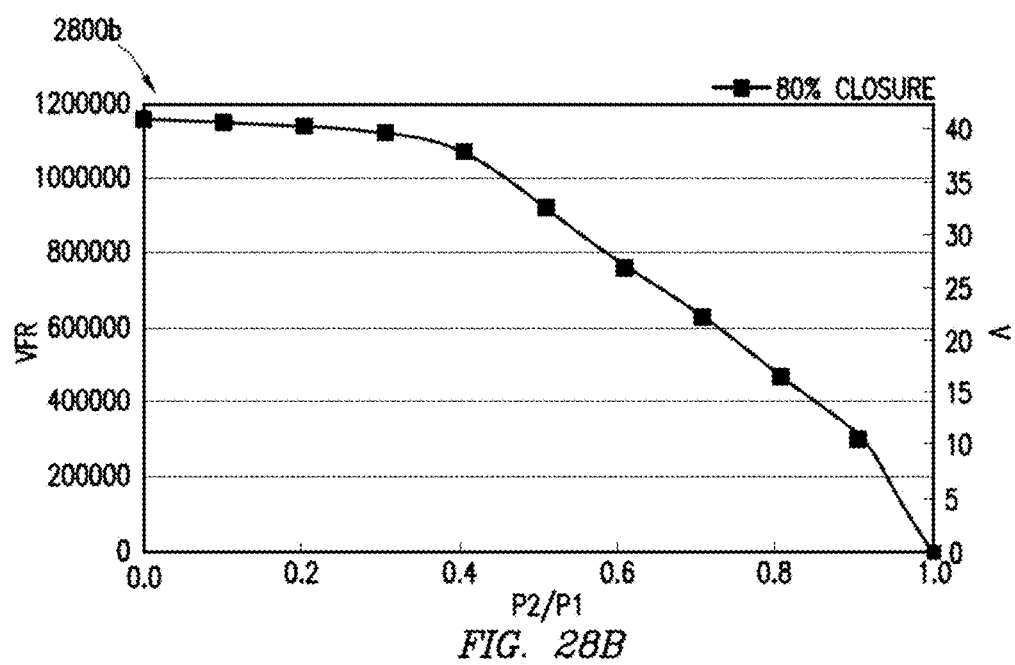
Figure 28C:
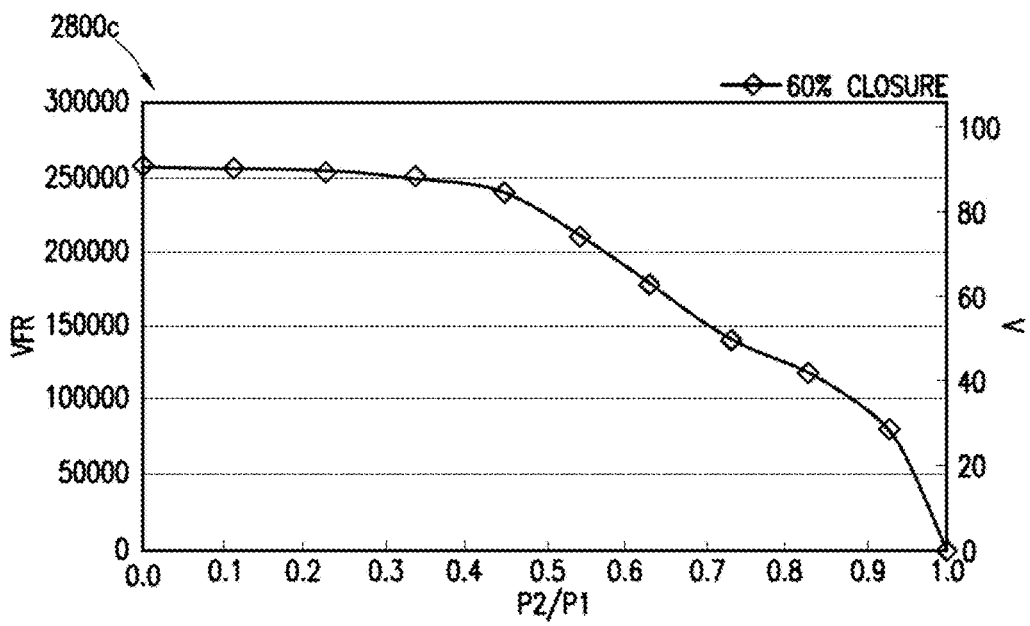
Figure 28D:
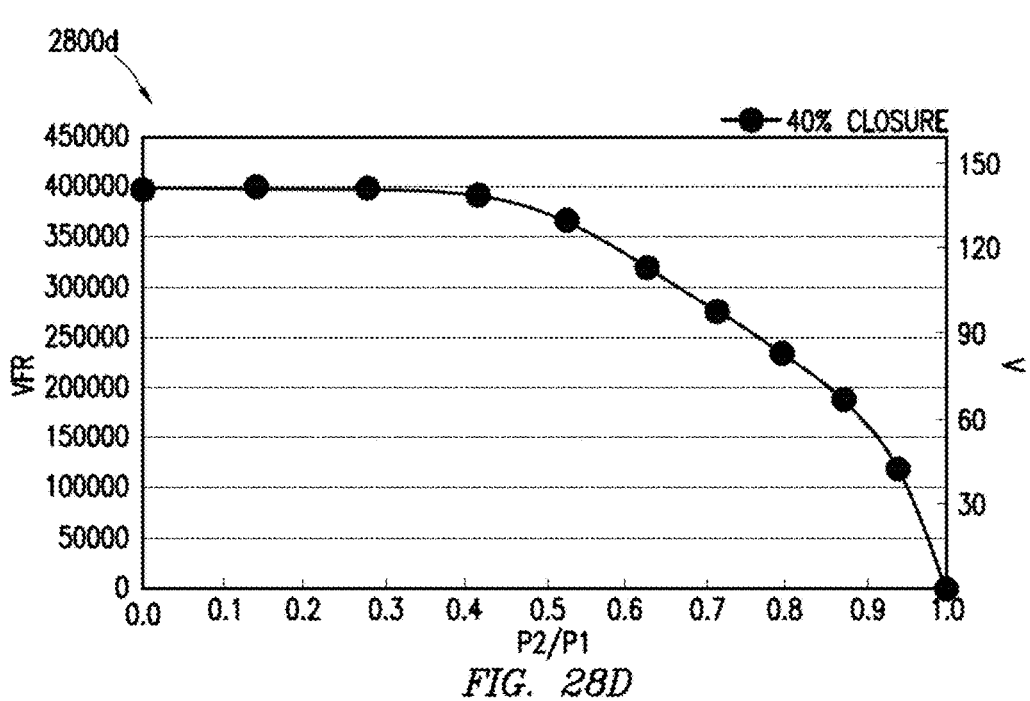
Figure 28E:
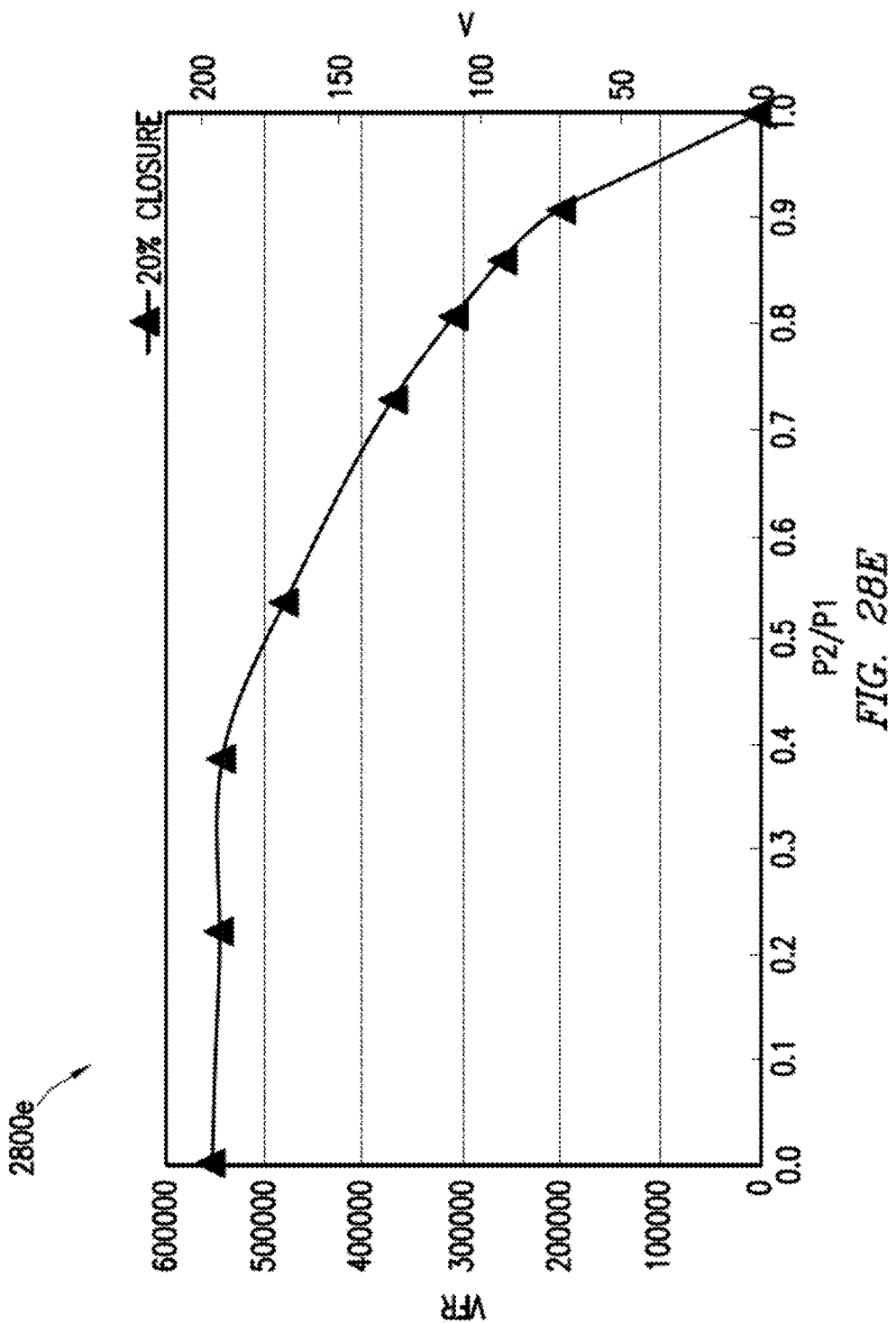
Figure 28F:
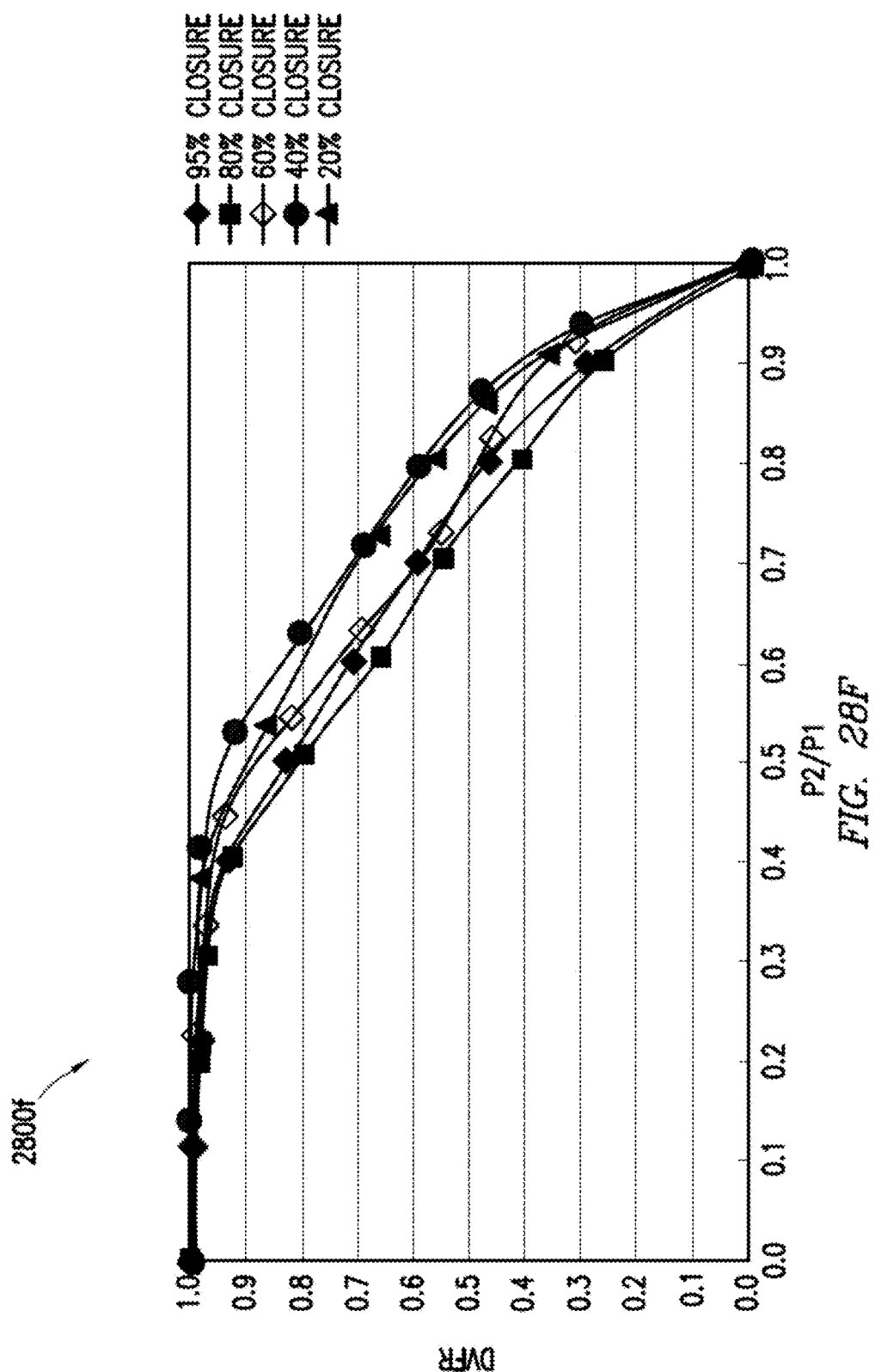

FIGS. 28A-E are graphs 2800a-e depicting volumetric flow rate (FR) (y-axis) versus pressure (P2/P1) (x-axis) at closure rates of 95%, 85%, 60%/o, 40%, and 20%, respectively. FIG. 28F is a graph 2800f depicting dimensionless volumetric flow rate (DVFR) (y-axis) versus pressure (P2/P1) (x-axis) for each of the closure rates of 95%, 85%, 60%, 40%, and 20% of FIGS. 28A-E.

FIGS. 28A-E show the volumetric flow-rates at growing downstream/upstream ratio (P2/P1) with different ram closures. The flow mean velocity at the inlet boundary of the BOP was also shown within FIG. 28A-E. Differences are observed in the volumetric flow-rates or the mean velocity at different ram closures. For instance, at 95% closure, when P2/P1=0, the mean velocity at inlet is about 2 m/s; while at 20% closure, when P2/P1=0, the mean velocity could be as high as 200 m/s. This may be de to the ram closure of 95% having a significantly higher flow restriction than the 20% closure case. The choking effect can be observed within these figures. When the downstream/upstream pressure ratio (P2/P1) is higher than a certain value (critical pressure ratio), the volumetric flow rate (or the mean flow velocity) would drop quickly as the pressure ratio increases; however, when the P2/P1 is lower than this critical pressure ratio, it implies that the flow-rate would be constant as the pressure ratio decreases, which is actually the choked flow phenomenon.

FIG. 28F shows the dimensionless flow-rate at different pressure ratio for all ram closure conditions. In this figure, the dimensionless flow-rate is equal to the volumetric flow-rate data divided by the maximum flow-rate when P2/P1=0 for each closure percentage. It shows that the critical pressure ratio for P2/P1 is be around 0.4 based on the 3D simulation results obtained.

Example 4—Cavitation at Different Temperatures

In this example, the cavitation model is performed at various temperatures to examine the effects of choking on cavitation. Since the choking effect with cavitation is related to the liquid's vapor pressure at the prevailing liquid temperature, apparently the choking effect due to cavitation is varied in different flow temperature. This simulation is performed in the room temperature 25 C and at 300 F (149 C). This simulation is also performed using BOP geometry when the ram closure is equal to 60% and the same assumptions for the inlet total pressure and the outlet static pressure is provided for the discrete data points of the volumetric flow-rate. The results are compared with those in the room temperature at the same geometry, as shown in FIGS. 29A-C.

Figure 29A:
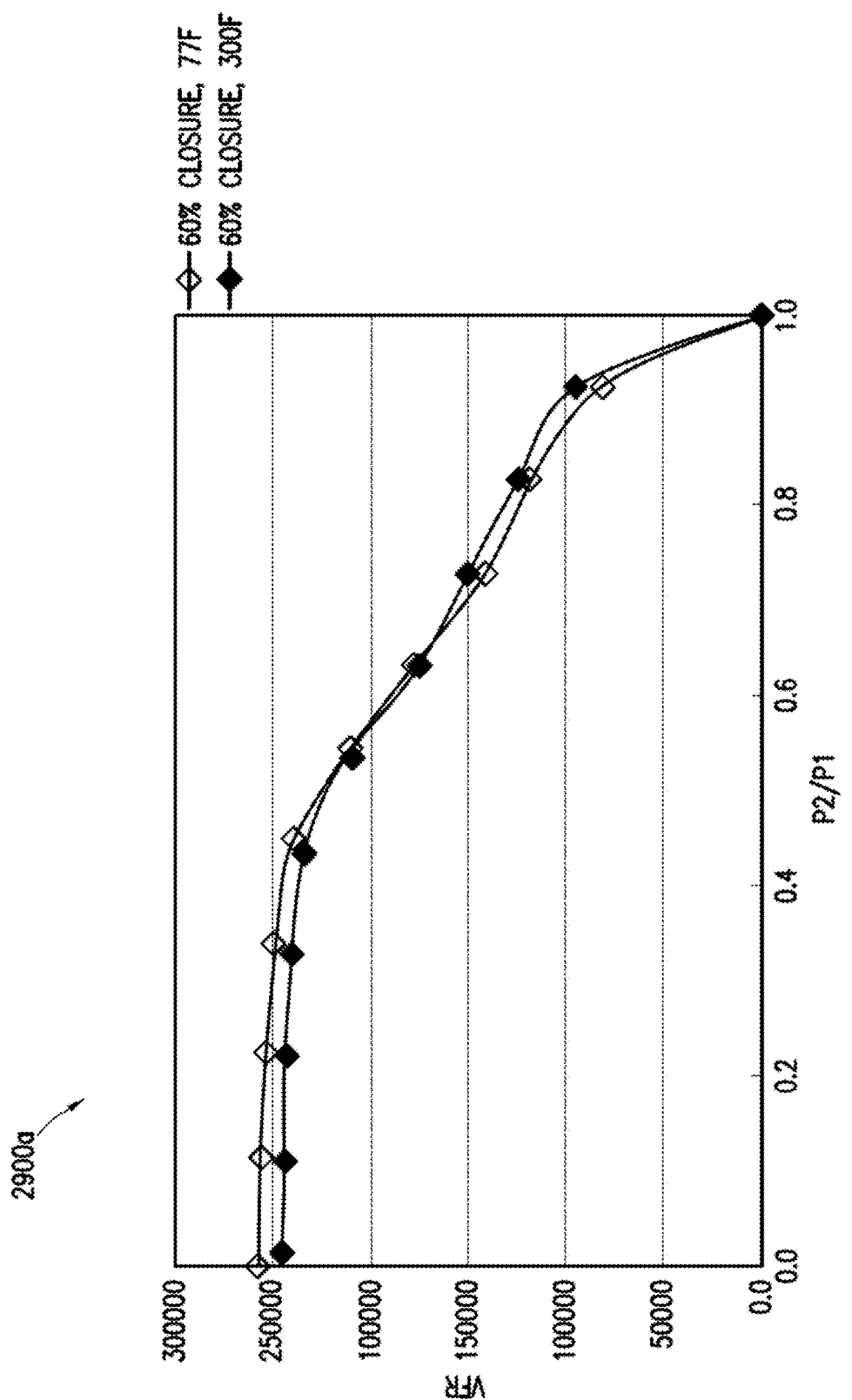
Figure 29C:
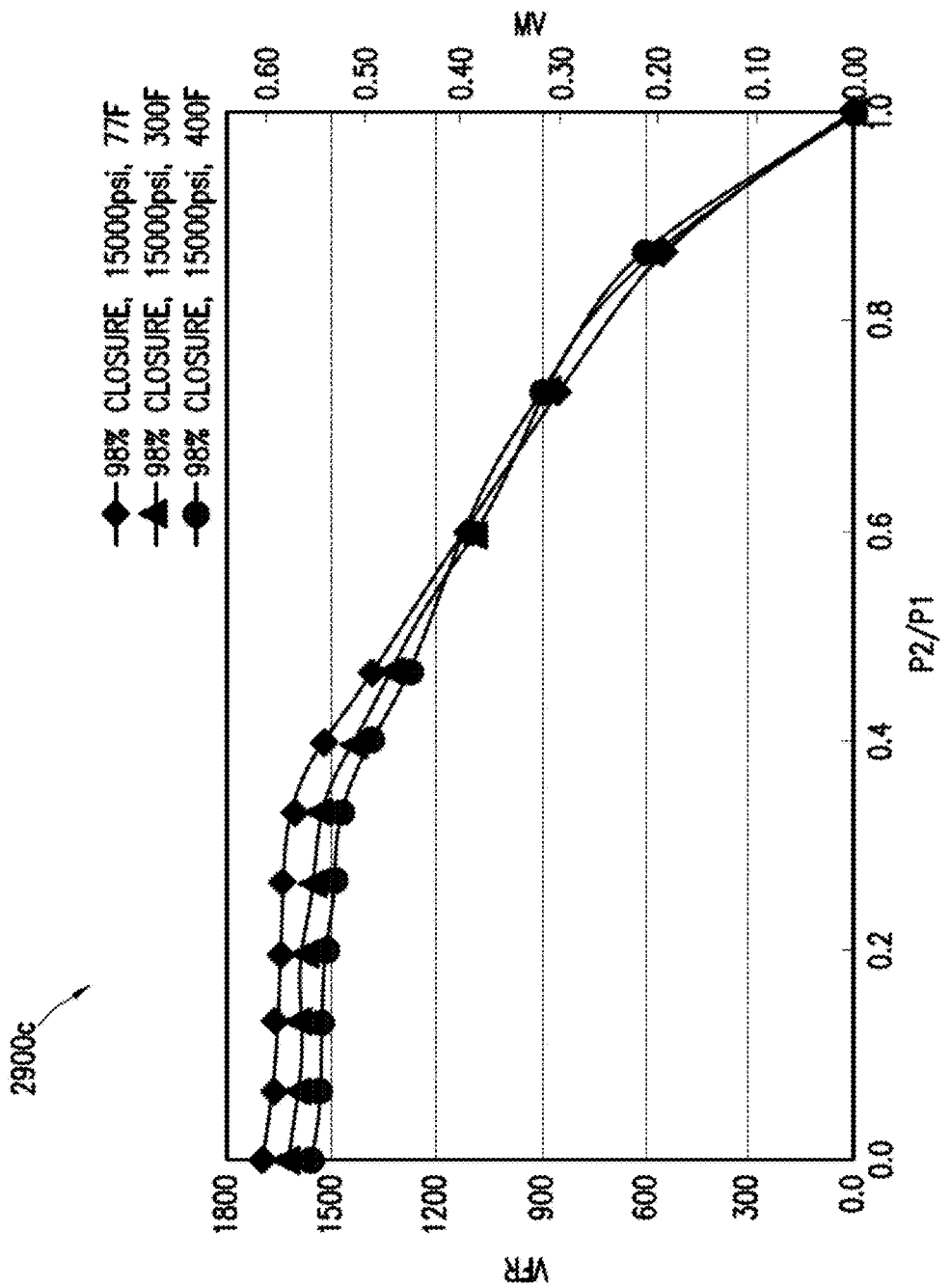

FIGS. 29A-C are graphs 2900a-c depicting volumetric flow rate (VFR) (y-axis) versus pressure (P2/P1). FIG. 29A depicts a graph 2900a showing closure rates of 60% and temperatures of 77° F. and 300° F. (149° C.). FIG. 29A shows that with the higher temperature of 300° F. (149° C.), the volumetric flow-rate curve remains in the similar trend as the downstream/upstream pressure ratio varies. The choked-flow is also observed in the higher temperature case with a similar critical pressure ratio (about 0.4). In comparison, the volumetric flow-rate with the choked-flow in the higher temperature is lower than that of the room temperature (25° C. or 77° F.). This may be because the higher flow temperature would have higher flow vaporization pressure. In the room temperature 77° F. (25° C.), the water vaporization pressure is 0.51 psia, and in higher temperature condition of 300° F. the water vaporization pressure is 67 psia.

FIGS. 29B-C depicts graphs 2900b-c showing results for 98% closure rates at 77, 300, and 400 F for a pressure (P1tot) of 51 kpsi and 15 kpsi, respectively. The same assumptions for the inlet total pressure and the outlet static pressure are provided for the discrete data points of the volumetric flow rate. The purpose of this simulation is to examine the temperature effect on the choked flow due to cavitation, while the closure percentage is high so that the cavitation may cause erosion on the ram rubber. The flow temperature is assumed as 77 F, 300 F and 400 F with two inlet pressure conditions: P1tot=5,000 psi and 15,000 psi. The outlet pressure P2 was changed in each case to achieve variable pressure ratio (P2/P1) from 0 to 1.

Figure 30B:
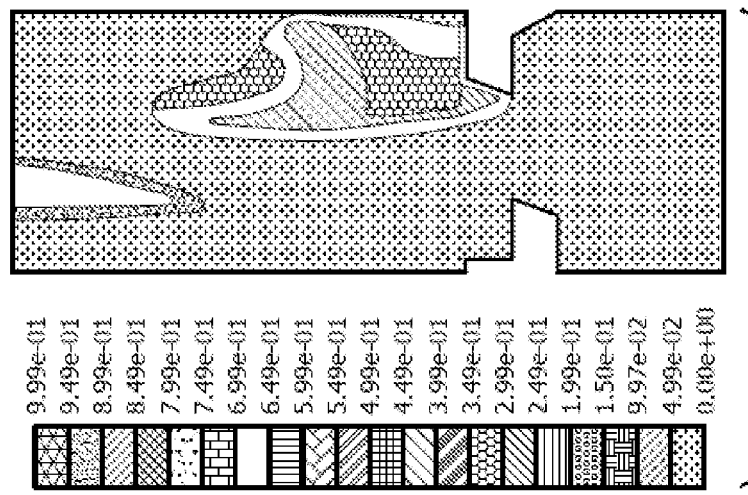
FIGS. 30A-30B are contour plots depicting 3D simulations of vapor fraction within a BOP.
Figure 30A:
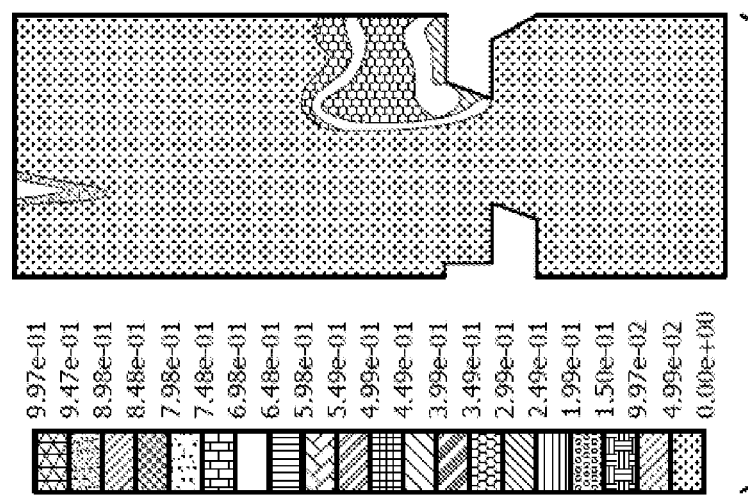
Figure 31B:
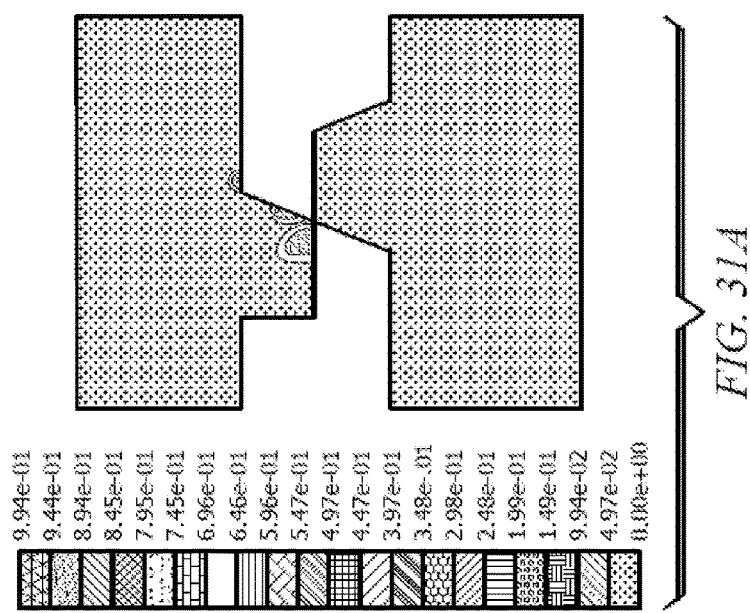
FIGS. 31A-31F are contour plots depicting additional 3D simulations of vapor fraction inside a BOP.
Figure 31A:
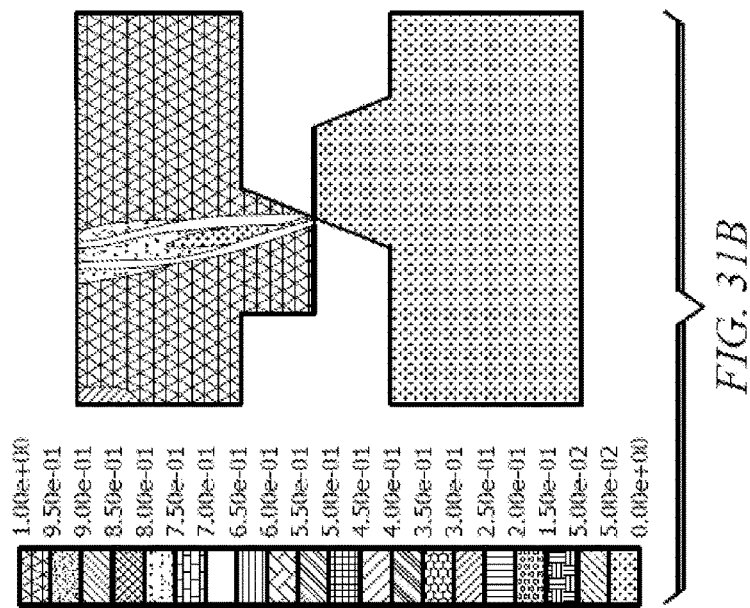
Figure 31D:
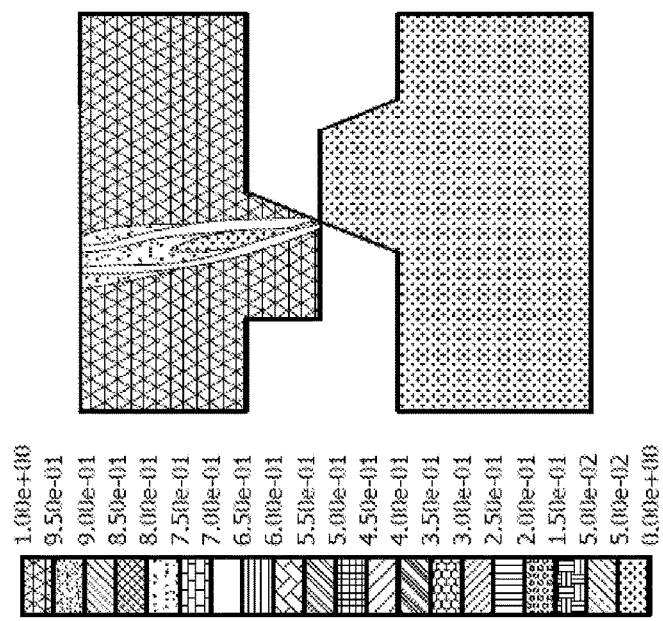
Figure 31C:
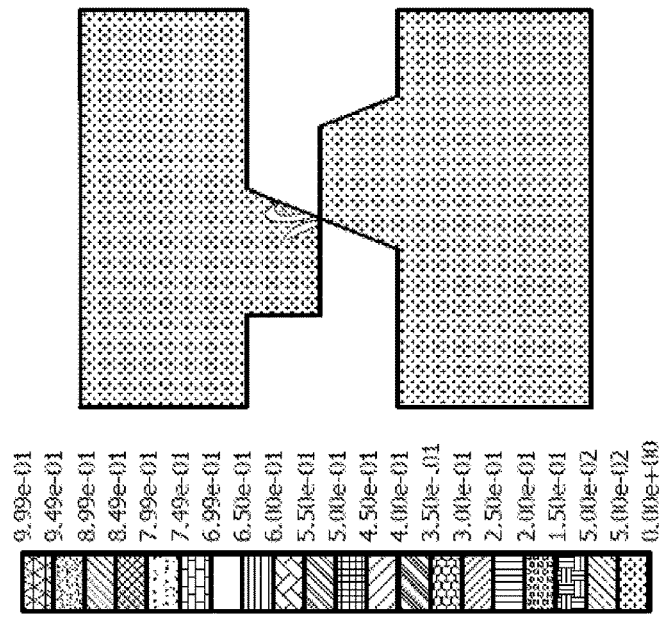
Figure 31F:
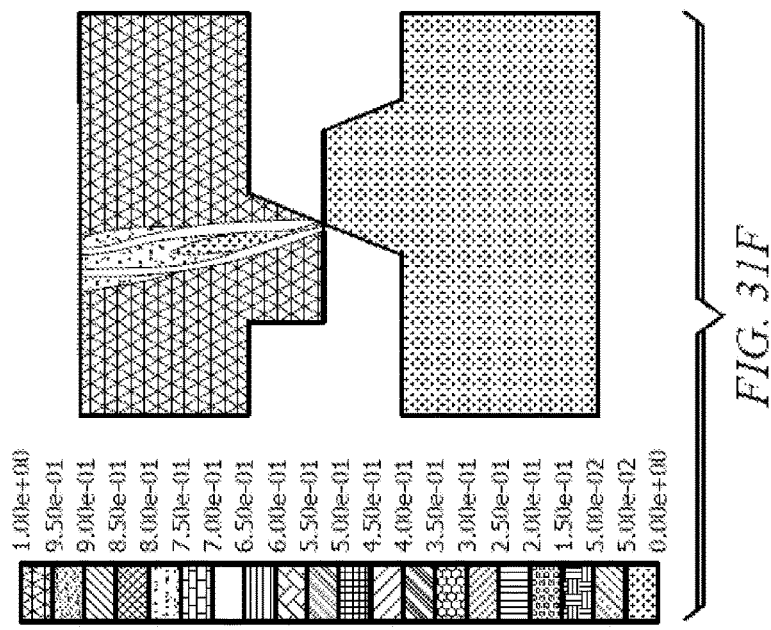
Figure 31E:
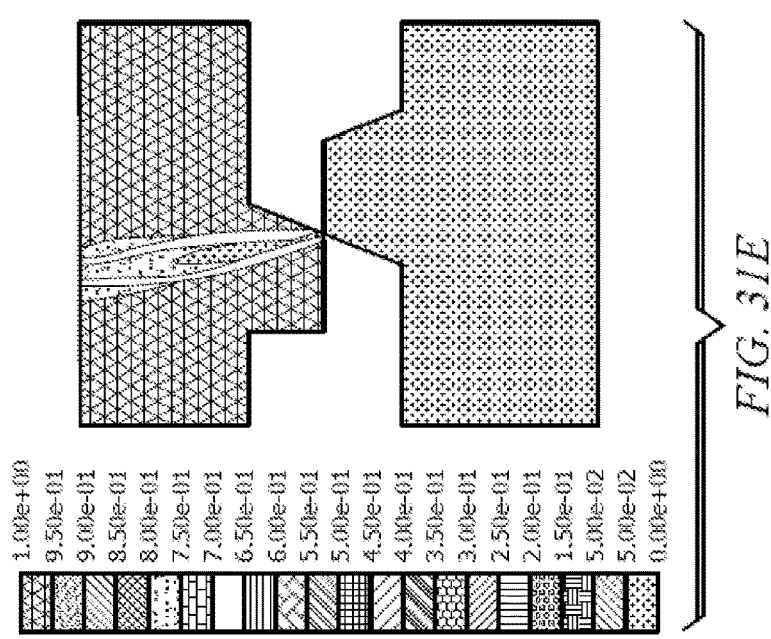
Figure 32B:
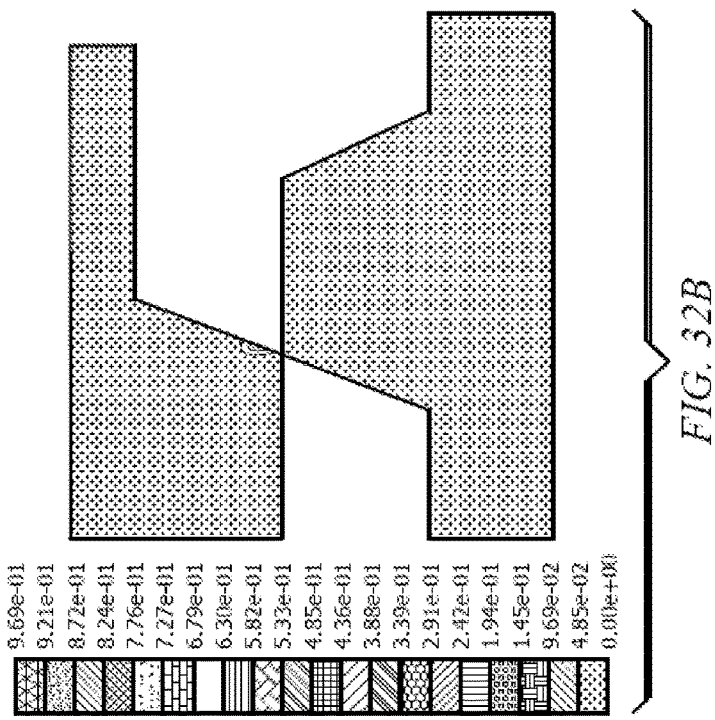
Figure 32A:
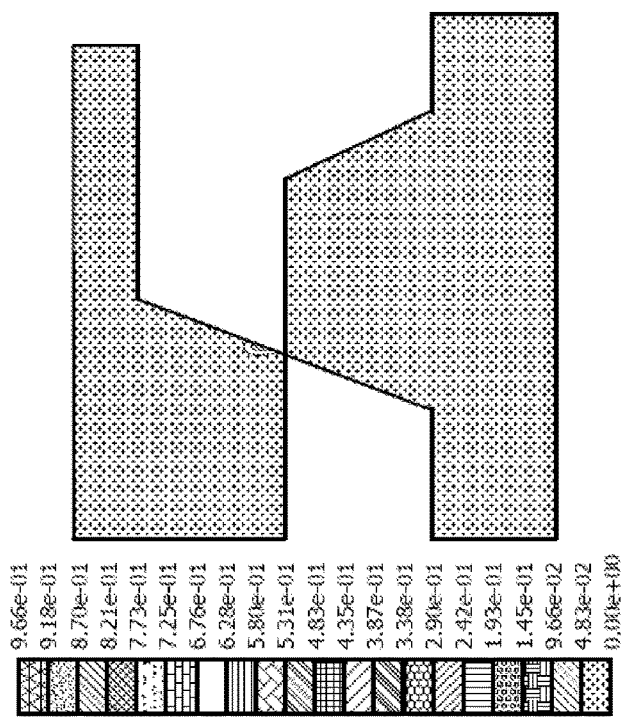
Figure 32D:
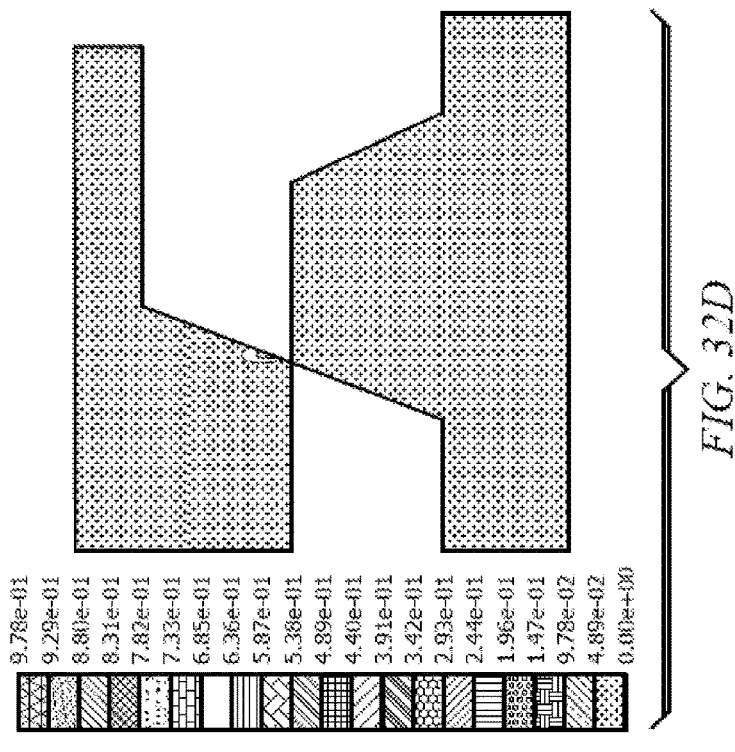
Figure 32C:
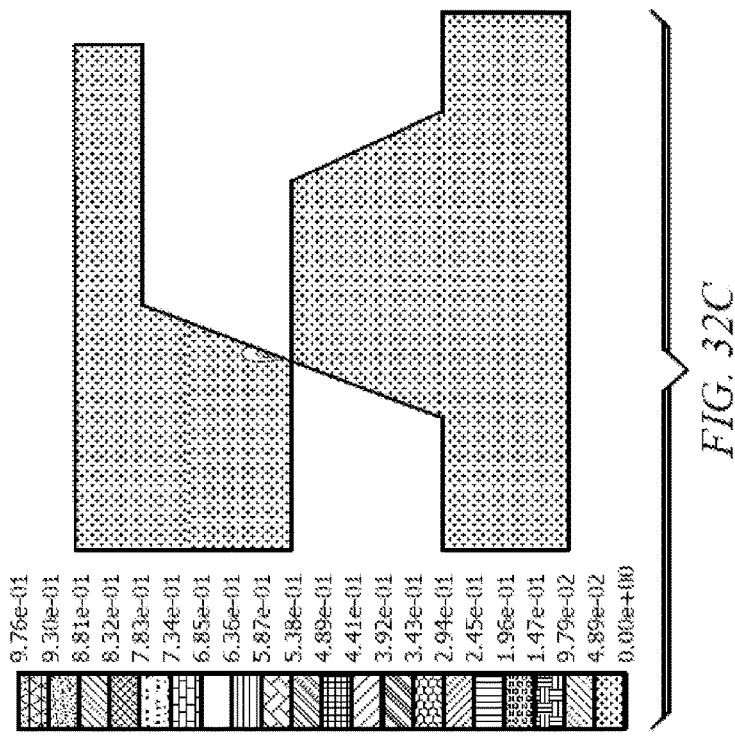

If the same inlet (total) pressure and the outlet (static) pressure are held, higher temperature (with higher vaporization pressure) may result in the cavitation and a higher vapor volume fraction, which may enhance the choking effect. FIGS. 30A-B are contour plots comparing the water vapor volume fraction for different temperatures in the middle cross-section of the BOP with at P1tot=5,000 psi and P2=0 psi. FIG. 30A depicts flow temperature at 77 F. FIG. 30B shows flow temperature at 300 F. In such conditions, the lower temperature case of FIG. 30A has a mean vapor volume fraction of 0.086, while the higher temperature case of FIG. 30B has a mean vapor volume fraction of 0.148 in the computational domain.

The results indicate that, with different fluid temperatures, the volumetric flow rate curve remains in the similar trend as the pressure ratio (P2/P1) varies from 0 to 1. The choked flow is observed in the higher temperature case with a similar critical pressure ratio. In comparison, higher fluid temperature (with higher vaporization pressure) causes cavitation and a higher vapor volume fraction, which enhances the choking effect and leads to a lower flow rate in the choked flow region.

FIGS. 31A-F are contour plots showing the vapor volume fraction comparisons in the middle cross-section of the BOP under several cases: a) flow temperature at 77° F., P1tot=5,000, and P2=0 psi; b) flow temperature at 300° F., P1tot=5,000, and P2=0 psi; c) flow temperature at 400° F., P1tot=5,000, and P2=0 psi; d) flow temperature at 77° F., P1tot=15,000, and P2=0 psi; e) flow temperature at 300° F., P1tot=15,000, and P2=0 psi; f) flow temperature at 400° F., P1tot=15,000, and P2=0 psi, respectively.

FIGS. 31A-F indicate that higher temperature generates a higher mean vapor volume fraction in the computational domain, which supports the conclusion made in FIGS.

29A-F (higher flow temperature causes lower flow-rate before the critical pressure ratio). However, for all results shown in FIGS. 29B-C, the BOP outlet pressure was set to be 0 psig (about 14 psia), which was much lower than the water vaporization pressure at 300 F (67 psia) and 400 F (247 psia). Because of the low flow rate and velocity in this 98% closure case, most of the fluid in the downstream of the ram turns into vapor in the higher temperature cases (case b, c, e and f in FIGS. 32A-F), and the vapor volume fraction at the BOP outlet boundary may be over 98%.

FIGS. 32A-F depict additional illustrations for the higher outlet pressures: a) flow temperature at 77° F., P1tot=5,000, and P2=500 psi; b) flow temperature at 300° F., P1tot=5,000, and P2=500 psi; c) flow temperature at 400° F., P1tot=5,000, and P2=500 psi; d) flow temperature at 77° F., P1tot=15,000, and P2=1,000 psi; e) flow temperature at 300° F., P1tot=15,000, and P2=1,000 psi; f) flow temperature at 400° F., P1tot=15,000, and P2=1,000 psi, respectively. Compared to the cases shown in FIG. 31A-F, simulations in FIG. 32A-F have the outlet pressures higher than the water vaporization pressure. This is shown to result in a largely suppressed and local cavitation on the ram surface.

4. Experimental Validation

Figure 33:
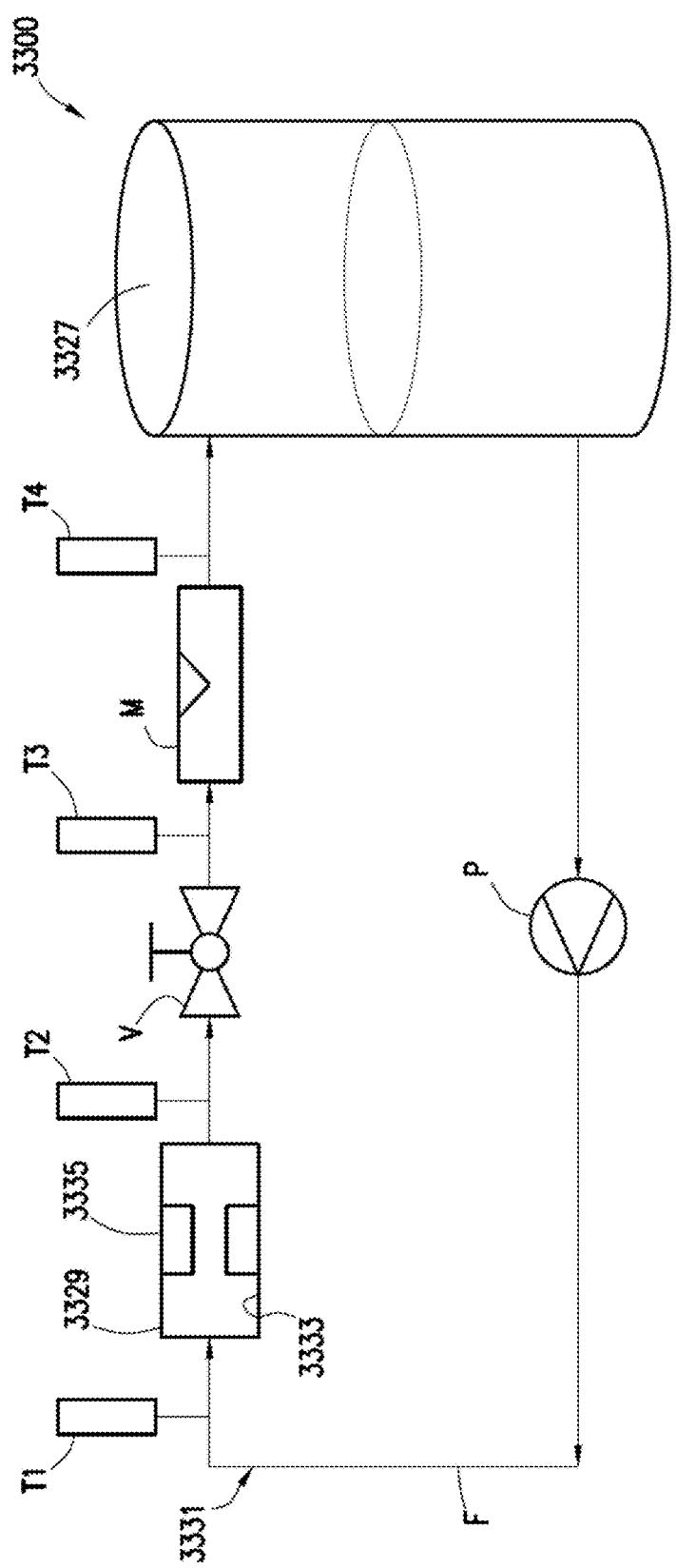
FIG. 33 is a schematic diagram depicting a test assembly for testing the BOP seal.

The validating 1115 may involve comparing simulated erosion with erosion determined by performing a lab test. The lab test may be performed, for example, using a test assembly as shown in FIG. 5 or 33. The test assembly 3300 includes a reservoir 3327 coupled to a test BOP 3329 via a flow circuit 3331. The test BOP 3329 includes a tester (or test chamber) 3333 with seals 3335 extending therein to define the restriction R. The flow circuit 3331 includes a flowline F, a pump P, a control valve V, a meter M (e.g., flow meter), and transducers T1-T4. Other features may be provided, such as a sensor (e.g., temperature gauge or thermocouple).

The flow circuit 3331 circulates fluid from the reservoir through the test BOP 3329. The fluid may pass over the seals 3335 thereby eroding an exposed portion of the seal as described with respect to FIG. 5. The test assembly 3300 may be used to test erosion of the seals 3335 under various conditions, such as temperatures (e.g., maximum 180 C), flow rates, and pressures. The pressures may be set to define a pressure differentials ΔP=P1−P2. The test assembly 3300 may be coupled to a processor to operation of the measuring the conditions and resulting erosion.

If the simulated erosion is not within a desired range of the erosion generated during testing, models may be adjusted and the simulations may be re-performed until desired results are generated.

4. MERF

The determining 1117 a mass erosion rate may be performed using the theoretical and CFD approaches. These approaches may yield results (e.g., simulations) that define an erosion rate of the BOP seal. This erosion rate describes the amount of the BOP seal that is lost over time (mass/time). This amount changes as the passage is restricted and closes with the rams (e.g., FIGS. 14A-F). As the rams close, velocity, temp and pressure of the fluid change, thereby also changing the erosion rate over time during the closing profile.

If the simulated erosion is acceptable, the results of the simulation may be used for generating 1117 seal parameters, such as mass erosion rate (MERF). Knowing the initial mass of the BOP seal (Minitial), the simulations may be used to define the erosion rate of the BOP seal for various BOP, fluid, and closing parameters. Based on the following equation, the time the BOP seal will erode Tsafe may be determined.

The $T_{safe}$ refers to the safety time estimated that it takes for the rubber to be eroded. This information may be used to generate the MERF using the following equation:

$$\text{MERF} = T_{safe}/M_{initial} \quad (29)$$

The MERF may be used to evaluate the solid mass removal rate due to erosion, and may be used as a tool to estimate the closing time needed when the BOP seal is subject to erosion. In an example involving an 18" variable ram BOP operating at a pressure differential of 15 kpsi, a temperature of 300 F. a flow rate (995 kg/m3, 0.02 Pa-s) of mud through the BOP, and fluid mud particles of barite (at 4300 kg/m3, 100 μm, 5% volume fraction), the MERF is determined from Equation (29) as follows:

$$\text{MERF} = 9.5 \text{ sec}/(75 \text{ g} \times 90\%) = 0.14 \text{ s/g} \quad (30)$$

In another example under the same conditions and with a BOP seal having 200 g, the Tsafe for the BOP ram closing may be determined based on Equations (29-30) as follows:

$$T\text{safe} = \text{MERF} - M\text{initial} = 0.14 \text{ sec/g} \times 90\% \times 200 \text{ g} = 25.2 \text{ sec} \quad (31)$$

Based on the MERF, a closing time may be defined 1119. Equation (31) indicates that, if closing time exceeds 25.2 seconds, 90% of rubber will be eroded before full closure. The MERF may be reapplied to other BOP rams of similar geometry. As geometry changes, the MERF may need adjustment.

5. Closing Time

Figures 34, 35:
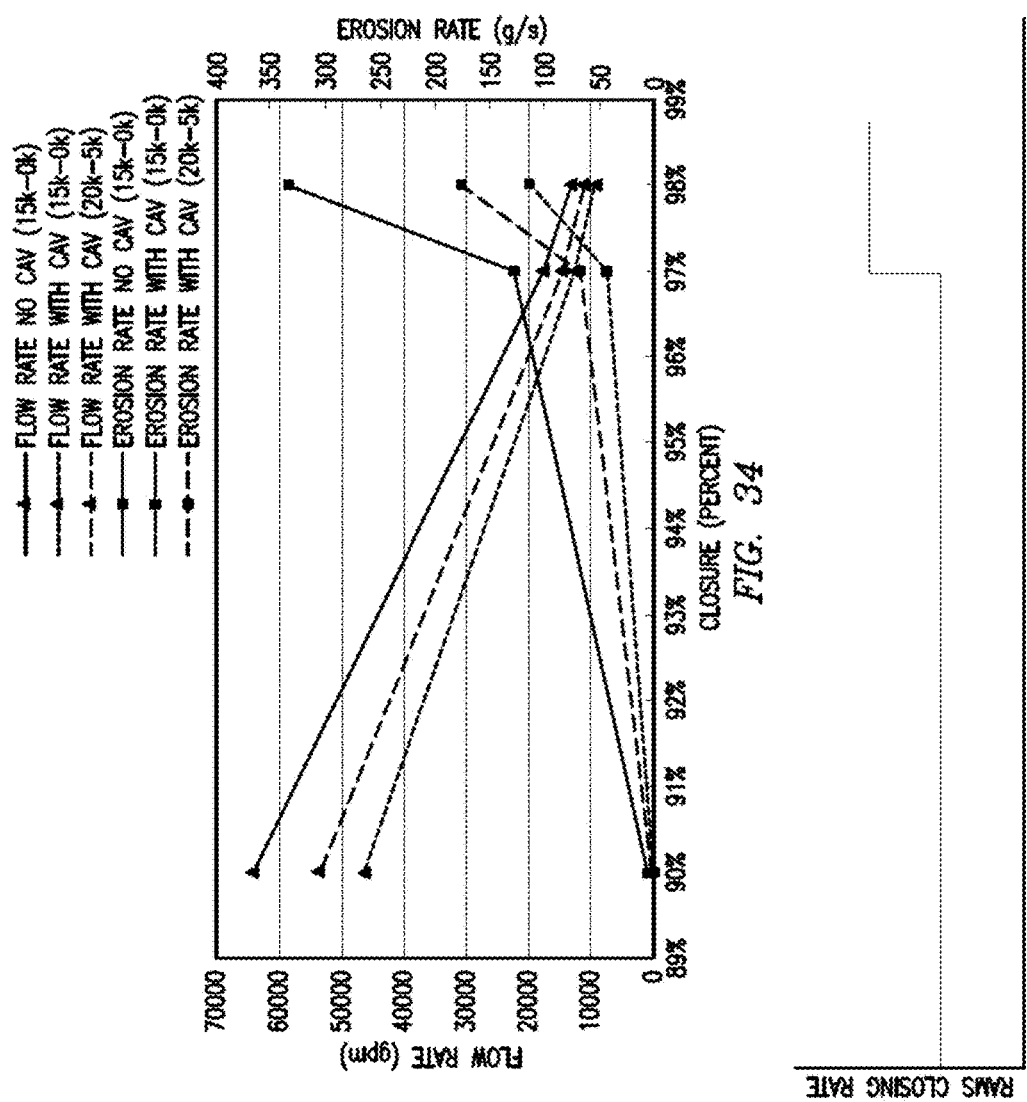
FIG. 34 is a graph depicting flow rate and erosion rate at various closure percentages.
FIG. 35 is a graph depicting ram closure rate versus closure percentage based on FIG. 34.

The defining 1119 closing parameters (e.g., closing rate) may be performed based on the MERF. FIG. 34 is a graph depicting flow rate and integrated erosion rate (y-axis) versus percent closure (x-axis) for various conditions. The flow rate and erosion rate are each plotted for a closure rate of 90, 97, and 98%. Such items are plotted with and without cavitation. As indicated by this graph erosion rate is affected by both flow rate and % closure, and seal damage begins at closures of greater than about 90%.

The rate of closure of the BOP may be operated 1121 at the defined closing time to optimize operating conditions. While, in some cases, the BOP may be closed at a predetermined closure rate, the BOP may have certain physical limitations (e.g., power) which affect its ability to close under certain conditions. For example, the BOP may have capacity to close at flow velocities up to a given flow rate. As the BOP closes, the flow velocities may increase such that closing is not possible. Additionally, at a certain point, the flow velocity may also begin to erode the BOP seal.

To prevent erosion of the BOP seal and/or to operate within closing capabilities of the BOP, the BOP may optionally be set to close in various sequences, such as a first rate up to this max flow velocity, and a second rate after a second velocity. FIG. 35 is a graph depicting ram closing rate (y-axis) versus % closure (x-axis). As shown by this graph, the rams may be closed at a first rate up to a % closure of about 96% to correspond with the flow rates and erosion rates of FIG. 34 (e.g., from the position in Stage I to Stage II in FIG. 12). After this, the rains may then be closed as a second, higher rate for the remaining 4% until full closure (e.g., from the position in Stage II to Stage III in FIG. 12).

To confirm closure capabilities, the BOP sealing may be tested in situ. Such testing may be performed according to the closing rates as shown, for example, in FIG. 35. Once confirmed, the BOP may be put into service and operated 1121 according to the defined closing parameters.

It will be appreciated by those skilled in the art that the techniques disclosed herein can be implemented for automated/autonomous applications via software configured with algorithms to perform the desired functions. These aspects can be implemented by programming one or more suitable general-purpose computers having appropriate hardware. The programming may be accomplished through the use of one or more program storage devices readable by the processor(s) and encoding one or more programs of instructions executable by the computer for performing the operations described herein. The program storage device may take the form of, e.g., one or more floppy disks; a CD ROM or other optical disk; a read-only memory chip (ROM); and other forms of the kind well known in the art or subsequently developed. The program of instructions may be "object code," i.e., in binary form that is executable more-or-less directly by the computer; in "source code" that requires compilation or interpretation before execution; or in some intermediate form such as partially compiled code. The precise forms of the program storage device and of the encoding of instructions are immaterial here. Aspects of the invention may also be configured to perform the described functions (via appropriate hardware/software) solely on site and/or remotely controlled via an extended communication (e.g., wireless, internet, satellite, etc.) network.

While the embodiments are described with reference to various implementations and exploitations, it will be understood that these embodiments are illustrative and that the scope of the inventive subject matter is not limited to them. Many variations, modifications, additions and improvements are possible. For example, various BOPs and/or BOP seals may be used with various simulations and tests to generate parameters to determine closing time. Various combinations of part or all of the techniques described herein may be performed.

Plural instances may be provided for components, operations or structures described herein as a single instance. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

Insofar as the description above and the accompanying drawings disclose any additional subject matter that is not within the scope of the claim(s) herein, the inventions are not dedicated to the public and the right to file one or more applications to claim such additional invention is reserved. Although a very narrow claim may be presented herein, it should be recognized the scope of this invention is much broader than presented by the claim(s). Broader claims may be submitted in an application that claims the benefit of priority from this application.

What is claimed is:

1. A method of sealing a wellbore with a blowout preventer, the wellbore penetrating a subterranean formation, the method comprising:
   providing the blowout preventer with a blowout preventer seal, the blowout preventer having blowout preventer parameters, a fluid flowing through the blowout preventer having fluid parameters;
   simulating erosion of the blowout preventer seal using a blowout preventer model based on the blowout preventer parameters and the fluid parameters;
   measuring erosion of the blowout preventer seal by performing a lab test of the blowout preventer seal in a tester according to the blowout preventer model;
   validating the simulating by comparing the simulated erosion with the measured erosion;
   determining an erosion rate of the blowout preventer seal based on the validated simulating;
   defining a closing rate for blowout preventer rams based on the determined erosion rate; and
   operating the blowout preventer rams according to defined closing parameters.

2. The method of claim 1, further comprising repeating the simulating, measuring, and validating until the simulated erosion is within a maximum range of the measured erosion.

3. The method of claim 1, wherein the blowout preventer parameters comprise seal material, flow area, type of rams, nun shape, passage dimensions, vena contracta dimensions, and combinations thereof.

4. The method of claim 1, wherein the fluid parameters comprise composition, density, flow rate and pressure.

5. The method of claim 1, wherein the simulating comprises performing three dimensional computational fluid dynamics simulations.

6. The method of claim 1, wherein the measuring comprises positioning the blowout preventer seal in the tester and passing the fluid through the tester and over the blowout preventer seal according to the fluid parameters.

7. The method of claim 1, further comprising adjusting the blowout preventer model.

8. The method of claim 1, further comprising validating the erosion rate of the blowout preventer seal by passing the fluid over the blowout preventer seal in an in situ blowout preventer according to the blowout preventer model.

9. The method of claim 1, wherein the operating the blowout preventer rams comprises closing the blowout preventer rams at a first rate and then at a second rate.

10. The method of claim 9, wherein ale closing the blowout preventer rams comprises closing the blowout preventer rams up to 90% at a first rate and then closing the blowout preventer rams a remaining 10% at a second rate.

11. A method of sealing a wellbore with a blowout preventer, the wellbore penetrating a subterranean formation, the method comprising:
    providing the blowout preventer with a blowout preventer seal, the blowout preventer having a passage to receive a tubular of the wellbore therethrough and rams comprising seals engageable about the tubular to seal the passage, the blowout preventer having blowout preventer parameters comprising blowout preventer dimensions;
    passing fluid through the passage, the fluid having fluid parameters comprising a flow rate;
    simulating erosion of the blowout preventer seal using a blowout preventer model based on the blowout preventer parameters and the fluid parameters;
    measuring erosion of the blowout preventer seal by performing a lab test of the blowout preventer seal in a tester according to the blowout preventer model;
    validating the simulating by comparing the simulated erosion with the measured erosion;
    determining an erosion rate of the blowout preventer seal based on the validated simulating; and
    defining a closing rate for blowout preventer rams, based on the determined erosion rate.

12. The method of claim 11, further comprising determining a closing time based on the erosion rate, the closing time being less than an erosion time of the blowout preventer seal.

13. The method of claim 12, further comprising closing the blowout preventer rams up to 90% at a first rate and then closing the blowout preventer rams a remaining 10% at a second rate, wherein the closing is performed within the closing time.

14. A method of sealing a wellbore with a blowout preventer, the wellbore penetrating a subterranean formation, the method comprising:
 providing a blowout preventer with a blowout preventer seal, the blowout preventer having a passage to receive a tubular of the wellbore therethrough and rams comprising seals engageable about the tubular to seal the passage, the blowout preventer having blowout preventer parameters comprising blowout preventer dimensions;
 passing fluid through the passage, the fluid having fluid parameters comprising a flow rate;
 simulating erosion of a blowout preventer seal using a blowout preventer model based on the blowout preventer parameters and the fluid parameters;
 measuring erosion of the blowout preventer seal by performing a lab test of the blowout preventer seal in a tester according to the blowout preventer model;
 validating the simulating by comparing the simulated erosion with the tested erosion;
 determining an erosion rate of the blowout preventer seal based on the validated simulating;
 defining a closing rate for blowout preventer rams, based on the determined erosion rate; and
 closing the blowout preventer rams at the closing rate, wherein the closing comprises closing a portion of the passage of the blowout preventer.

* * * * *